United States Patent
Yamaguchi

(10) Patent No.: US 12,310,134 B2
(45) Date of Patent: May 20, 2025

(54) IMAGING DEVICE AND ELECTRONIC DEVICE

(71) Applicant: SONY SEMICONDUCTOR SOLUTIONS CORPORATION, Kanagawa (JP)

(72) Inventor: Tetsuya Yamaguchi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 420 days.

(21) Appl. No.: 17/756,175

(22) PCT Filed: Oct. 8, 2020

(86) PCT No.: PCT/JP2020/038146
§ 371 (c)(1),
(2) Date: May 18, 2022

(87) PCT Pub. No.: WO2021/106383
PCT Pub. Date: Jun. 3, 2021

(65) Prior Publication Data
US 2023/0282660 A1 Sep. 7, 2023

(30) Foreign Application Priority Data
Nov. 28, 2019 (JP) ................. 2019-215174

(51) Int. Cl.
H10F 10/16 (2025.01)
H10F 39/00 (2025.01)

(52) U.S. Cl.
CPC ..... H10F 39/8053 (2025.01); H10F 39/8057 (2025.01)

(58) Field of Classification Search
CPC ............ H10F 39/8053; H10F 39/8057; H10F 10/163; H10F 10/161; H10F 19/75;
(Continued)

(56) References Cited

U.S. PATENT DOCUMENTS

2013/0242149 A1* 9/2013 Terai .............. H01L 31/18 438/70
2014/0054662 A1* 2/2014 Yanagita ......... H01L 27/14645 438/73
(Continued)

FOREIGN PATENT DOCUMENTS

CN 104347660 A 2/2015
CN 104637965 A 5/2015
(Continued)

OTHER PUBLICATIONS

International Search Report and Written Opinion of PCT Application No. PCT/JP2020/038146, issued on Dec. 22, 2020, 10 pages of ISRWO.
(Continued)

*Primary Examiner* — S M Sohel Imtiaz

(57) ABSTRACT

An imaging device includes a semiconductor substrate including a plurality of photoelectric conversion elements, a plurality of color filters on the semiconductor substrate and faces each of the plurality of photoelectric conversion elements, and a partition wall on the semiconductor substrate and separates one color filter from an adjacent color filter adjacent among the plurality of color filters. The partition wall includes a first metal layer, a first translucent partition wall layer that covers side surfaces and a top surface of the first metal layer, and a second translucent partition wall layer located between the first metal layer and the first translucent partition wall layer and covers the side surfaces and the top surface of the first metal layer. A refractive index of the second translucent partition wall layer is larger than a refractive index of the first translucent partition wall layer.

13 Claims, 34 Drawing Sheets

(58) Field of Classification Search
CPC .............. H10F 30/2635; H10H 20/816; H01L 27/14621; H01L 27/14623; H01L 27/146; H01L 27/1462; H01L 27/14627; H01L 27/14629; H01L 27/1463; H01L 27/1464; G02B 5/20; H04N 23/12
See application file for complete search history.

(56) References Cited

U.S. PATENT DOCUMENTS

| | | | |
|---|---|---|---|
| 2015/0041942 A1* | 2/2015 | Ebiko | H01L 27/14629 438/73 |
| 2015/0091115 A1* | 4/2015 | Lin | H01L 27/14667 257/432 |
| 2015/0130007 A1* | 5/2015 | Kawamura | H01L 27/14687 438/70 |
| 2017/0025458 A1* | 1/2017 | Lin | H01L 27/14645 |
| 2017/0201726 A1* | 7/2017 | Yorikado | G02B 5/201 |
| 2019/0157323 A1 | 5/2019 | Ogi et al. | |
| 2020/0258929 A1* | 8/2020 | Imoto | H01L 27/14685 |
| 2022/0271078 A1* | 8/2022 | Mori | G02B 5/20 |

FOREIGN PATENT DOCUMENTS

| | | |
|---|---|---|
| CN | 106373970 A | 2/2017 |
| CN | 109155325 A | 1/2019 |
| EP | 3462497 A1 | 4/2019 |
| JP | 2009088415 A * | 4/2009 |
| JP | 2011-071483 A | 4/2011 |
| JP | 2015-035555 A | 2/2015 |
| JP | 2015-092521 A | 5/2015 |
| JP | 2017-028241 A | 2/2017 |
| KR | 10-2015-0018449 A | 2/2015 |
| KR | 10-2015-0053707 A | 5/2015 |
| KR | 10-2019-0129683 A | 11/2019 |
| TW | 201507124 A | 2/2015 |
| TW | 201519425 A | 5/2015 |
| TW | 201705457 A | 2/2017 |
| WO | 2012/073402 A1 | 6/2012 |
| WO | 2018/174090 A1 | 9/2018 |

OTHER PUBLICATIONS

Non-Final Office Action issued in U.S. Appl. No. 17/972,781 on Sep. 24, 2024.

* cited by examiner

IMAGING DEVICE AND ELECTRONIC DEVICE

CROSS REFERENCE TO RELATED APPLICATIONS

This application is a U.S. National Phase of International Patent Application No. PCT/JP2020/038146 filed on Oct. 8, 2020, which claims priority benefit of Japanese Patent Application No. JP 2019-215174 filed in the Japan Patent Office on Nov. 28, 2019. Each of the above-referenced applications is hereby incorporated herein by reference in its entirety.

TECHNICAL FIELD

The present disclosure relates to an imaging device and an electronic device.

BACKGROUND ART

An imaging device used for a digital camera or the like has a plurality of pixels. Each of the plurality of pixels is provided with a photoelectric conversion element that detects light and generates electrical charges. In addition, color filters that allow only light of specific colors to pass therethrough are provided above the plurality of photoelectric conversion elements. In this type of imaging device, a technique of disposing a partition wall between a color filter of one pixel and a color filter of another pixel in order to prevent color mixing from occurring between adjacent pixels is known (see, for example, PTL 1).

Citation List

[Patent Literature] [
PTL 1]
 JP 2011-71483 A

SUMMARY

Technical Problem

In the imaging device, when light is obliquely incident on a surface of a color filter, some of the obliquely incident light may be reflected by a partition wall, and the reflected light that should not be incident may be photoelectrically converted in a pixel. For example, when light such as flare light is incident on a surface of a color filter at a high angle, some of the light incident at a high angle (hereinafter referred to as high-angle incident light) passes through the color filter, reaches a partition wall, is reflected by the partition wall, and is incident on a pixel. As a result, the high-angle incident light is photoelectrically converted, and color mixing or the like is caused in a pixel signal, which may deteriorate performance of the imaging device.

The present disclosure has been made in view of such circumstances, and an object of the present invention is to provide an imaging device and an electronic device configured such that deterioration in imaging performance due to high-angle incident light can be inhibited.

Solution to Problem

An imaging device according to one aspect of the present disclosure includes: a semiconductor substrate including a plurality of photoelectric conversion elements; a plurality of color filters that are provided on the semiconductor substrate and face each of the plurality of photoelectric conversion elements; and a partition wall that is provided on the semiconductor substrate and provides separation between one color filter and another color filter adjacent to each other among the plurality of color filters. The partition wall includes a first metal layer, a translucent first partition wall layer that covers a side surface of the first metal layer, and a translucent second partition wall layer located between the first metal layer and the first partition wall layer. A refractive index of the second partition wall layer is larger than a refractive index of the first partition wall layer.

According to this, the high angle incident light that is incident on the surface of the color filter at a high angle, such as flare light, passes through the color filter, the first partition wall layer, and the second partition wall layer, and reaches a side surface of the first metal layer. Since the refractive index of the second partition wall layer is larger than the refractive index of the first partition wall layer, the high-angle incident light that has reached the side surface of the first metal layer is attenuated while being repeatedly reflected between the side surface of the first metal layer and the first partition wall layer. Thus, the imaging device can reduce the high-angle incident light that reaches the photoelectric conversion element. The imaging device can inhibit deterioration in imaging performance due to the problem that the high-angle incident light is photoelectrically converted and causes color mixing or the like in a pixel signal.

DESCRIPTION OF EMBODIMENTS

Embodiments of the present disclosure will be described below with reference to the figures. In descriptions of the figures referring to in the following description, the same or similar portions will be denoted by the same or similar reference signs. However, it should be noted that the figures are schematic and relationships between thicknesses and planar dimensions, ratios of thicknesses of respective layers, and the like are different from actual ones. Accordingly, specific thicknesses and dimensions should be determined by taking the following description into consideration. In addition, it goes without saying that the figures also include portions having different dimensional relationships and ratios from each other.

In addition, it is to be understood that definitions of directions such as upward and downward in the following description are merely definitions provided for the sake of brevity and are not intended to limit technical ideas of the present disclosure. For example, it is obvious that when an object is observed after being rotated by 90°, upward and downward are converted into and interpreted as leftward and rightward, and when an object is observed after being rotated by 180°, upward and downward are interpreted as being inverted.

First Embodiment (Overall Structure)

Figure 1:
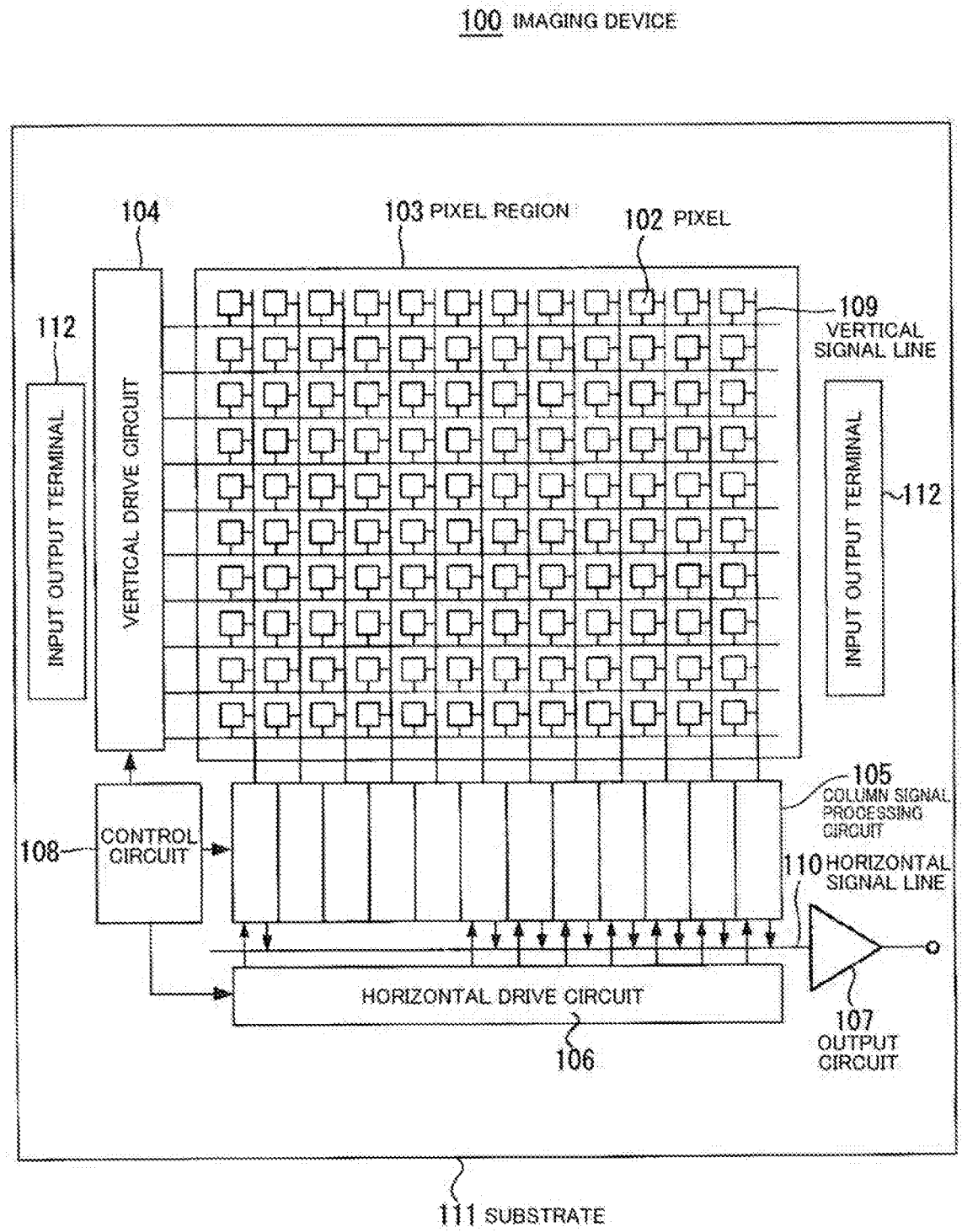
FIG. 1 is a schematic diagram showing a configuration example of an imaging device according to a first embodiment of the present disclosure.

FIG. 1 is a diagram showing a configuration example of an imaging device 100 according to a first embodiment of the present disclosure. The imaging device 100 shown in FIG. 1 is, for example, a CMOS solid-state imaging device. As shown in FIG. 1, the imaging device 100 is configured to have a pixel region (a so-called imaging region) 3, in which pixels 102 including a plurality of photoelectric conversion elements are regularly arranged two-dimensionally, and a peripheral circuit portion on a semiconductor substrate 111 (for example, a silicon substrate). The pixel 102 is configured to have a photodiode serving as a photoelectric conversion element, and a plurality of pixel transistors (so-called MOS transistors). The plurality of pixel transistors can be configured of three transistors, including a transfer transistor, a reset transistor, and an amplification transistor. The plurality of pixel transistors can also be configured of four transistors by adding a selection transistor to the above three transistors. Since an equivalent circuit of a unit pixel is the same as usual, detailed description thereof will be omitted. The pixel 102 may also have a shared pixel structure. The shared pixel structure is configured of a plurality of photodiodes, a plurality of transfer transistors, one shared floating diffusion, and one other shared pixel transistor.

The peripheral circuit portion includes a vertical drive circuit 104, column signal processing circuits 105, a horizontal drive circuit 106, an output circuit 107, a control circuit 108, and the like.

The control circuit 108 receives input clocks and data instructing an operation mode and the like and outputs data such as internal information of the solid-state imaging device. That is, the control circuit 108 generates clock signals and control signals serving as references for operations of the vertical drive circuit 104, the column signal processing circuits 105, the horizontal drive circuit 106, and the like on the basis of vertical sync signals, horizontal sync signals and master clocks. In addition, the control circuit 108 inputs these signals to the vertical drive circuit 104, the column signal processing circuits 105, the horizontal drive circuit 106, and the like.

The vertical drive circuit 104 is configured of, for example, a shift register, selects a pixel drive wiring, supplies pulses for driving pixels to the selected pixel drive wiring, and drives the pixels for each row. That is, the vertical drive circuit 104 sequentially selects and scans the pixels 102 in the pixel region 103 in the vertical direction for each row and supplies pixel signals based on signal charges generated in accordance with an amount of light received in the photoelectric conversion element of each of the pixels 102 to the column signal processing circuits 105 through vertical signal lines 109.

The column signal processing circuits 105 are disposed, for example, for each column of the pixels 102 and perform signal processing such as noise reduction of signals output from the pixels 102 in one row for each pixel row. That is, the column signal processing circuits 105 perform signal processing such as CDS for removing fixed pattern noise unique to the pixels 102, signal amplification, and AD conversion. Horizontal selection switches (not shown) are provided at output stages of the column signal processing circuits 105 to be connected between the output stages and the horizontal signal line 110.

The horizontal drive circuit 106 is configured of, for example, a shift register, sequentially selects each of the column signal processing circuits 105 by sequentially outputting horizontal scan pulses, and outputs pixel signals from each of the column signal processing circuits 105 to the horizontal signal line 110.

The output circuit 107 performs signal processing on signals sequentially supplied from each of the column signal processing circuits 105 through the horizontal signal line 110 and outputs the signals. For example, the output circuit 107 may only perform buffering, or may perform black level adjustment, column variation correction, various digital signal processing, and the like. Input and output terminals 112 exchange signals with the outside.

(Structures of Partition Wall and Peripheral Portion Thereof)

Figure 2:
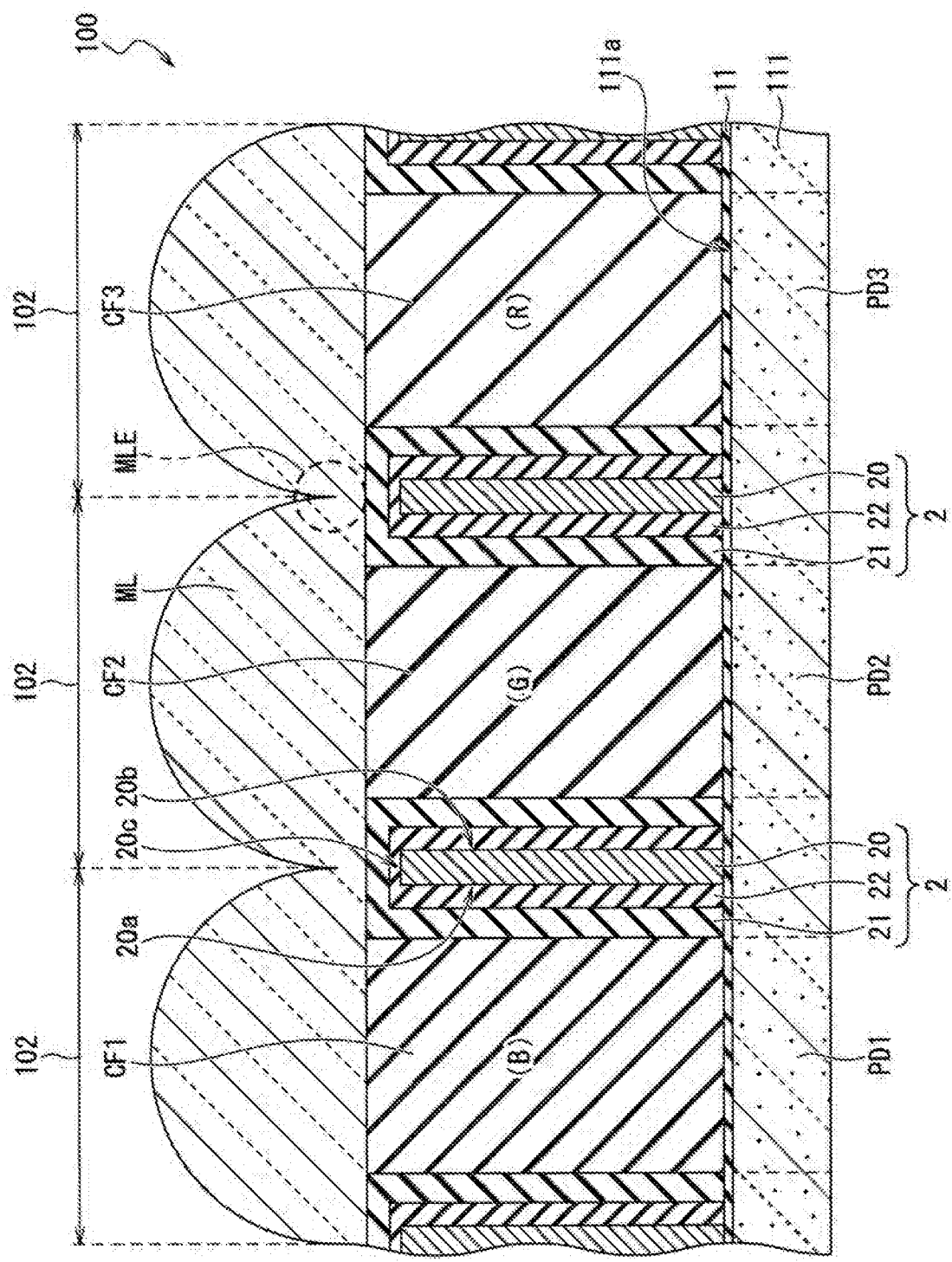
FIG. 2 is a cross-sectional view showing a configuration example of a partition wall and a peripheral portion thereof in the imaging device according to the first embodiment of the present disclosure.

FIG. 2 is a cross-sectional view showing a configuration example of a partition wall 2 and a peripheral portion thereof in the imaging device 100 according to the first embodiment of the present disclosure. The imaging device 100 has, for example, a back surface light receiving type pixel structure in which incident light is caused to enter from a back surface side of a semiconductor substrate 111. As shown in FIG. 2, a plurality of photodiode PDs are provided on a back surface (hereinafter, a light receiving surface) 111a side of the semiconductor substrate 111. Further, a translucent insulating film 11 is provided on the light receiving surface 111a of the semiconductor substrate 111. The insulating film 11 is, for example, a silicon oxide film ($SiO_2$).

The semiconductor substrate 111 is a silicon layer formed by polishing a silicon wafer by chemical mechanical polishing (CMP). A thickness of the semiconductor substrate 111 may be arbitrarily set in accordance with a wavelength of received light. As an example, the thickness of the semiconductor substrate 111 is 5 µm or more and 15 µm or less when visible light is received, 15 µm or more and 50 µm or less when infrared light is received, and 3 µm or more and 7 µm or less when ultraviolet light is received.

A plurality of color filter CFs are provided on the light receiving surface 111a of the semiconductor substrate 111 via the insulating film 11. The plurality of color filter CFs include, for example, color filters CF1 to CF3. The color filters CF1 to CF3 are colored blue (B), green (G), or red (R), respectively. The color filters CF1 to CF3 are disposed at positions at which they respectively face photodiodes PD1 to PD3 via the insulating film 11.

Although not shown, the plurality of color filter CFs include a color filter CF4 disposed at a position adjacent to at least one or more of the color filters CF1 to CF3. The color filter CF4 may be colored in any one of blue (B), green (G), and red (R), or may be colored in another color other than these. The color filter CF4 is disposed at a position at which it faces a photodiode PD4 via the insulating film 11. In the following, in a case in which it is not necessary to distinguish the color filters CF1 and CF4 from each other, an identification number at the end of the CF serving as a reference sign will be omitted.

Also, partition walls 2 are provided on the light receiving surface 111a of the semiconductor substrate 111 via the insulating film 11. A plurality of color filter CFs are separated from each other by the partition walls 2. Further, a plurality of micro lenses ML (an example of the "lens" of the present disclosure) are provided on a side opposite to the semiconductor substrate 111 with the plurality of color filter CFs interposed therebetween. One micro lens ML is disposed on one color filter CF. End portions MLEs of the plurality of micro lenses ML are connected to each other. The end portions MLE of the micro lenses ML are disposed on the partition walls 2.

The partition wall 2 has a first metal layer 20 located at a central portion of the partition wall 2, a first translucent partition wall layer 21 that covers the first metal layer 20 from an outer side thereof, and a second translucent partition wall layer 22 located between the first metal layer 20 and the first partition wall layer 21. For example, the first metal layer 20 has a first side surface 20a and a second side surface 20b that face the color filters CF in a horizontal direction parallel to the light receiving surface 111a of the semiconductor substrate 111, and an upper end surface 20c (an example of the "end surface" of the present disclosure) that faces the end portion of the micro lens ML in a direction orthogonal to the horizontal direction. The second side surface 20b is located on a side opposite to the first side surface 20a. The upper end surface 20c is located on the micro lens side.

The second partition wall layer 22 covers the first side surface 20a, the second side surface 20b, and the upper end surface 20c of the first metal layer 20. The first partition wall layer 21 covers the first side surface 20a, the second side surface 20b, and the upper end surface 20c of the first metal layer 20 via the second partition wall layer 22.

The first metal layer 20 is made of, for example, copper (Cu) or tungsten (W). The first partition wall layer 21 and the second partition wall layer 22 are each configured of a translucent film through which light (for example, at least one type of light of visible light, infrared light, and ultraviolet light) received by the pixels 102 can pass. For example, the first partition wall layer 21 is made of a silicon oxide film ($SiO_2$). The second partition wall layer 22 is made of a silicon carbide film (a-SiC) having an amorphous crystal structure.

In the present embodiment, a refractive index n22 of the second partition wall layer 22 is larger than a refractive index n21 of the first partition wall layer 21 (n22>n21). Also, a refractive index ncf of the color filter CF is larger than the refractive index n21 of the first partition wall layer 21 (ncf>n21). For example, a refractive index of a-SiC used for the second partition wall layer 22 is 2.6. A refractive index of $SiO_2$ used for the first partition wall layer 21 is 1.46. A refractive index of the color filter CF is 1.68.

(Example of Light Guidance Performed by Partition Wall)

Figure 3:
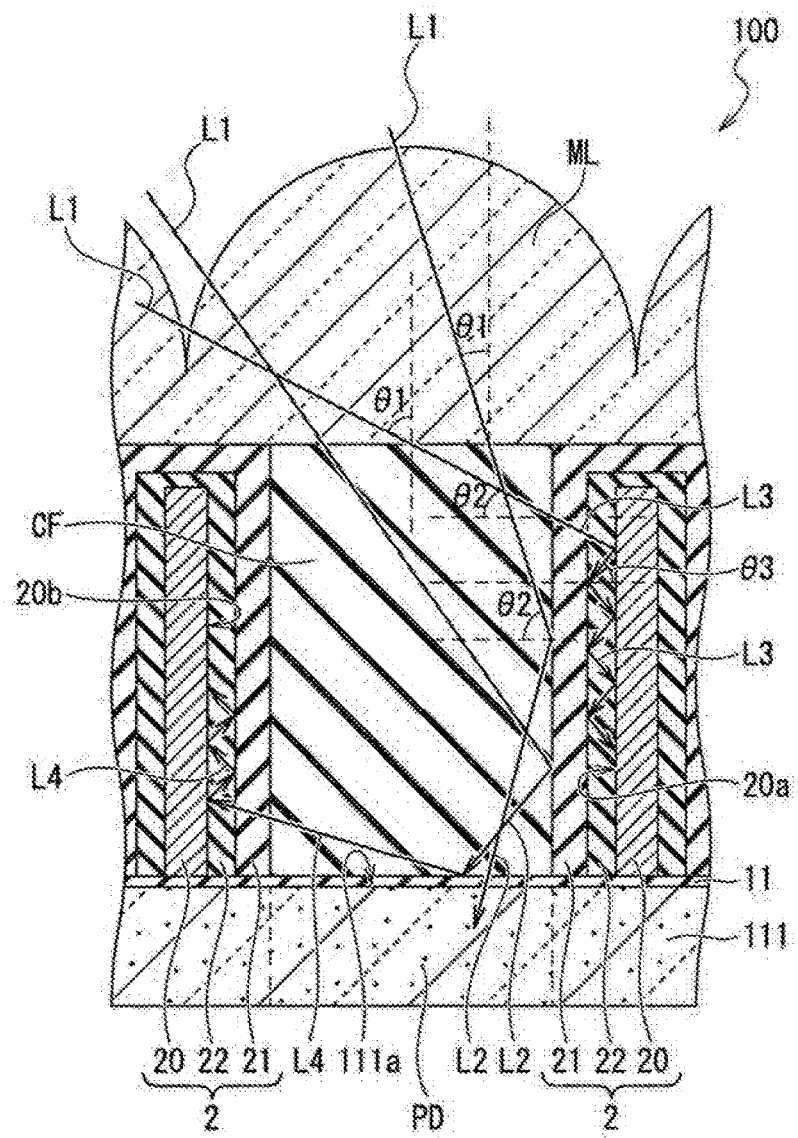
FIG. 3 is a cross-sectional view showing an example of light guiding performed by the partition wall of the imaging device according to the first embodiment of the present disclosure.

FIG. 3 is a cross-sectional view showing an example of light guiding performed by the partition wall of the imaging device according to the first embodiment of the present disclosure. As shown in FIG. 3, a case in which light L1 is obliquely incident on a surface of the color filter CF through the micro lens ML, and the incident light L1 reaches a surface of the first partition wall layer 21 of the partition wall 2 is assumed.

An incidence angle on the surface of the color filter CF is defined as θ1, and an incidence angle on the surface of the first partition wall layer 21 is defined as θ2. The incidence angles θ1 and θ2 have a relationship of, for example, θ1=90°−θ2.

As described above, the refractive index ncf of the color filter CF is larger than the refractive index n21 of the first partition wall layer 21 (ncf>n21). For this reason, in a case in which the incidence angle θ1 of the light L1 on the surface of the color filter CF is a low angle and the incidence angle θ2 on the surface of the first partition wall layer 21 is equal to or greater than a critical angle, the light L1 is totally reflected on the surface of the first partition wall layer 21. The critical angle is the smallest incidence angle at which total reflection occurs when light travels from a medium with a high refractive index to a medium with a low refractive index. The light L2 totally reflected by the first partition wall layer 21 travels toward the light receiving surface 111a side of the semiconductor substrate 111 provided with the photodiode PD.

On the other hand, in a case in which the incidence angle θ1 of the light L1 on the surface of the color filter CF is a high angle (that is, the light L1 is a high angle incident light) and the incidence angle θ2 on the surface of the first partition wall layer 21 is less than the critical angle, the light L1 is incident on the first partition wall layer 21 except for a part thereof. Light L3 incident on the first partition wall layer 21 passes through the first partition wall layer 21 and the second partition wall layer 22 except for a part thereof, reaches a side surface of the first metal layer 20 (for example, the first side surface 20a), and is reflected on the side surface of the first metal layer 20. The light L3 reflected on the side surface of the first metal layer 20 passes through the second partition wall layer 22 and reaches the first partition wall layer 21.

As described above, the refractive index n22 of the second partition wall layer 22 is larger than the refractive index n21 of the first partition wall layer 21 (n21<n22). In addition, the light L3 is obliquely incident on the first partition wall layer 21. For this reason, the light L3 that has reached the first partition wall layer 21 is reflected again to the second partition wall layer 22 side except for a part thereof. For example, in a case in which an incidence angle θ3 of the light L3 on the first partition wall layer 21 is equal to or greater than the critical angle, the light L3 is totally reflected by the first partition wall layer 21. The light L3 is repeatedly reflected between the first metal layer 20 and the first partition wall layer 21 and is confined in the second partition wall layer 22. Intensity of the light L3 confined in the second partition wall layer 22 is attenuated each time the light L3 is reflected by the side surface of the first metal layer 20.

In this way, the light L3 is attenuated while repeating the reflection between the first metal layer 20 and the first partition wall layer 21. Thus, the imaging device 100 can prevent the high-angle incident light (for example, flare light) from reaching the light receiving surface 111a of the semiconductor substrate 111. The imaging device 100 can reduce the flare light that reaches the photodiode PD.

Further, as shown in FIG. 3, each of the light L1 and L2 reaches the photodiode PD and is photoelectrically converted, but a part thereof is reflected by a surface of the insulating film 11 and the light receiving surface 111a before reaching the photodiode PD. At least a part of the reflected light L4 is incident on the partition wall 2 in the same manner as the above-mentioned light L3 and is attenuated while repeating the reflection between the side surface of the first metal layer 20 (for example, the second side surface 20b) and the first partition wall layer 21. Thus, the imaging device 100 can inhibit the light L4 reflected in one pixel 102 from leaking to another pixel 102 through the partition wall 2.

Next, a method for manufacturing the imaging device 100 shown in FIG. 2 will be described. The imaging device 100 is manufactured by using various devices such as a film forming device (including a chemical vapor deposition (CVD) device, a sputtering device, and a thermal oxidation device), an exposure device, an etching device, a chemical mechanical polishing (CMP) device, and a bonding device. Hereinafter, these devices are collectively referred to as a manufacturing device. The partition wall 2 of the imaging device 100 and a peripheral portion thereof can be manufactured by a manufacturing method described below.

Figure 4A:
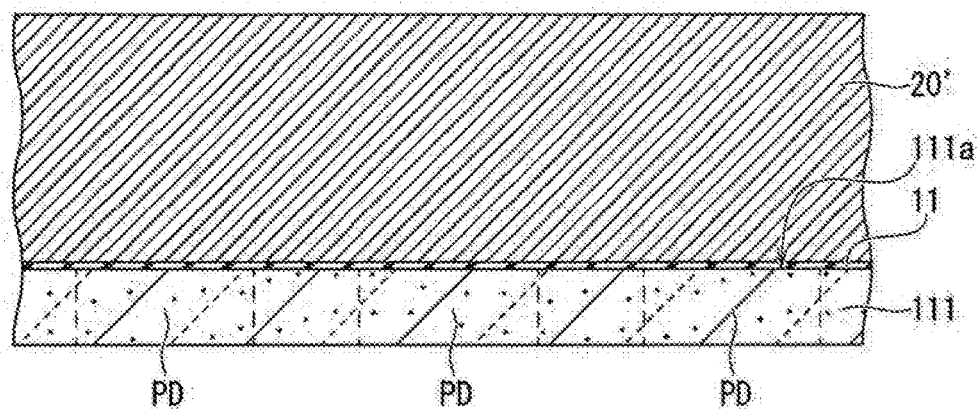
FIG. 4A is a cross-sectional view showing a method for manufacturing the imaging device according to the first embodiment of the present disclosure in the order of processes.

FIGS. 4A, 4B, 4C, 4D, 4E, 4F, 4G, 4H, 4I, 4J, and 4K are cross-sectional views showing a method for manufacturing the imaging device according to the first embodiment of the present disclosure in the order of processes. As shown in FIG. 4A, the manufacturing device forms the insulating film 11 on the light receiving surface 111a of the semiconductor substrate 111 on which the photodiode PD has been formed. For example, the insulating film 11 is a silicon oxide film (SiO2), and a forming method thereof is a thermal oxidation or CVD method of the semiconductor substrate 111. Next, the manufacturing device forms a metal layer 20' on the insulating film 11. For example, the metal layer 20' is a thin film of copper (Cu) or tungsten (W), and a forming method thereof is a vapor deposition or sputtering method.

Figure 4B:
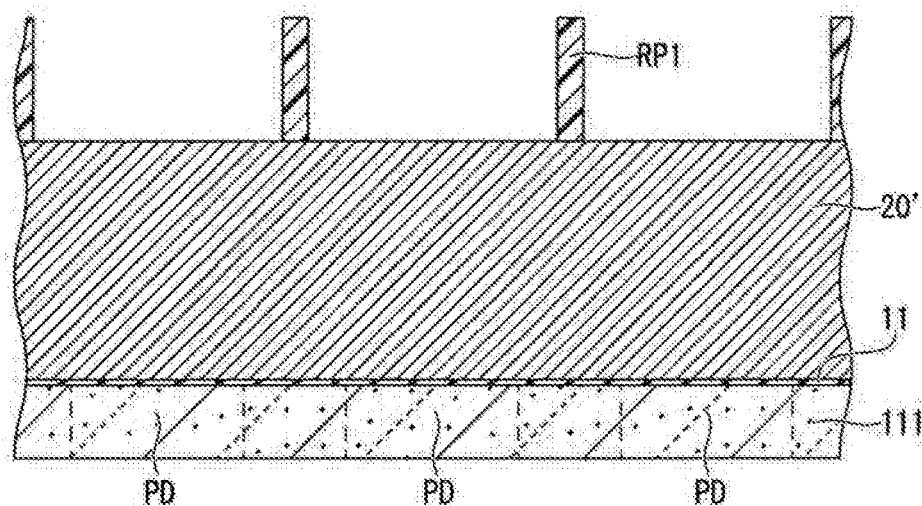
FIG. 4B is a cross-sectional view showing the method for manufacturing the imaging device according to the first embodiment of the present disclosure in the order of processes.
Figure 4C:
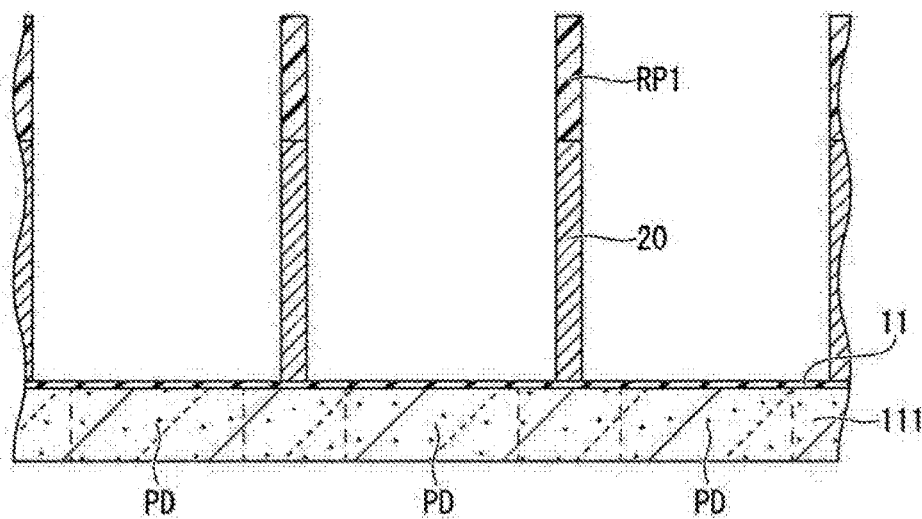
FIG. 4C is a cross-sectional view showing the method for manufacturing the imaging device according to the first embodiment of the present disclosure in the order of processes.
Figure 4D:
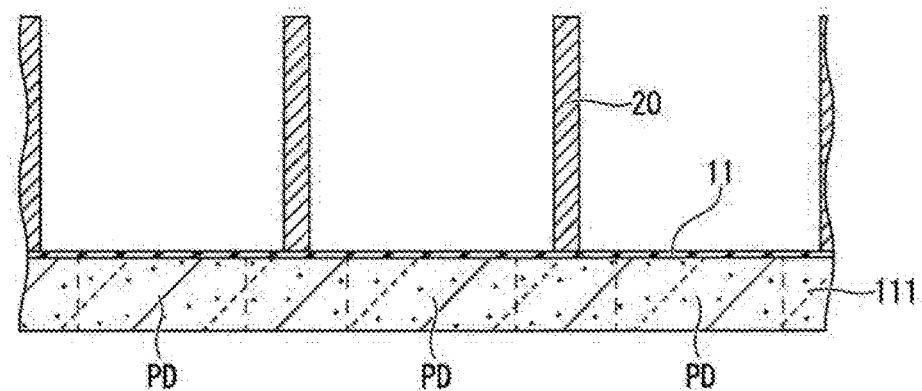
FIG. 4D is a cross-sectional view showing the method for manufacturing of the imaging device according to the first embodiment of the present disclosure in the order of processes.

Next, as shown in FIG. 4B, the manufacturing device forms a resist pattern RP1 on the metal layer 20'. The resist pattern RP1 has a shape that covers a region serving as the first metal layer 20 (see FIG. 2) of the partition wall 2 and exposes other regions. Next, the manufacturing device dry-etches the metal layer 20' using the resist pattern RP1 as a mask. Thus, as shown in FIG. 4C, the first metal layer 20 is formed. Next, as shown in FIG. 4D, the manufacturing device removes the resist pattern RP1.

Figure 4E:
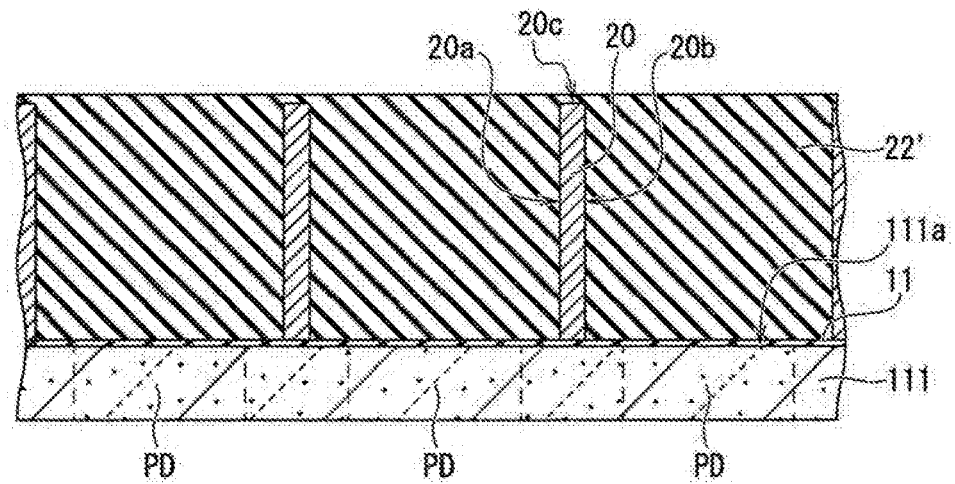
FIG. 4E is a cross-sectional view showing the method for manufacturing of the imaging device according to the first embodiment of the present disclosure in the order of processes.

Next, as shown in FIG. 4E, the manufacturing device forms a translucent insulating layer 22' above the light receiving surface 111a. For example, the insulating layer 22' is a silicon carbide film (a-SiC) having an amorphous crystal structure, and a forming method thereof is a CVD method. The insulating film 11 and the first side surface 20a, the second side surface 20b, and the upper end surface 20c of the first metal layer 20 are covered with the insulating layer 22'.

Figure 4F:
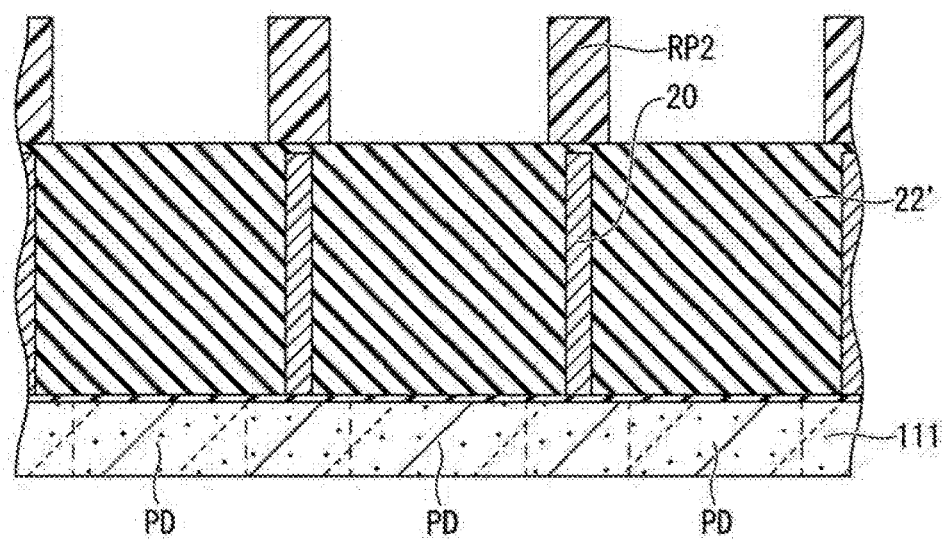
FIG. 4F is a cross-sectional view showing the method for manufacturing of the imaging device according to the first embodiment of the present disclosure in the order of processes.
Figure 4G:
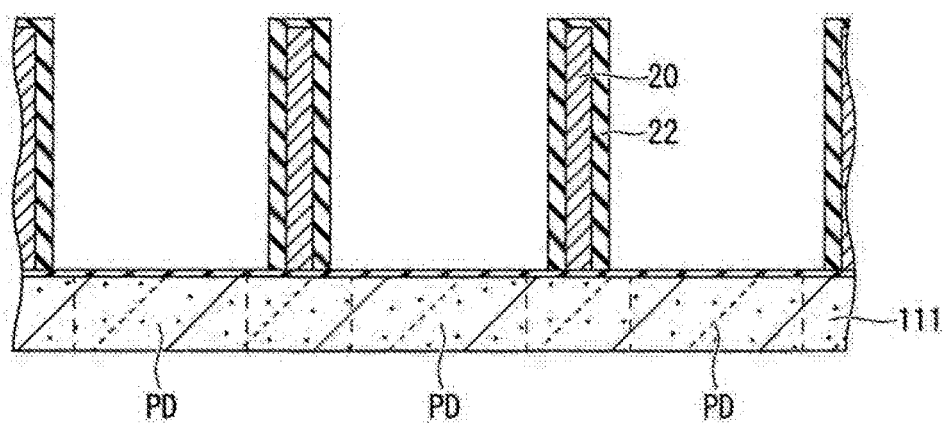
FIG. 4G is a cross-sectional view showing the method for manufacturing of the imaging device according to the first embodiment of the present disclosure in the order of processes.

Next, as shown in FIG. 4F, the manufacturing device forms a resist pattern RP2 on the insulating layer 22'. The resist pattern RP2 has a shape that covers the region serving as the first metal layer 20 and the second partition wall layer 22 (see FIG. 2) of the partition wall 2 and exposes other regions. Next, the manufacturing device dry-etches the insulating layer 22' using the resist pattern RP2 as a mask. Dry etching is, for example, reactive ion etching (RIE). Thus, as shown in FIG. 4G, the second partition wall layer 22 is formed. After that, the manufacturing device removes the resist pattern RP2.

Figure 4H:
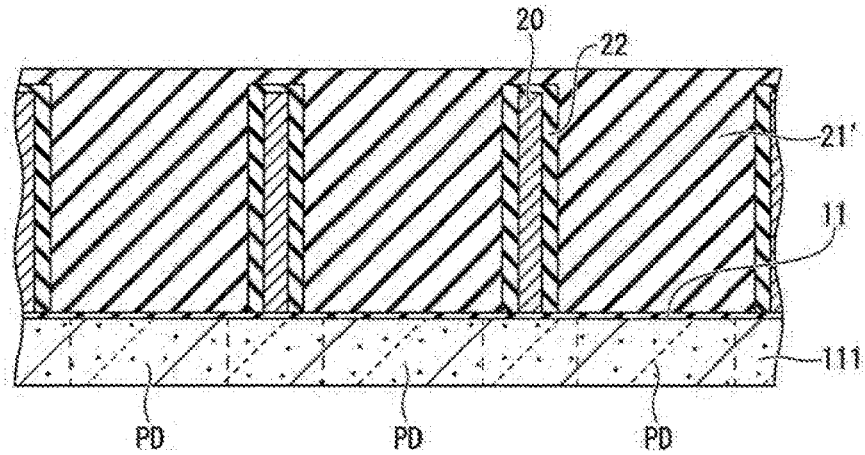
FIG. 4H is a cross-sectional view showing the method for manufacturing of the imaging device according to the first embodiment of the present disclosure in the order of processes.

Next, as shown in FIG. 4H, the manufacturing device forms a translucent insulating layer 21' above the light receiving surface 111a. For example, the insulating layer 21' is a silicon oxide film (SiO$_2$), and a forming method thereof is a CVD method.

The insulating film 11 and the second partition wall layer 22 are each covered with the insulating layer 21'.

Figure 4I:
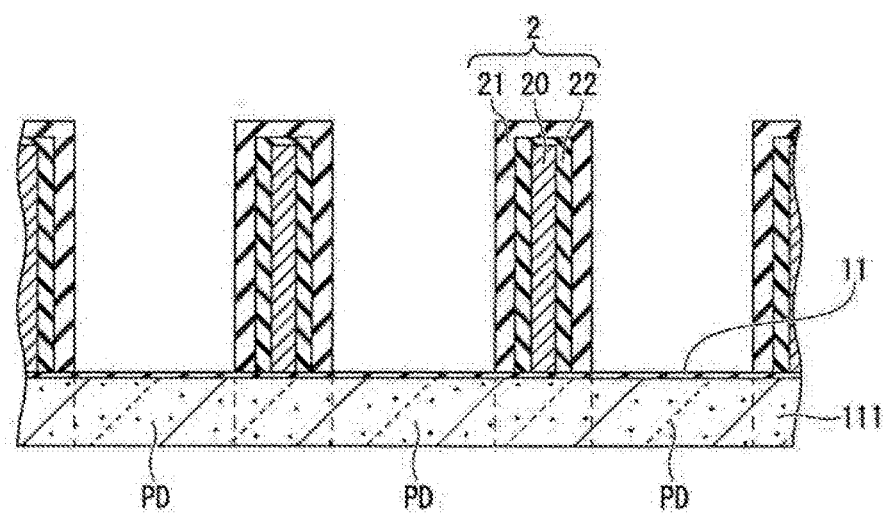
FIG. 4I is a cross-sectional view showing the method for manufacturing of the imaging device according to the first embodiment of the present disclosure in the order of processes.

Next, the manufacturing device forms a resist pattern (not shown) on the insulating layer 21'. This resist pattern has a shape that covers the region serving as the first partition wall layer 21 (see FIG. 2) of the partition wall 2 and exposes other regions. Next, the manufacturing device dry-etches the insulating layer 21' using the resist pattern as a mask. Dry etching is, for example, RIE. Thus, as shown in FIG. 4I, the second partition wall layer 22 is formed. The partition wall 2 having the first metal layer 20, the first partition wall layer 21, and the second partition wall layer 22 is finally formed. After that, the manufacturing device removes the resist pattern RP2.

Figure 4J:
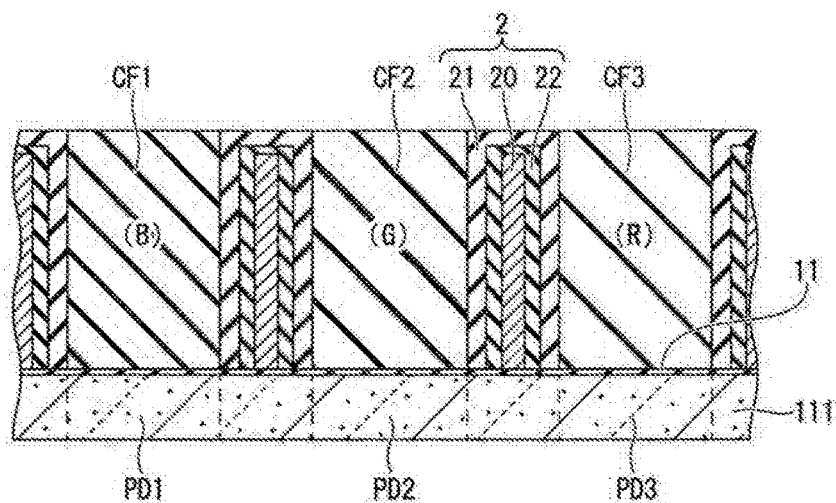
FIG. 4J is a cross-sectional view showing the method for manufacturing the imaging device according to the first embodiment of the present disclosure in the order of processes.

Next, as shown in FIG. 4J, the manufacturing device forms the color filters CFs in regions between adjacent partition walls 20 (that is, above the photodiode PD). The manufacturing device uses lithography technology to create the color filters CFs for each color. For example, the manufacturing device forms a blue (B) color filter CF1 above the photodiode PD1. Next, the manufacturing device forms a green (G) color filter CF2 above the photodiode PD2. Next, the manufacturing device forms a red (R) color filter CF3 above the photodiode PD3. Each of the color filters CF1 to CF3 is formed such that its bottom surface is in contact with an upper surface of the insulating film 11, its side surface is in contact with the partition wall 2, and its upper surface is at the same height as the partition wall 2.

Figure 4K:
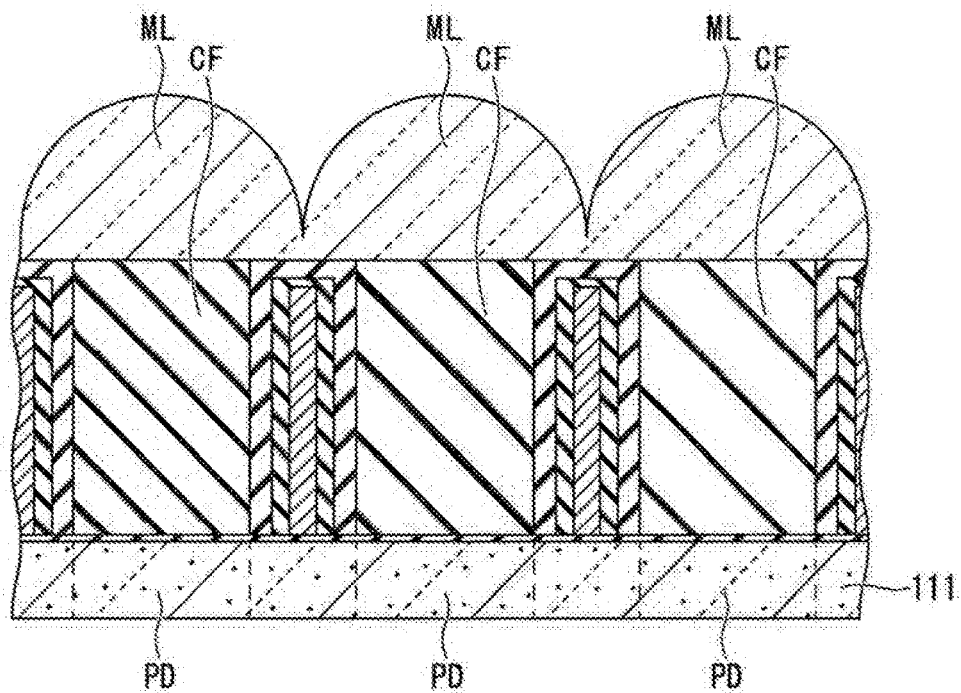
FIG. 4K is a cross-sectional view showing the method for manufacturing the imaging device according to the first embodiment of the present disclosure in the order of processes.

Next, as shown in FIG. 4K, the manufacturing device forms the micro lens ML above each of the plurality of color filters CFs. The micro lens ML is a convex lens having a curved upper surface and is made of a film through which light passes. The manufacturing device forms a resin film on the color filters CFs, heats and melts the formed resin film, and rounds a shape of an upper surface of the melted resin film, thereby forming the micro lenses MLs. The imaging device 100 shown in FIG. 2 is finally formed through the above processes.

(Evaluation Results)

Figure 5:
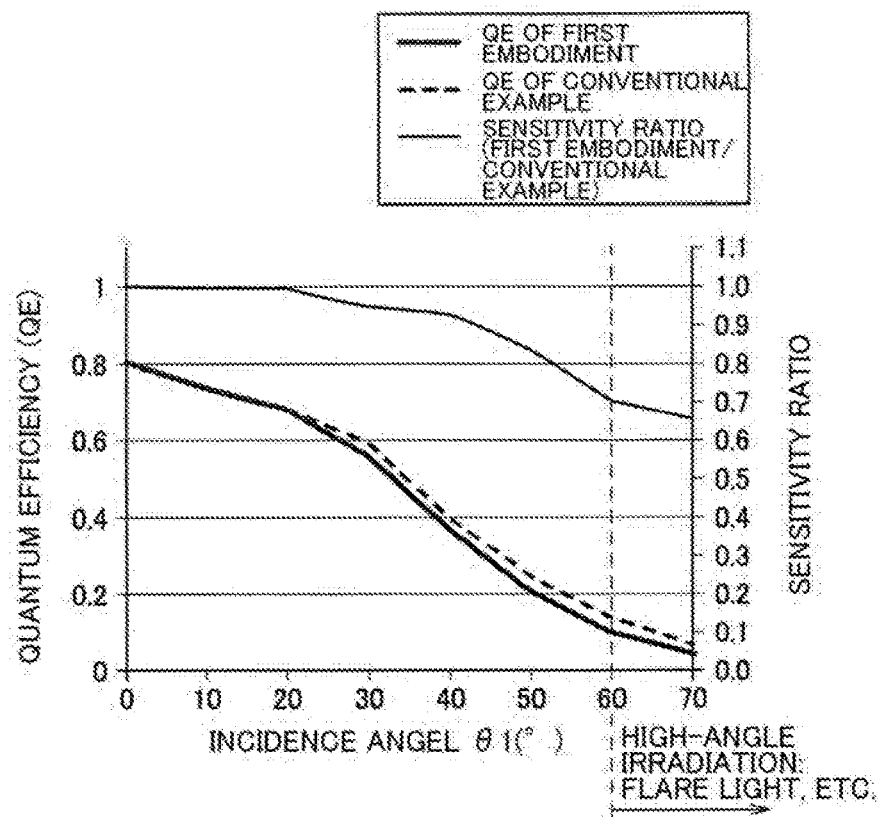
FIG. 5 is a graph showing results of evaluating a relationship between an incidence angle on a surface of a color filter, quantum efficiency, and a sensitivity ratio in the imaging device according to the first embodiment of the present disclosure and an imaging device according to a comparative example.

FIG. 5 is a graph showing results of evaluating a relationship between the incidence angle $\theta 1$ on the surface of the color filter CF (see FIG. 3), quantum efficiency, and a sensitivity ratio in the imaging device according to the first embodiment of the present disclosure and an imaging device according to a comparative example. The horizontal axis in FIG. 5 indicates the incidence angle $\theta 1$. The vertical axis on a left side in FIG. 5 shows the quantum efficiency (QE) for green light. In addition, the vertical axis on a right side in FIG. 5 shows the sensitivity ratio for green light. The sensitivity ratio is represented by a ratio of quantum efficiency of the first embodiment to quantum efficiency of the comparative example. In addition, the first embodiment is different from the comparative example in a structure of the partition wall. A partition wall of the comparative example has a configuration in which the second partition wall layer 22 is removed from the partition wall of the first embodiment.

As shown in FIG. 5, in the range in which the incidence angle $\theta 1$ is small, for example, $\theta 1 \leq 20°$, there is no significant difference in quantum efficiency (QE) between the first embodiment and the conventional example. On the other hand, in the range in which the incidence angle $\theta 1$ is large, for example, $\theta 1 \geq 60°$, the quantum efficiency of the first embodiment is lower than the quantum efficiency of the comparative example, and the sensitivity ratio is lowered. It was confirmed that the imaging device according to the first embodiment has the same sensitivity as the imaging device according to the comparative example for low-angle incident light and can be less sensitive to high-angle incident light than the imaging device according to the comparative example.

As described above, the imaging device 100 according to one aspect of the present disclosure includes the semiconductor substrate 111 having the plurality of photodiodes PDs, the plurality of color filters CFs that are provided on the semiconductor substrate 111 and respectively face the plurality of photodiodes PDs, and the partition wall 2 that is provided on the semiconductor substrate 111 and provides separation between one color filter CF and another color filter CF adjacent to each other among the plurality of color filters CFs. The partition wall 2 has the first metal layer 20, the first translucent partition wall layer 21 that covers the side surface of the first metal layer 20, and the second translucent partition wall layer 22 located between the first metal layer 20 and the first partition wall layer 21. The refractive index of the second partition wall layer 22 is larger than the refractive index of the first partition wall layer 21.

According to this, high-angle incident light, such as flare light, that is incident on the surface of the color filter CF at a high angle passes through the color filter CF, the first partition wall layer 21, and the second partition wall layer 22 and reaches the side surface of the first metal layer 20. Since the refractive index of the second partition wall layer 22 is larger than the refractive index of the first partition wall layer 21, the high-angle incident light that has reached the side surface of the first metal layer 20 is attenuated while being repeatedly reflected between the side surface of the first metal layer 20 and the first partition wall layer 21. Thus, the imaging device 100 can reduce the high-angle incident light that reaches the photodiode PD. The imaging device 100 can inhibit deterioration in imaging performance due to the problem that the high-angle incident light is photoelectrically converted and causes color mixing or the like in a pixel signal.

Second Embodiment

In the first embodiment described above, the upper end surface 20c of the first metal layer 20 is covered with the second partition wall layer 22 and the first partition wall layer 21. However, in the embodiments of the present disclosure, the structure of the partition wall is not limited thereto. At least one of the second partition wall layer 22 and the first partition wall layer 21 may not be present on the upper end surface 20c of the first metal layer 20.

Figure 6:
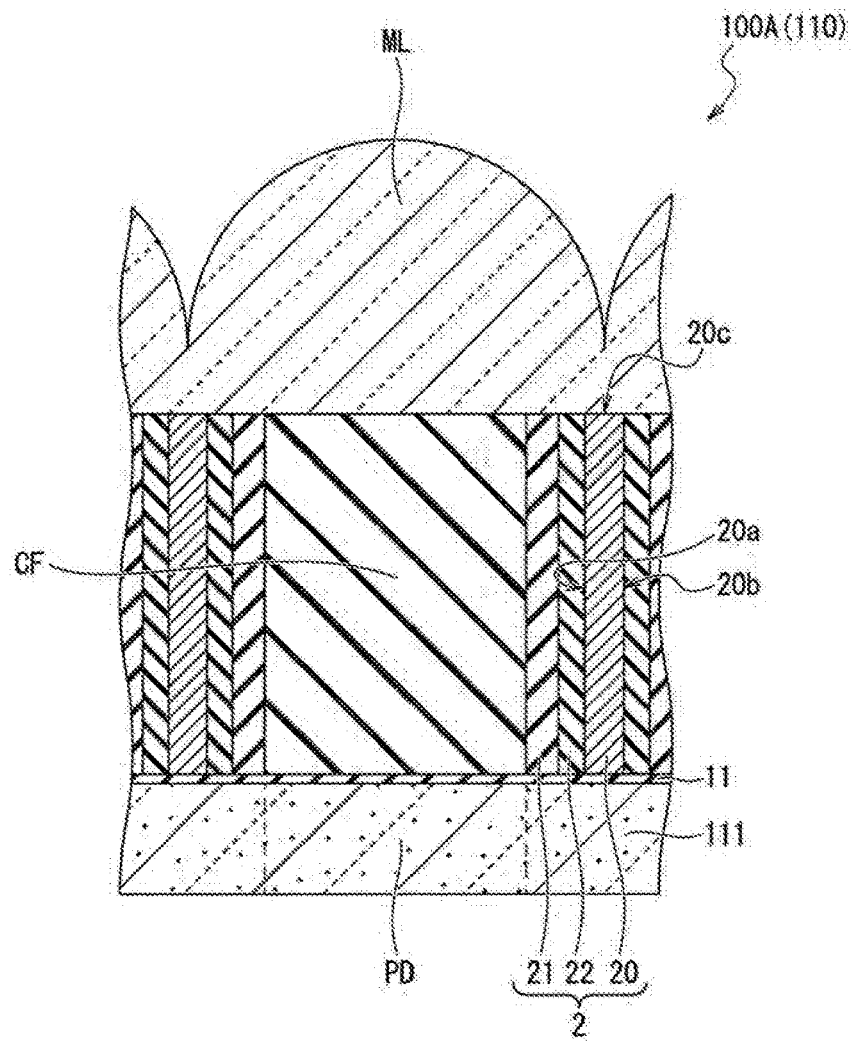
FIG. 6 is a cross-sectional view showing a configuration of a partition wall and a peripheral portion thereof in an imaging device according to a second embodiment of the present disclosure.

FIG. 6 is a cross-sectional view showing a configuration of a partition wall 2 and a peripheral portion thereof in an imaging device 100A according to a second embodiment of the present disclosure. As shown in FIG. 6, in the partition wall 2 of the imaging device 100A, the upper end surface 20c of the first metal layer 20 is exposed from the first partition wall layer 21 and the second partition wall layer 22. In addition, the upper end surface 20c of the first metal layer 20 is in contact with the micro lens ML.

In the imaging device 100A, the high-angle incident light that has reached the side surface of the first metal layer 20 is also attenuated while being repeatedly reflected between the side surface of the first metal layer 20 and the first partition wall layer 21. Accordingly, the imaging device 100A can reduce the high-angle incident light that reaches the photodiode PD. The imaging device 100A can inhibit deterioration in imaging performance due to the problem that high-angle incident light is photoelectrically converted and causes color mixing or the like in a pixel signal.

Figure 7A:
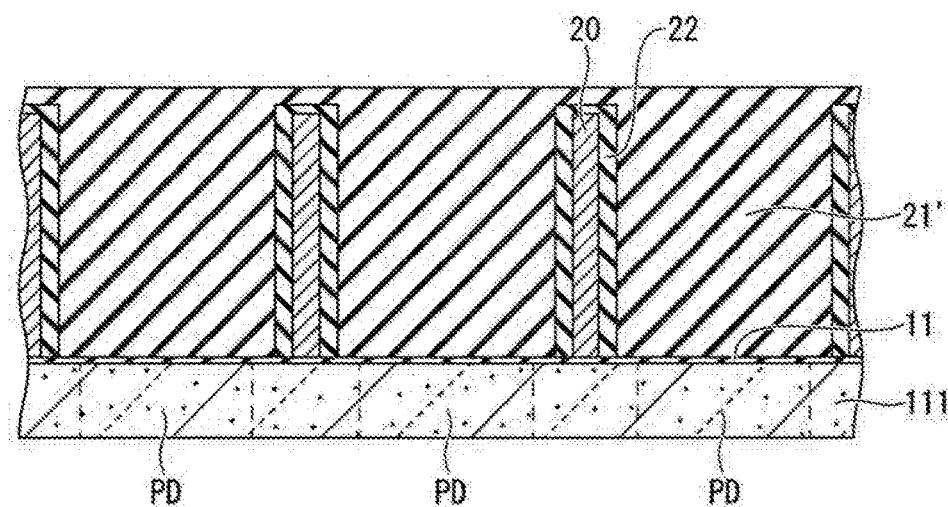
FIG. 7A is a cross-sectional view showing a method for manufacturing the imaging device according to the second embodiment of the present disclosure in the order of processes.
Figure 7B:
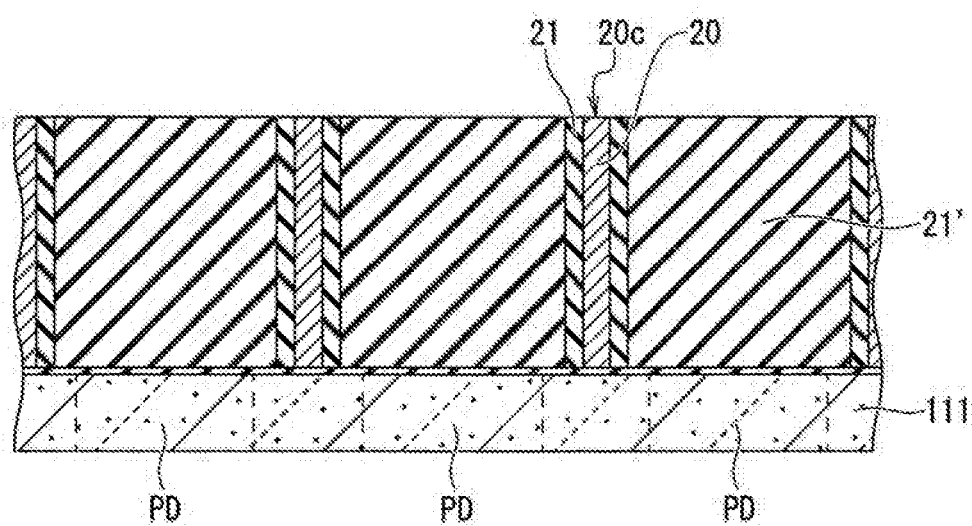
FIG. 7B is a cross-sectional view showing the method for manufacturing the imaging device according to the second embodiment of the present disclosure in the order of processes.

Next, a method for manufacturing the imaging device 100A shown in FIG. 6 will be described. FIGS. 7A and 7B are cross-sectional views showing the method for manufacturing the imaging device 100A according to the second embodiment of the present disclosure in the order of processes. In FIG. 7A, processes up to the process of forming the insulating layer 21' are the same as those in the method for manufacturing the imaging device 100 described above. After the insulating layer 21' is formed, as shown in FIG. 7B, the manufacturing device performs a CMP treatment to the surface of the insulating layer 21' to expose the upper end surface 20c of the first metal layer 20. Through the CMP treatment, the upper end surface 20c of the first metal layer 20 becomes flush with or substantially flush with an upper surface of the insulating layer 21'.

The subsequent processes are the same as those in the method for manufacturing the imaging device 100 described in the first embodiment. The manufacturing device dry-etches the insulating layer 21' using a resist pattern as a mask and forms the first partition wall layer 21 (see FIG. 4I). Next, the manufacturing device forms the color filters CFs (see FIG. 4J) and the micro lenses MLs (see FIG. 4K). Through the above processes, the imaging device 100A shown in FIG. 6 is finally formed.

Third Embodiment

In the first embodiment, an aspect in which only the insulating film 11 is disposed between the semiconductor substrate 111 and the color filters CFs has been shown. However, in the embodiments of the present disclosure, a structure between the semiconductor substrate 111 and the color filters CFs is not limited thereto. An antireflection film may be disposed between the semiconductor substrate 111 and the color filters CFs. Also, at least one of the first partition wall layer 21 and the second partition wall layer 22 may be used for the antireflection film.

Figure 8:
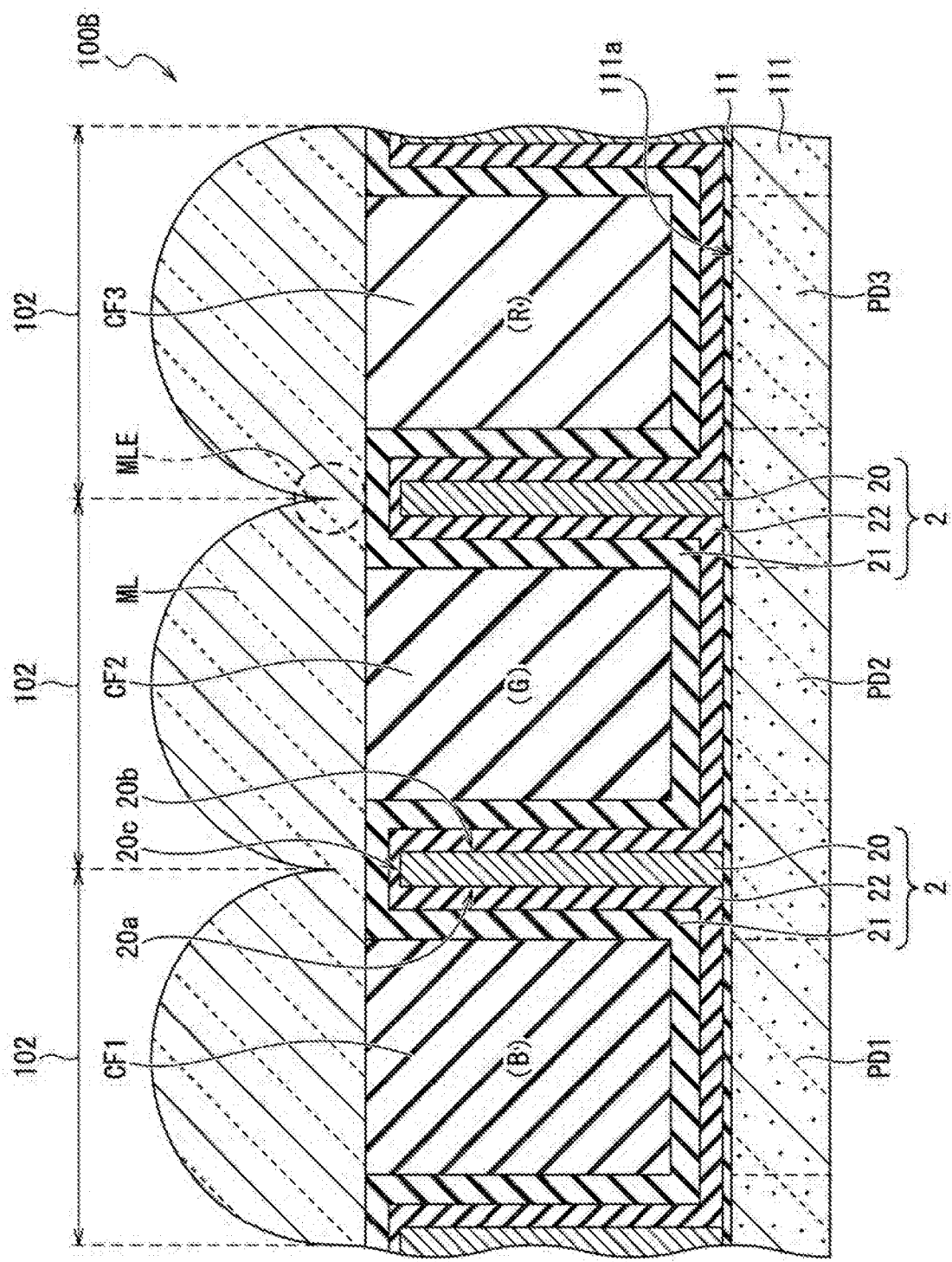
FIG. 8 is a cross-sectional view showing a configuration example of the partition wall and the peripheral portion thereof in the imaging device according to the second embodiment of the present disclosure.

FIG. 8 is a cross-sectional view showing a configuration example of a partition wall 2 and a peripheral portion thereof in an imaging device 100B according to the second embodiment of the present disclosure. As shown in FIG. 8, in the imaging device 100B, the first partition wall layer 21 and the second partition wall layer 22 are provided between the semiconductor substrate 111 and the color filters CFs. For example, the insulating film 11, the second partition wall layer 22, the first partition wall layer 21, and the color filters CFs are laminated in order above the photodiodes PDs. The second partition wall layer 22 and the first partition wall layer 21 disposed between the semiconductor substrate 111 and the color filters CFs function as antireflection films for preventing light from being reflected from the semiconductor substrate 111 side to the color filter CF side.

Figure 9:
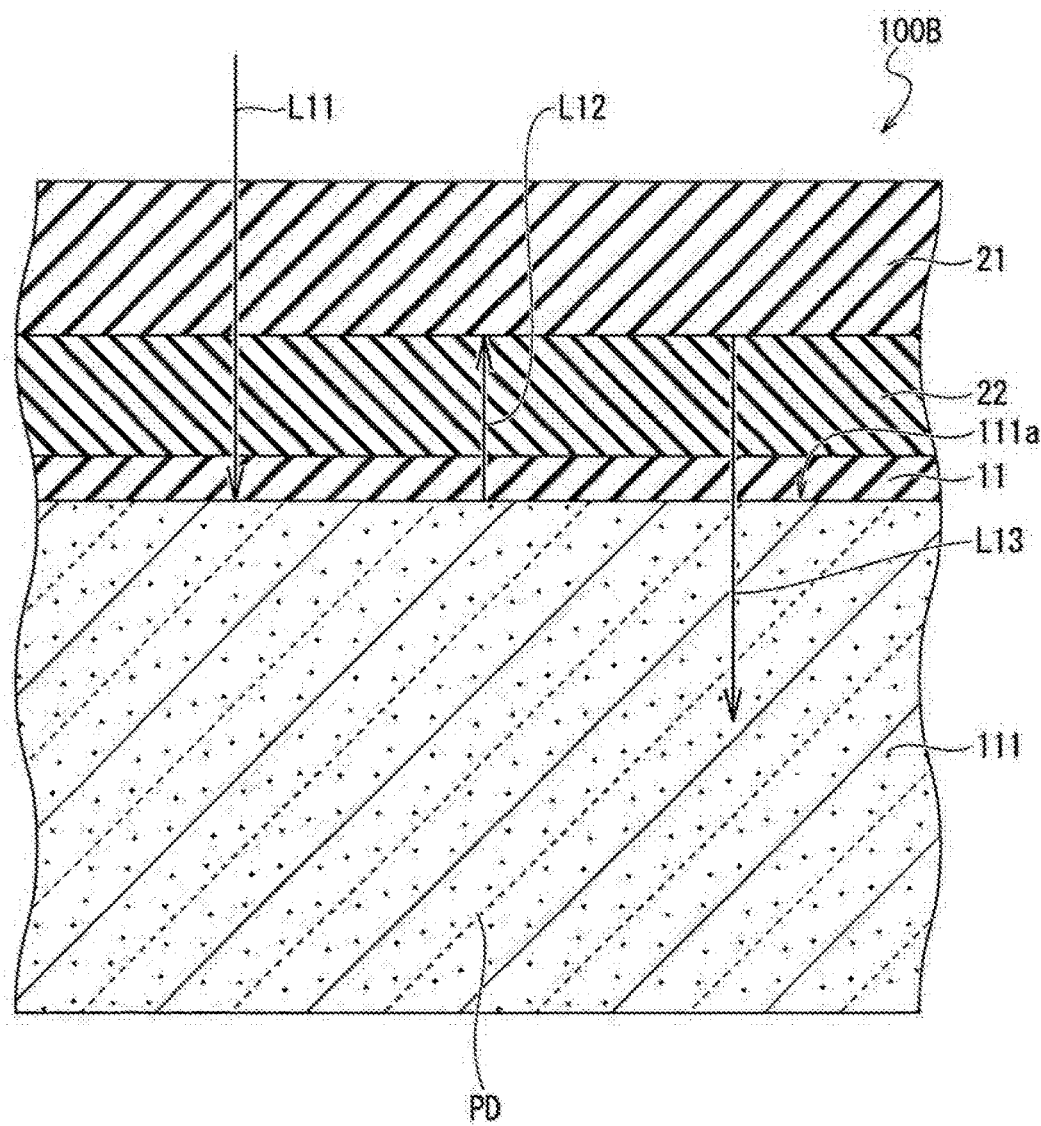
FIG. 9 is a cross-sectional view for explaining prevention of light reflection from a semiconductor substrate side toward a color filter side in the imaging device according to the second embodiment of the present disclosure.

FIG. 9 is a cross-sectional view for explaining prevention of light reflection from the semiconductor substrate 111 side to the color filter CF side in the imaging device 100B according to the second embodiment of the present disclosure. In FIG. 9, a color filter (not shown) is disposed on the first partition wall layer 21. A case in which light L11 that has passed through the color filter is incident on a surface of the first partition wall layer 21 located above the photodiode PD substantially vertically is assumed.

The light L11 that has passed through the first partition wall layer 21 passes through the second partition wall layer 22 having a higher refractive index than the first partition wall layer 21 and the insulating film 11 and reaches the back surface (light receiving surface) 111a of the semiconductor substrate 111. The light L11 that has reached the light receiving surface 111a is photoelectrically converted by the photodiode PD. In addition, a part of the light L11 is reflected by the surface of the insulating film 11 and the light receiving surface 111a before reaching the photodiode PD. The reflected light L12 passes through the second partition wall layer 22 and reaches the first partition wall layer 21. As described above, the refractive index n22 of the second partition wall layer 22 is larger than the refractive index n21 of the first partition wall layer 21 (n21<n22). For this reason, at least a part of the light L12 that has reached the first partition wall layer 21 is reflected again toward the second partition wall layer 22 side. The reflected light L13 passes through the second partition wall layer 22 and the insulating film 11, reaches the back surface (light receiving surface) 111a of the semiconductor substrate 111, and is photoelectrically converted by the photodiode PD.

In the imaging device 100B, the high-angle incident light that has reached the side surface of the first metal layer 20 is also attenuated while being repeatedly reflected between the side surface of the first metal layer 20 and the first partition wall layer 21. Accordingly, the imaging device 100B can reduce the high-angle incident light that reaches the photodiode PD. The imaging device 100B can inhibit deterioration in imaging performance due to the problem that the high-angle incident light is photoelectrically converted and causes color mixing or the like in a pixel signal.

Further, the first partition wall layer 21 and the second partition wall layer 22 also function as antireflection films that prevent light from being reflected from the photodiode PD side to the color filter CF side. The first partition wall layer 21 and the second partition wall layer 22 reflect the light reflected by the light receiving surface 111a of the semiconductor substrate 111 toward the light receiving surface 111a again. Thus, the imaging device 100B can increase the quantum efficiency.

Figure 10A:
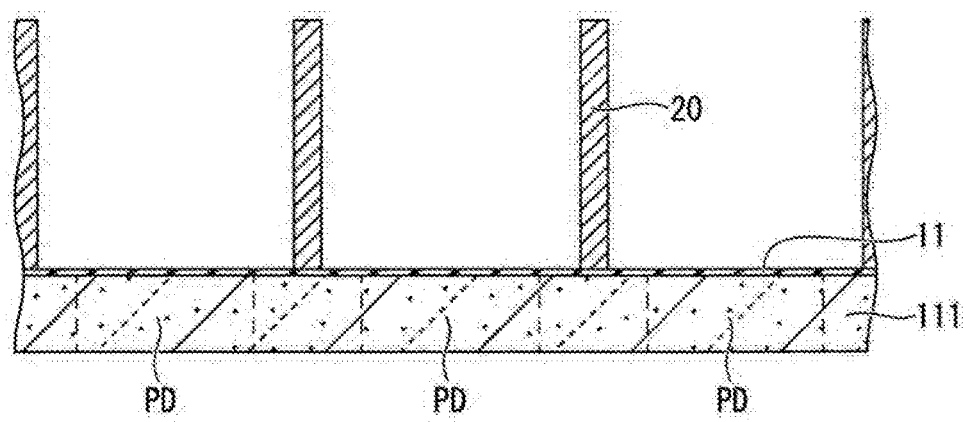
FIG. 10A is a cross-sectional view showing a method for manufacturing the imaging device according to a third embodiment of the present disclosure in the order of processes.

Next, a method for manufacturing the imaging device 100B shown in FIG. 8 will be described. FIGS. 10A, 10B, 10C, 10D, and 10E are cross-sectional views showing the method for manufacturing the imaging device 100B according to the third embodiment of the present disclosure in the order of processes. In FIG. 10A, processes up to the process of forming the first metal layer 20 are the same as those in the method for manufacturing the imaging device 100 described in the first embodiment.

Figure 10B:
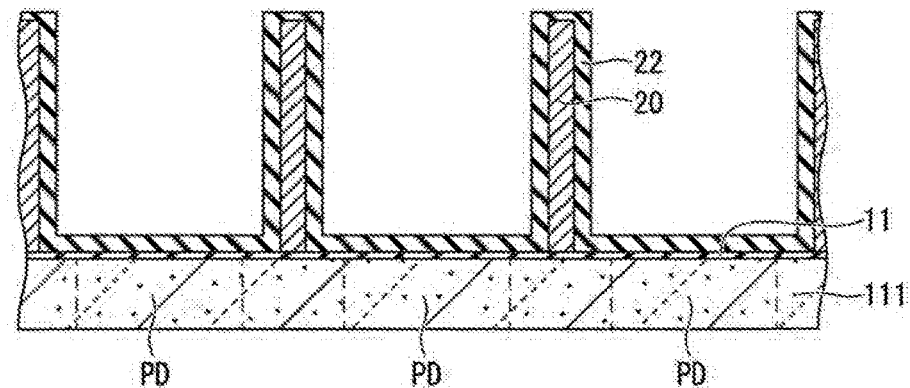
FIG. 10B is a cross-sectional view showing the method for manufacturing the imaging device according to the third embodiment of the present disclosure in the order of processes.

After the first metal layer 20 has been formed, as shown in FIG. 10B, the manufacturing device forms the second partition wall layer 22 above the semiconductor substrate 111. For example, the second partition wall layer 22 is a silicon carbide film (a-SiC) having an amorphous crystal structure, and a forming method thereof is a CVD method. The manufacturing device forms the second partition wall layer 22 to be thinner than the insulating layer 22' (see FIG. 4E).

Figure 10C:
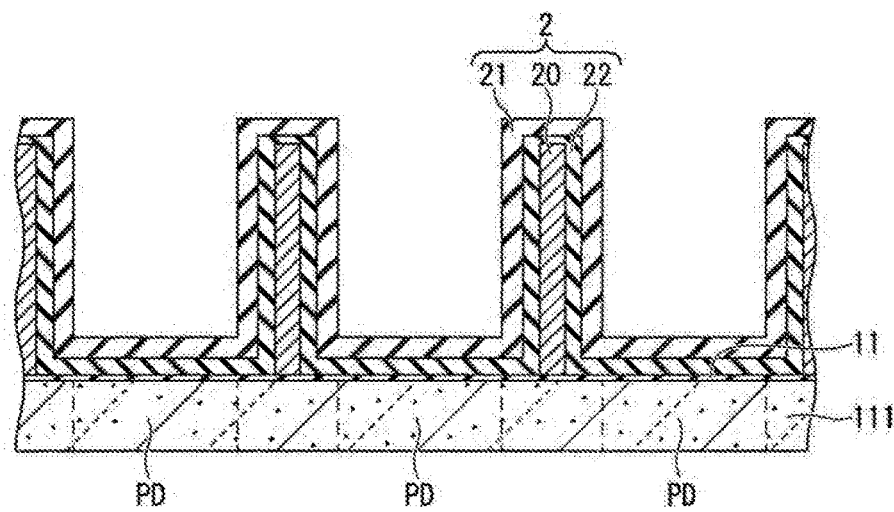
FIG. 10C is a cross-sectional view showing the method for manufacturing the imaging device according to the third embodiment of the present disclosure in the order of processes.

Next, as shown in FIG. 10C, the manufacturing device forms the first partition wall layer 21 on the second partition wall layer 22. For example, the first partition wall layer 21 is a silicon oxide film ($SiO_2$), and a forming method thereof is a CVD method. The manufacturing device forms the first partition wall layer 21 to be thinner than the insulating layer 21' (see FIG. 4H). Thus, the partition wall 2 having the first metal layer 20, the first partition wall layer 21, and the second partition wall layer 22 is finally formed. Further, a laminated structure having the second partition wall layer 22 and the first partition wall layer 21 is finally formed above the photodiodes PDs.

Figure 10D:
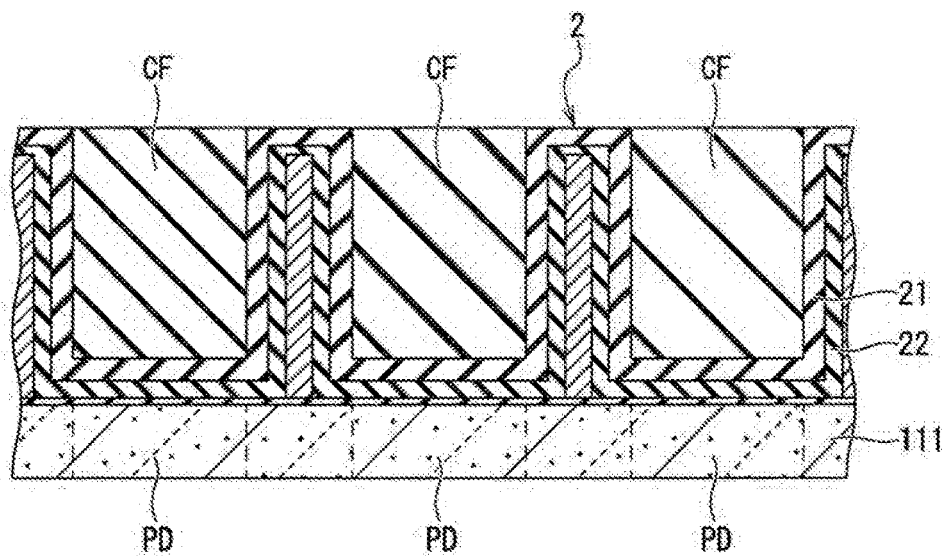
FIG. 10D is a cross-sectional view showing the method for manufacturing the imaging device according to the third embodiment of the present disclosure in the order of processes.
Figure 10E:
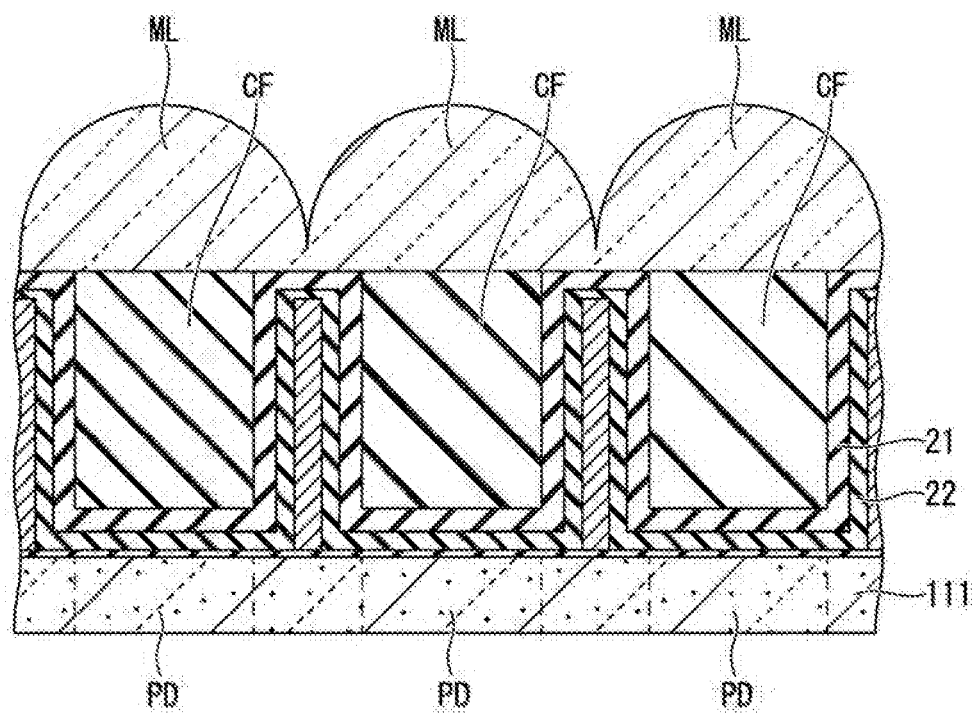
FIG. 10E is a cross-sectional view showing the method for manufacturing the imaging device according to the third embodiment of the present disclosure in the order of processes.

The subsequent processes are the same as those in the method for manufacturing the imaging device 100 described in the first embodiment. As shown in FIG. 10D, the manufacturing device forms the color filters CFs in regions between adjacent partition walls 20 (that is, above the photodiodes PDs). Next, as shown in FIG. 10E, the manufacturing device forms the micro lens ML above each of the plurality of color filters CFs. Through the above processes, the imaging device 100B shown in FIG. 8 is finally formed.

Fourth Embodiment

In the first embodiment, an aspect in which only the insulating film 11 is disposed between the semiconductor substrate 111 and the partition wall 2 has been shown. However, in the embodiments of the present disclosure, a structure between the semiconductor substrate 111 and the partition wall 2 is not limited thereto. A light-shielding film may be disposed between the semiconductor substrate 111 and the partition wall 2. Also, this light-shielding film may be made of a metal.

Figure 11:
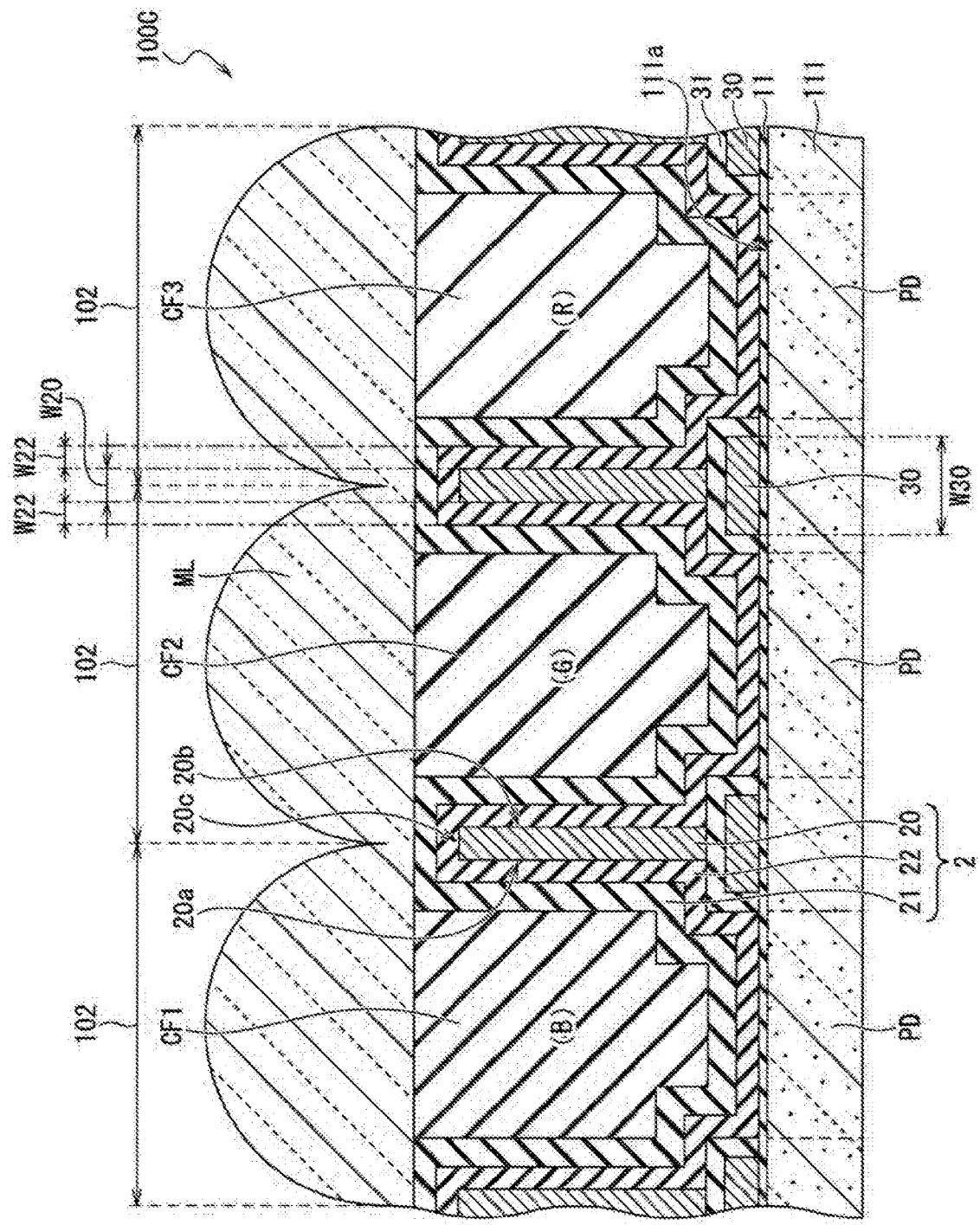
FIG. 11 is a cross-sectional view showing a configuration example of a partition wall and a peripheral portion thereof in an imaging device according to a fourth embodiment of the present disclosure.

FIG. 11 is a cross-sectional view showing a configuration example of a partition wall 2 and a peripheral portion thereof in an imaging device 100C according to a fourth embodiment of the present disclosure. As shown in FIG. 8, in the imaging device 100C, a metal light-shielding film 30 (an example of the "light-shielding film" of the present disclosure) and an insulating film 31 that covers an upper surface and side surfaces of the metal light-shielding film 30 are provided between the semiconductor substrate 111 and the partition wall 2. For example, the insulating film 11, the metal light-shielding film 30, and the insulating film 31 are laminated in order from the semiconductor substrate 111 side to the partition wall 2 side. The metal light-shielding film 30 prevents light trapped in the second partition wall layer 22 of the partition wall 2 from being incident on the semiconductor substrate 111. The metal light-shielding film 30 has a shape that exposes an upper side of the photodiode PD and covers other regions.

For example, a width W30 of the metal light-shielding film 30 is larger than a width W20 of the first metal layer 20 of the partition wall 2 (W30>W20). Further, the width W30 of the metal light-shielding film 30 preferably has a size equal to or larger than a value obtained by adding the width W20 of the first metal layer 20 of the partition wall 2, a thickness W22 of a portion of the second partition wall layer 22 that covers the first side surface 20a of the first metal layer 20, and a thickness W22 of a portion of the second partition wall layer 22 that covers the second side surface 20b of the first metal layer 20 (W30≥W20+W22×2). Thus, the metal light-shielding film 30 can be interposed between the second partition wall layer 22 and the semiconductor substrate 111 and can prevent light from being incident the semiconductor substrate 111 from the second partition wall layer 22.

Figure 12:
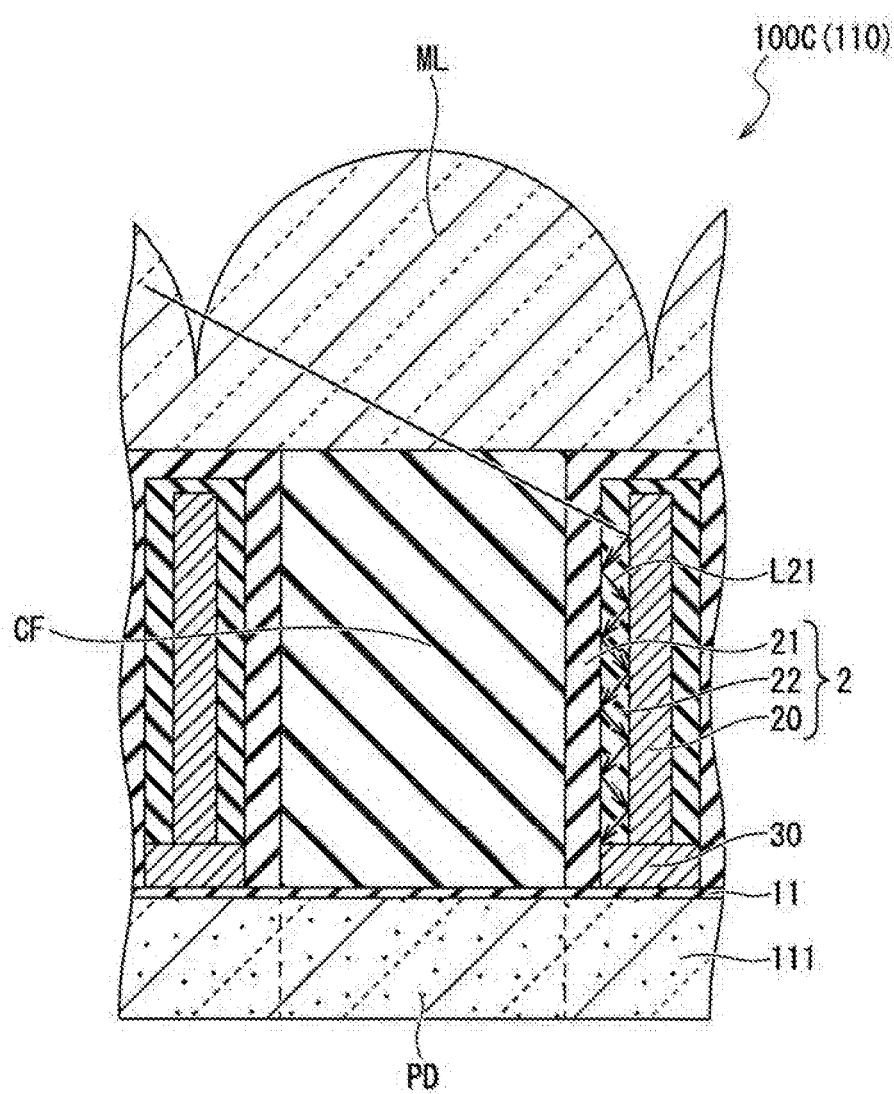
FIG. 12 is a cross-sectional view for explaining light shielding from a partition wall side to a semiconductor substrate side in the imaging device according to the fourth embodiment of the present disclosure.

FIG. 12 is a cross-sectional view for explaining light shielding from the partition wall 2 side to the semiconductor substrate 111 side in the imaging device 100C according to the fourth embodiment of the present disclosure. Also, FIG. 12 shows an aspect in which the insulating film 31 shown in FIG. 11 is omitted. As shown in FIG. 12, light L21 that is incident on the surface of the color filter CF at a high angle, passes through the first partition wall layer 21, and is incident on the second partition wall layer 22 proceeds to the semiconductor substrate 111 side (downward in FIG. 12) while being reflected between the first metal layer 20 and the first partition wall layer 21. When the light L21 reaches a surface of the metal light-shielding film 30, it is reflected by the surface of the first metal layer 20 and proceeds to a side opposite to the semiconductor substrate 111 (upward in FIG. 12).

Thus, the metal light-shielding film 30 can prevent the light L21 from being incident on the semiconductor substrate 111 from the second partition wall layer 22. The imaging device 100C can further reduce the high-angle incident light that reaches the photodiode PD. The imaging device 100C can further inhibit deterioration in imaging performance due to the problem that the high angle incident light is photoelectrically converted and causes color mixing or the like in a pixel signal.

Figure 13A:
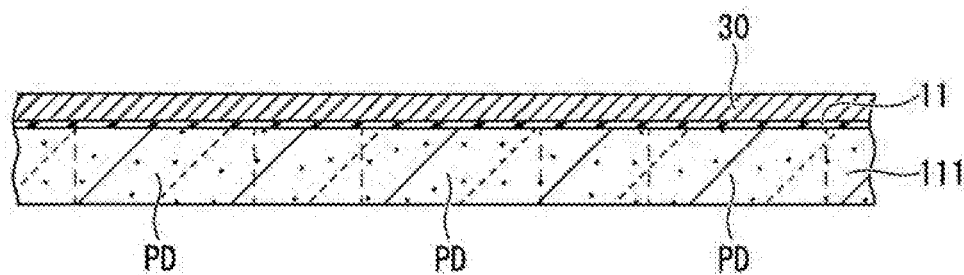
FIG. 13A is a cross-sectional view showing a method for manufacturing the imaging device according to the fourth embodiment of the present disclosure in the order of processes.

Next, a method for manufacturing the imaging device 100C shown in FIG. 12 will be described. FIGS. 13A, 13B, 13C, 13D, 13E, 13F, 13G, and 13H are cross-sectional views showing the method for manufacturing the imaging device 100C according to the fourth embodiment of the present disclosure in the order of processes. In FIG. 13A, processes up to the process of forming the insulating film 11 are the same as those in the method for manufacturing the imaging device 100 described in the first embodiment. After the insulating film 11 has been formed, the manufacturing device forms a metal film 30' on the insulating film 11. For example, the metal film 30' is copper (Cu) or tungsten (W), and a forming method thereof is a CVD method, a vapor deposition method, or a sputtering method.

Figure 13B:
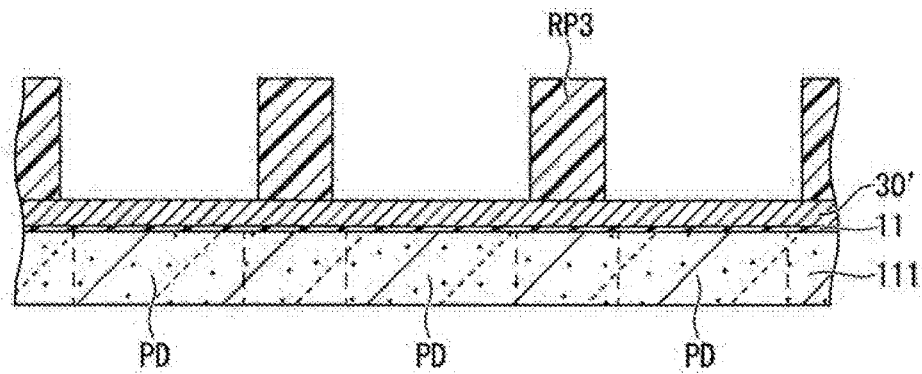
FIG. 13B is a cross-sectional view showing the method for manufacturing the imaging device according to the fourth embodiment of the present disclosure in the order of processes.
Figure 13C:
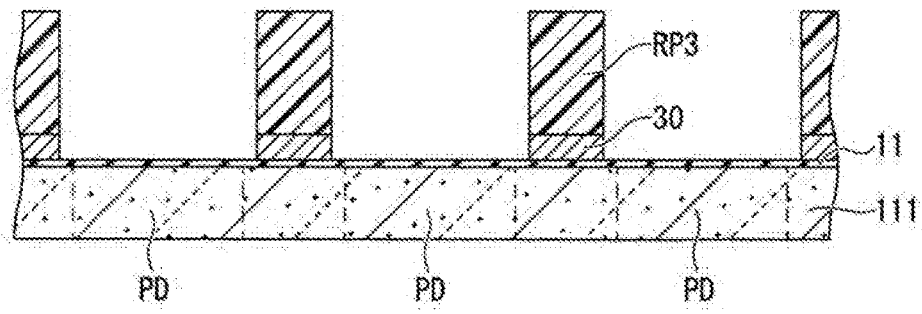
FIG. 13C is a cross-sectional view showing the method for manufacturing the imaging device according to the fourth embodiment of the present disclosure in the order of processes.

Next, as shown in FIG. 13B, the manufacturing device forms a resist pattern RP3 on the metal film 30'. The resist pattern RP3 has a shape that exposes an upper side of the photodiode PD and covers other regions. The resist pattern RP3 has a shape that covers a region serving as the metal light-shielding film 30 (see FIG. 12) and exposes other regions. Next, the manufacturing device dry-etches the metal film 30' using the resist pattern RP3 as a mask. Dry etching is, for example, RIE. Thus, as shown in FIG. 13C, the metal light-shielding film 30 is formed. After that, the manufacturing device removes the resist pattern RP3.

Figure 13D:
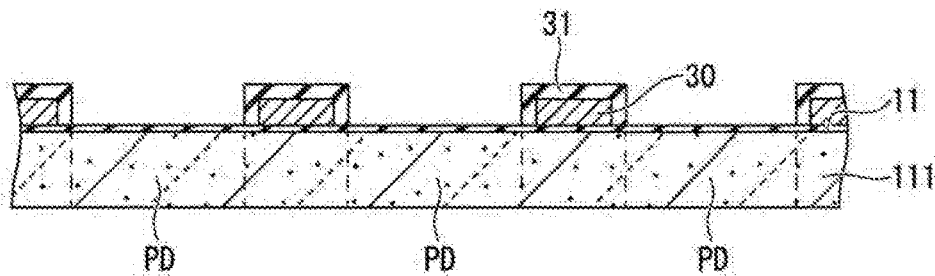
FIG. 13D is a cross-sectional view showing the method for manufacturing the imaging device according to the fourth embodiment of the present disclosure in the order of processes.

Next, the manufacturing device forms an insulating film on the insulating film 11. The insulating film is, for example, a silicon oxide film ($SiO_2$). Next, the manufacturing device forms a resist pattern (not shown) on the insulating film and dry-etches the insulating film using the resist pattern as a mask. Dry etching is, for example, RIE. Thus, as shown in FIG. 13D, the insulating film 31 that covers the upper surface and the side surfaces of the metal light-shielding film 30 is formed. Further, in the present embodiment, the dry etching of the insulating film can also be omitted. In that case, the upper side of the photodiode PD is also covered with the insulating film 31.

Figure 13E:
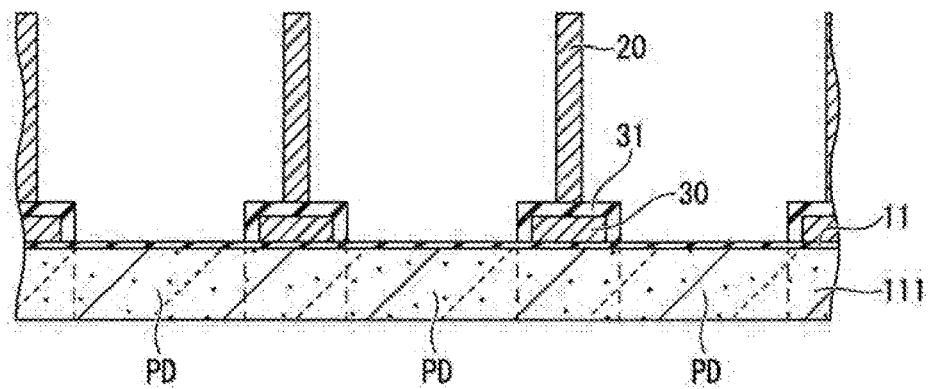
FIG. 13E is a cross-sectional view showing the method for manufacturing the imaging device according to the fourth embodiment of the present disclosure in the order of processes.

Next, the manufacturing device forms a metal layer (not shown) above the semiconductor substrate 111. For example, the metal layer is a thin film of copper (Cu) or tungsten (W), and a forming method thereof is a CVD method, a vapor deposition method, or a sputtering method. Next, the manufacturing device forms a resist pattern (not shown) on the insulating film and dry-etches the metal film using the resist pattern as a mask. Dry etching is, for example, RIE. Thus, as shown in FIG. 13E, the first metal layer 20 is formed on the metal light-shielding film 30 via the insulating film 31.

Figure 13F:
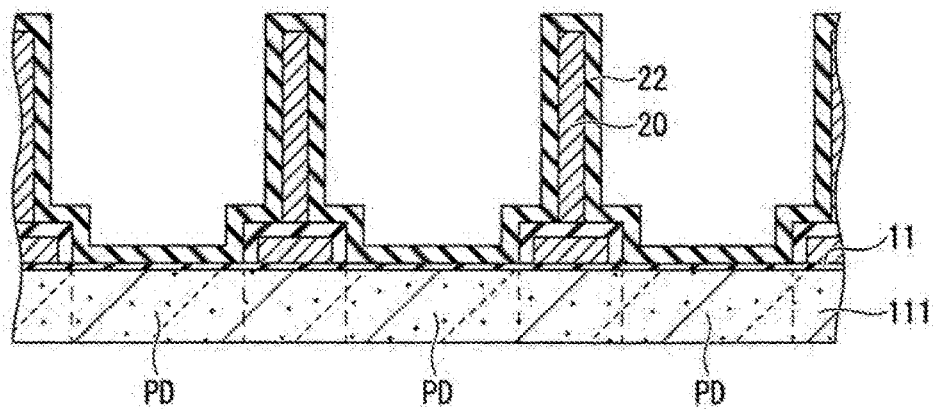
FIG. 13F is a cross-sectional view showing the method for manufacturing the imaging device according to the fourth embodiment of the present disclosure in the order of processes.
Figure 13G:
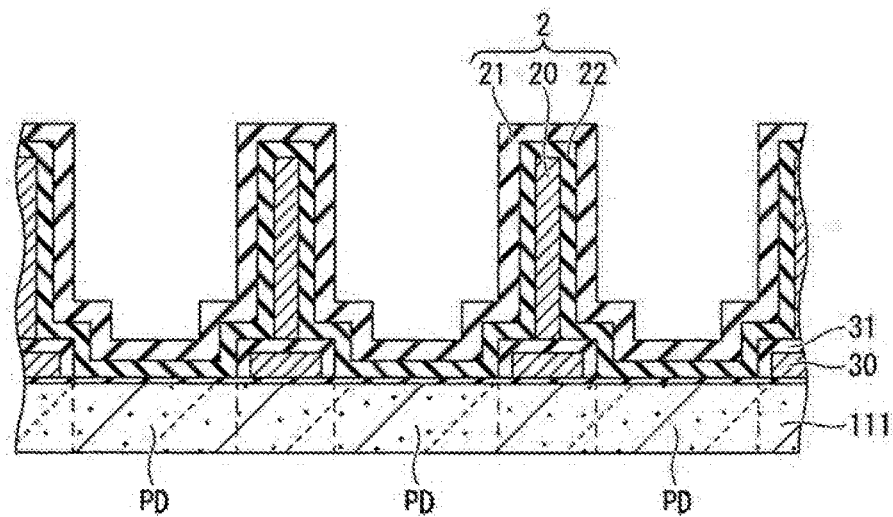
FIG. 13G is a cross-sectional view showing the method for manufacturing the imaging device according to the fourth embodiment of the present disclosure in the order of processes.
Figure 13H:
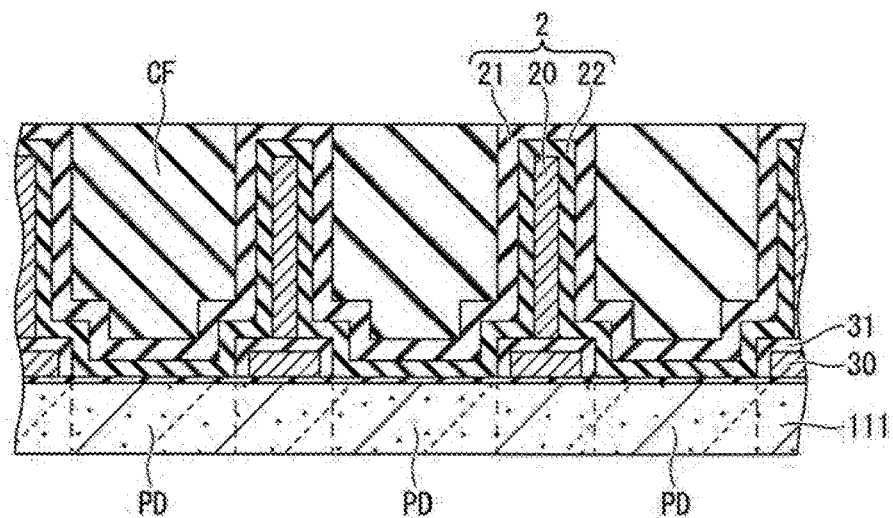
FIG. 13H is a cross-sectional view showing the method for manufacturing the imaging device according to the fourth embodiment of the present disclosure in the order of processes.

The subsequent processes are the same as those in the method for manufacturing the imaging device 100B described in the third embodiment. As shown in FIG. 13F, the manufacturing device forms the second partition wall layer 22 above the semiconductor substrate 111. Next, as shown in FIG. 13G, the manufacturing device forms the first partition wall layer 21 on the second partition wall layer 22. Thus, the partition wall 2 having the first metal layer 20, the first partition wall layer 21, and the second partition wall layer 22 is finally formed. Further, a laminated structure having the second partition wall layer 22 and the first partition wall layer 21 is finally formed above the photodiodes PDs. Next, as shown in FIG. 13H, the manufacturing device forms the color filters CFs in regions between adjacent partition walls 20 (that is, above the photodiodes PDs). Next, the manufacturing device forms the micro lens (not shown) above each of the plurality of color filters CFs. Through the above processes, the imaging device 100C shown in FIG. 12 is finally formed.

Fifth Embodiment

In the above embodiment, a case in which the thicknesses W22 (see FIG. 11) of the second partition wall layers 22 between the plurality of pixels 102 are the same has been shown. However, the embodiments of the present disclosure are not limited thereto. In the embodiments of the present disclosure, in the second partition wall layer 22, the thickness of the portion that covers the first side surface 20a of the first metal layer 20 and the thickness of the portion that covers the second side surface 20b may be different from each other.

Figure 14:
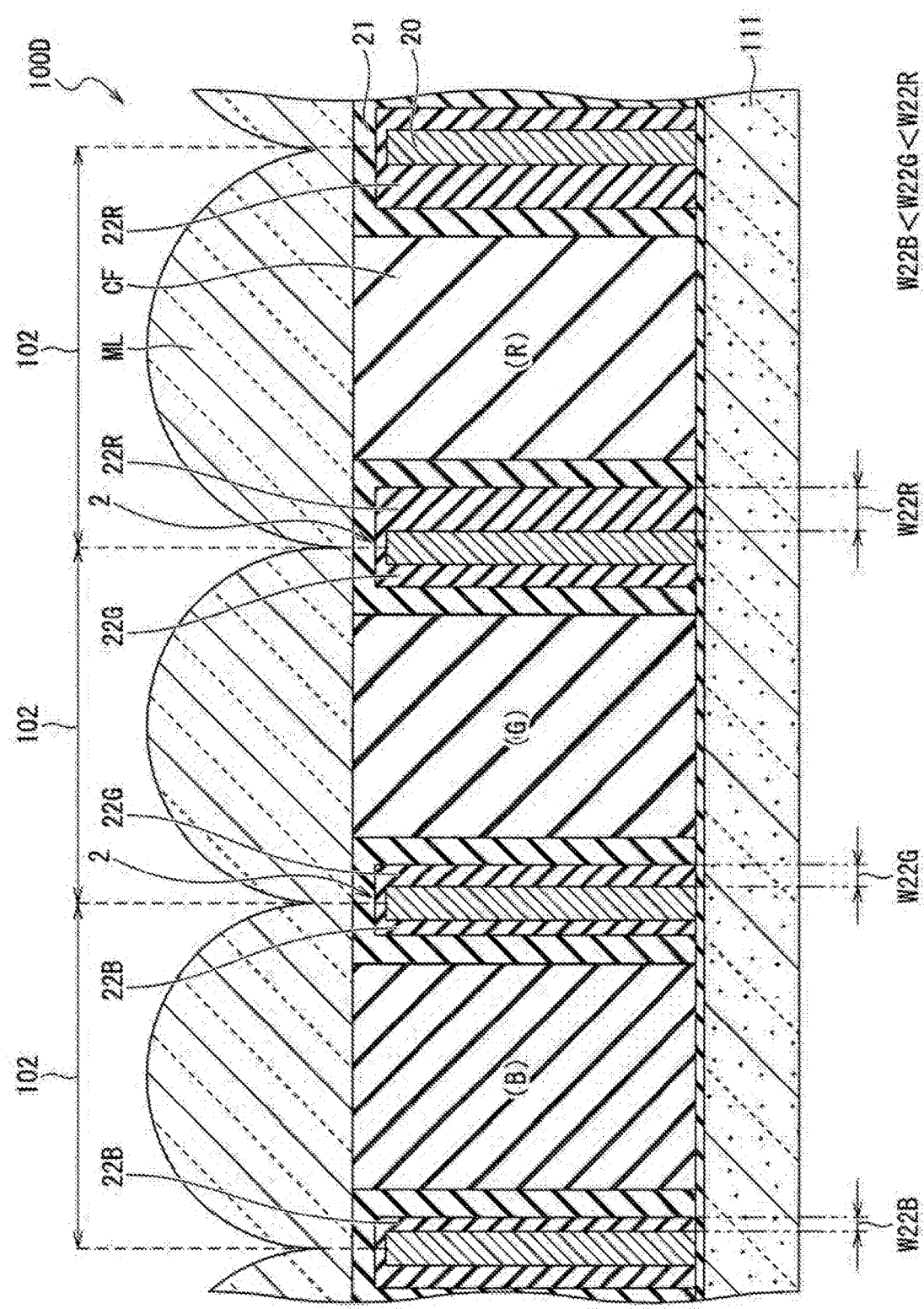
FIG. 14 is a cross-sectional view showing a configuration example of a partition wall and a peripheral portion thereof in an imaging device according to a fifth embodiment of the present disclosure.

FIG. 14 is a cross-sectional view showing a configuration example of a partition wall 2 and a peripheral portion thereof in an imaging device 100D according to a fifth embodiment of the present disclosure. As shown in FIG. 14, in the imaging device 100D, a thickness W22B of the second partition wall layer 22 of the blue (B) pixel 102, a thickness W22G of the second partition wall layer 22 of the green (G) pixel 102, and a thickness W22R of the second partition wall layer 22 of the red (R) pixel 102 are different from each other. For example, among the thicknesses W22B, W22G, and W22B, W22B is the smallest and W22R is the largest. Similarly to wavelengths of the blue (B), green (G), and red (R) colors, the relationship of W22B<W22G<W22R is established. The imaging device 100D makes the thickness of the second partition wall layer 22 different for each of the blue (B), green (G), and red (R) colors, so that a width and a pixel area of the pixel 102 can be made different for each of the blue (B), green (G), and red (R) colors.

In the imaging device 100D, the high-angle incident light that has reached the side surface of the first metal layer 20 is also attenuated while being repeatedly reflected between the side surface of the first metal layer 20 and the first partition wall layer 21. Accordingly, the imaging device 100D can reduce the high-angle incident light that reaches the photodiode PD. The imaging device 100D can inhibit deterioration in imaging performance due to the problem that the high-angle incident light is photoelectrically converted and causes color mixing or the like in a pixel signal.

Figure 15A:
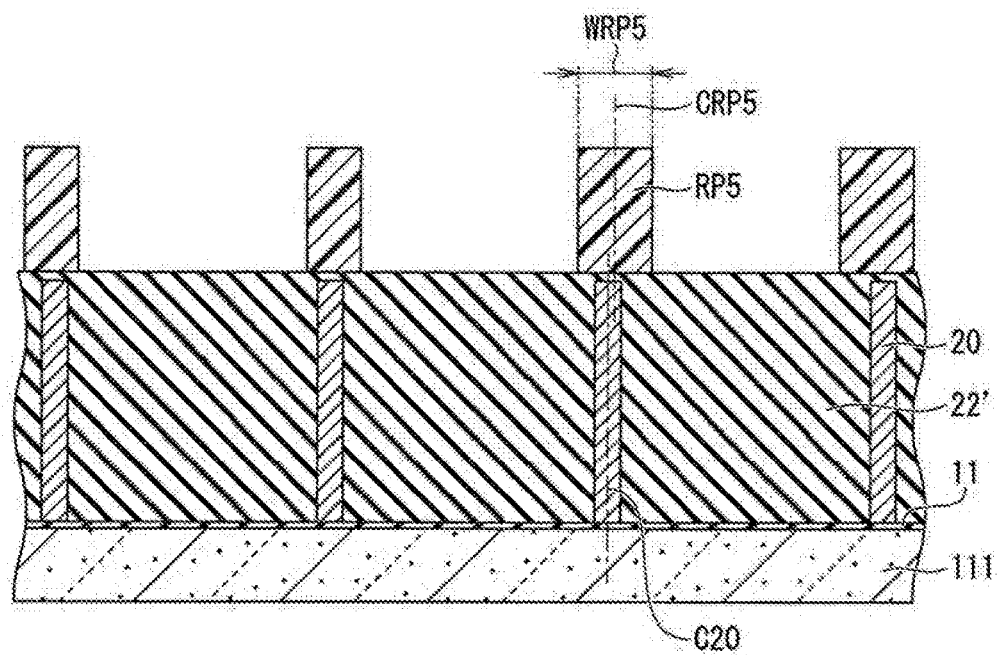
FIG. 15A is a cross-sectional view showing a method for manufacturing the imaging device according to the fifth embodiment of the present disclosure in the order of processes.
Figure 15B:
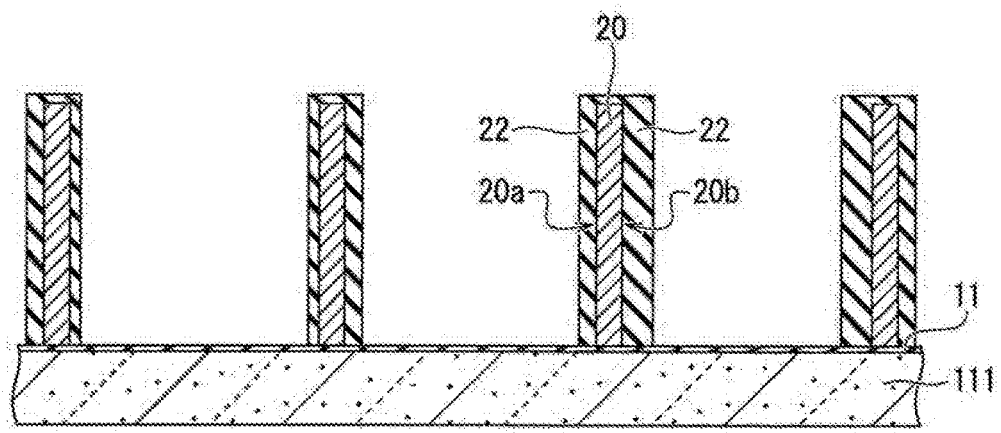
FIG. 15B is a cross-sectional view showing the method for manufacturing the imaging device according to the fifth embodiment of the present disclosure in the order of processes.

Next, a method for manufacturing the imaging device 100D shown in FIG. 14 will be described. FIGS. 15A and 15B are cross-sectional views showing the method for manufacturing the imaging device 100D according to the fifth embodiment of the present disclosure in the order of processes. In FIG. 15A, processes up to the process of forming the insulating layer 22' are the same as those in the method for manufacturing the imaging device 100 described in the first embodiment. After the insulating layer 22' has been formed, the manufacturing device forms resist patterns RP5 on the insulating layer 22' as shown in FIG. 15A. The resist patterns RP5 have shapes that cover regions serving as the first metal layer 20 and the second partition wall layer 22 (see FIG. 14) of the partition wall 2 and expose other regions.

In the imaging device 100, thicknesses of the second partition wall layers 22 between the blue (B), green (G), and red (R) pixels 102 are different from each other. For example, boundary portions between the blue (B), green (G), and red (R) pixels 102 are first metal layers 20, and a thickness of the second partition wall layer 22 formed on the first side surface 20a side of the first metal layer 20 and a thickness of the second partition wall layer 22 formed on the second side surface 20b side are different from each other. For this reason, a central position CRP5 in a width direction of the resist pattern RP5 is deviated in the width direction from a central position C20 in the width direction of the first metal layer 20.

Further, the plurality of resist patterns RP5 have different widths depending on their arrangement positions. For example, a width WRP5 of a resist pattern RP5 disposed at a position straddling between the blue (B) pixel 102 and the green (G) pixel 102 is larger than a width WRP5 of a resist pattern RP5 formed to straddle between the green (G) pixel 102 and the red (R) pixel 102.

Next, the manufacturing device dry-etches the insulating layer 22' using the resist patterns RP5 as a mask. Dry etching is, for example, RIE. Thus, as shown in FIG. 15B, the second partition wall layers 22 are formed. After that, the manufacturing device removes the resist patterns RP5.

The subsequent processes are the same as those in the method for manufacturing the imaging device 100 described in the first embodiment. The manufacturing device forms the first partition wall layers 21 (see FIG. 14), forms the color filters CFs (see FIG. 14), and forms the micro lenses MLs (see FIG. 14). Through the above processes, the imaging device 100D shown in FIG. 14 is finally formed.

Sixth Embodiment

Figure 16:
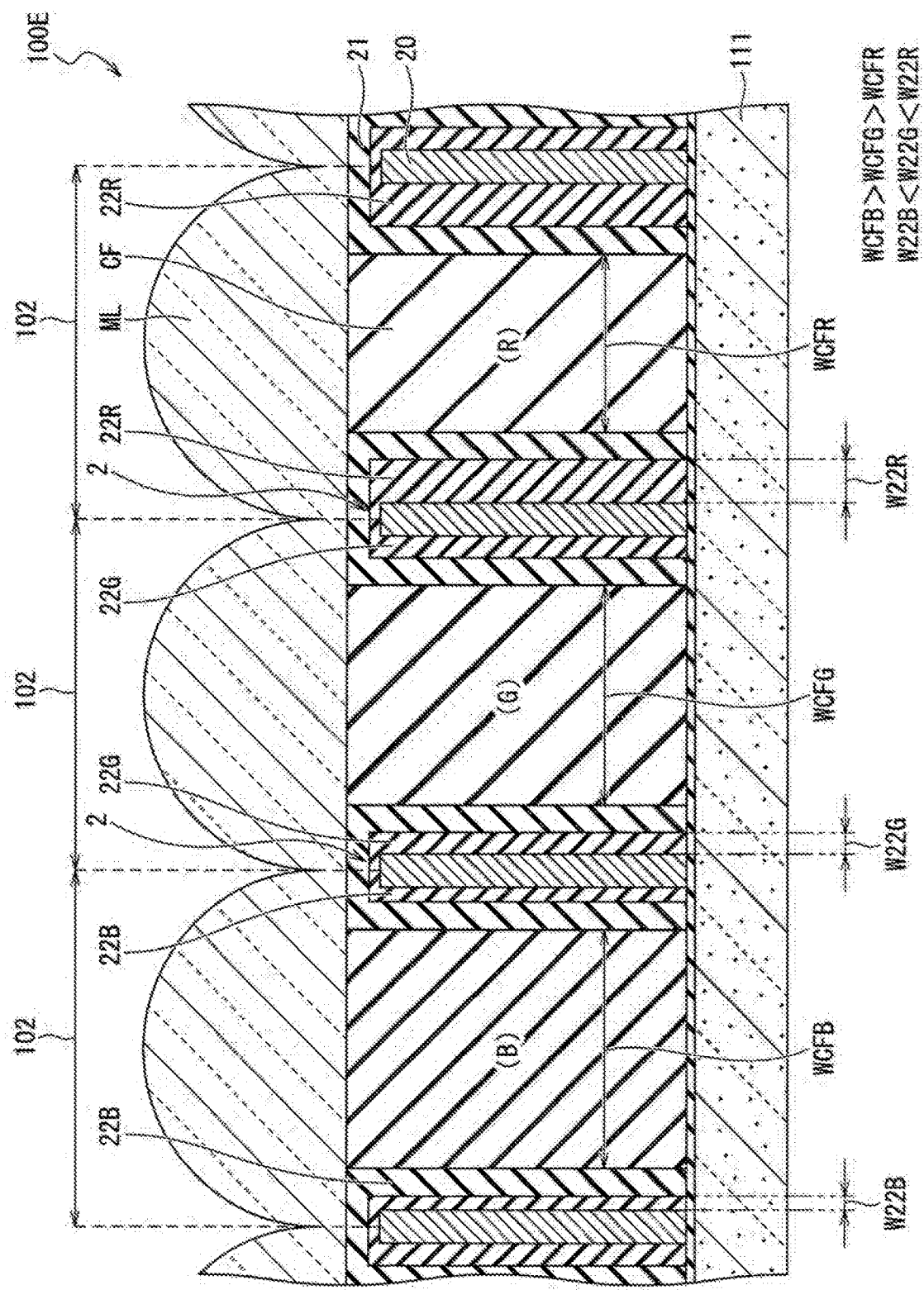
FIG. 16 is a cross-sectional view showing a configuration example of a partition wall and a peripheral portion thereof in an imaging device according to a sixth embodiment of the present disclosure.

In the embodiments of the present disclosure, widths of the color filters CFs may be the same length or different lengths from each other between the plurality of pixels 102. FIG. 16 is a cross-sectional view showing a configuration example of a partition wall 2 and a peripheral portion thereof in an imaging device 100E according to a sixth embodiment of the present disclosure. As shown in FIG. 16, in the imaging device 100E, a width WCFB of the blue (B) color filter CF, a width WCFG of the green (G) color filter CF, and a width WCFR of the red (R) color filter CF are different from each other.

For example, among the widths WCFB, WCFG, and WCFR, WCFB is the largest, and WCFR is the smallest. Among the blue (B), green (G), and red (R) pixels 102, the red (R) pixel 102 has the highest sensitivity, and the blue (B) pixel 102 has the lowest sensitivity. For this reason, in the imaging device 100D, the width WCFE of the color filter CF is reduced to bring the sensitivity of the red (R) closer to the sensitivity of the green (G). Further, the width WCFE of the blue (B) color filter CF is increased to bring the sensitivity of the blue (B) closer to the sensitivity of the green (G). Contrary to the sensitivities of the blue (B), green (G), and red (R), the relationship of WCFB>WCFG>WCFR is established.

Further, in the imaging device 100E, similarly to the imaging device 100D described in the fifth embodiment, the thickness W22B of the second partition wall layer 22 of the blue (B) pixel 102, the thickness W22G of the second partition wall layer 22 of the green (G) pixel 102, and the thickness W22R of the second partition wall layer 22 of the red (R) pixel 102 may be different from each other.

For example, the relationship of W22B<W22G<W22R may be established. In the imaging device 100E, the thickness of the second partition wall layer 22 is made different for each of the blue (B), green (G), and red (R), and thus the blue (B), green (G), and red (R) pixels 102 have the same width. Specifically, the relationship of WCFB+W22B×2=WCFG+W22G×2=WCFR+W22R×2 is established. Thus, the blue (B), green (G), and red (R) pixels 102 have the same width, and the micro lenses ML disposed on the color filters CFs also have the same width (diameter). In each of the blue (B), green (G), and red (R) pixels 102, the pixel area is made uniform.

In the imaging device 100E, the high-angle incident light that has reached the side surface of the first metal layer 20 is also attenuated while being repeatedly reflected between the side surface of the first metal layer 20 and the first partition wall layer 21. Accordingly, the imaging device 100E can reduce the high-angle incident light that reaches the photodiode PD. The imaging device 100E can inhibit deterioration in imaging performance due to the problem that the high-angle incident light is photoelectrically converted and causes color mixing or the like in a pixel signal.

Seventh Embodiment

The semiconductor substrates of the imaging devices according to the embodiments of the present disclosure may be provided with trench isolation for separating the photodiodes PDs adjacent to each other. Also, the imaging devices according to the embodiments of the present disclosure may be subjected to so-called "pupil correction."

Figure 17:
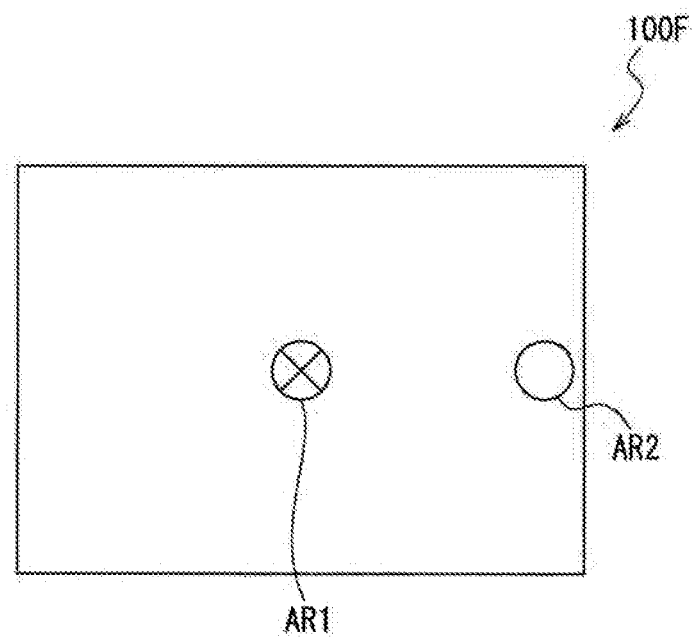
FIG. 17 is a diagram illustrating a central region and a peripheral region of an imaging region configured of a plurality of photodiodes in an imaging device according to a seventh embodiment of the present disclosure.
Figure 18:
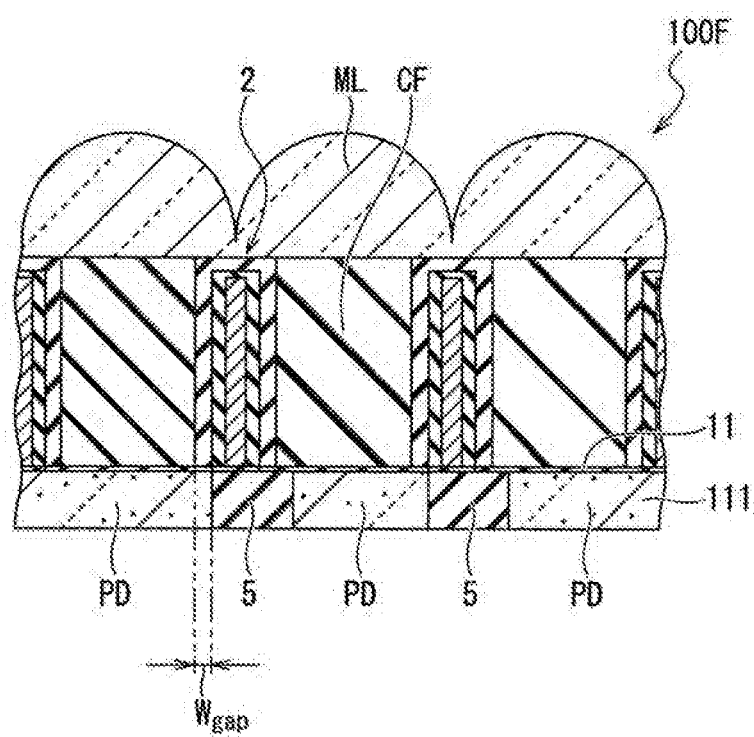
FIG. 18 shows the imaging device according to the seventh embodiment of the present disclosure and is a cross-sectional view showing a configuration example of a partition wall and a peripheral portion thereof in a peripheral region of an imaging region.

FIG. 17 is a diagram illustrating a central region AR1 and a peripheral region AR2 of an imaging region configured of a plurality of photodiodes in an imaging device 100F according to a seventh embodiment of the present disclosure. FIG. 18 is the imaging device 100F according to the seventh embodiment of the present disclosure and is a cross-sectional view showing a configuration example of a partition wall 2 and a peripheral portion thereof in the peripheral region AR2 of the imaging region shown in FIG. 17.

As shown in FIG. 18, a trench isolation 5 (an example of the "element separation layer" of the present disclosure) that separates one photodiode PD from another photodiode PD, which are adjacent to each other, may be provided in the semiconductor substrate 111 of the imaging device 100F. The trench isolation 5 is configured of a trench provided in the semiconductor substrate 111 and an insulating film (for example, $SiO_2$) filled in the trench. The partition wall 2 is located on the trench isolation 5. Also, in the embodiments of the present disclosure, the trench isolation 5 deeply formed on the semiconductor substrate 111 may be referred to as a deep trench isolation (DTI).

In addition, the imaging device 100F is subjected to so-called "pupil correction." For example, the partition wall 2 that separates the color filters CFs adjacent to each other is shifted toward the central region AR1 side of the imaging device by a predetermined distance Wgap with respect to the trench isolation 5 that separates adjacent photodiodes PDs from each other. This distance (an amount of shift) Wgap increases toward a side further separated from the central region AR1. Thus, the imaging device 100F can deviate a range of angle at which light can be incident in the peripheral region AR2 toward an upper side of the central region AR1, so that light collection efficiency in the peripheral region AR2 can be improved.

Eighth Embodiment

In the embodiments of the present disclosure, the trench isolation 5 that separates the photodiodes PDs adjacent to each other may include a metal layer (hereinafter referred to as a second metal layer). The second metal layer included in the trench isolation 5 may be joined or integrally formed with the first metal layer 20 included in the partition wall 2 to be integrated therewith, or may be separated therefrom.

Figure 19:
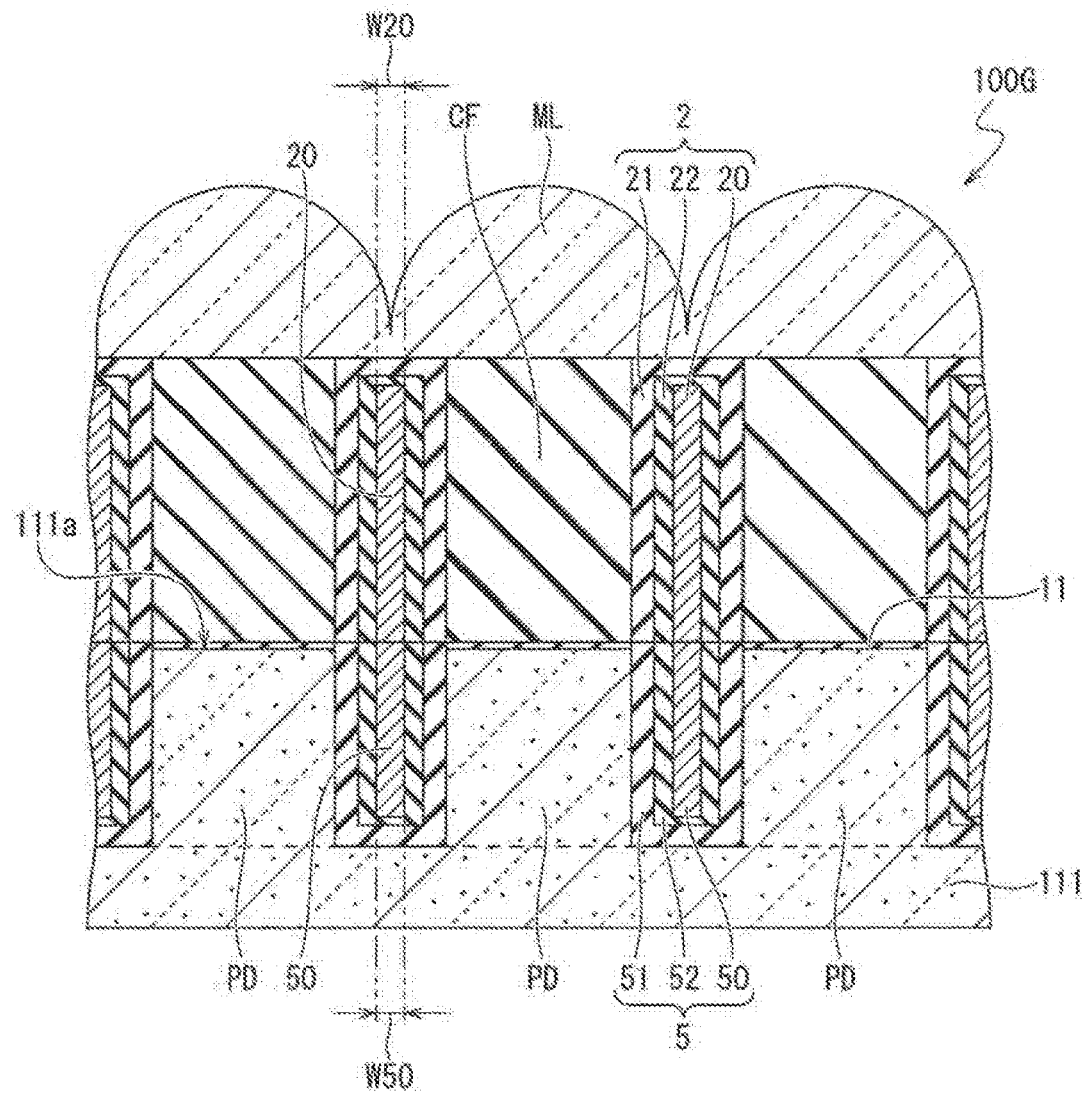
FIG. 19 is a cross-sectional view showing a configuration example of a partition wall and a peripheral portion thereof in an imaging device according to an eighth embodiment of the present disclosure.

FIG. 19 is a cross-sectional view showing a configuration example of a partition wall 2 and a peripheral portion thereof in an imaging device 100G according to an eighth embodiment of the present disclosure. As shown in FIG. 19, the semiconductor substrate 111 of the imaging device 100G is provided with a trench isolation 5 that separates adjacent photodiodes PDs from each other. In the imaging device 100G, the trench isolation 5 has a second metal layer 50 located in a central portion of the trench isolation 5, a first translucent insulating layer 51 that covers the second metal layer 50 from an outer side thereof, and a second insulating layer 52 located between the second metal layer 50 and the first insulating layer 51. The first insulating layer 51 and the second insulating layer correspond to the "insulating layer" of the present disclosure.

For example, in a thickness direction of the imaging device 100G (that is, a normal direction of the light receiving surface 111a), the second metal layer 50 included in the trench isolation 5 and the first metal layer 20 included in the partition wall 2 overlap each other. Similarly, the first insulating layer 51 and the first partition wall layer 21 overlap each other, and the second insulating layer 52 and the second partition wall layer 22 also overlap each other. A width W50 of the first metal layer 20 may be the same as or different from the width W20 of the first metal layer 20. FIG. 19 shows a case in which W50=W20, but this is just an example. W50<W20 may be used, or W50>W20 may be used.

Materials constituting the second metal layer 50, the first insulating layer 51, and the second insulating layer 52 are not particularly limited, but as an example, the second metal layer 50 is made of copper (Cu) or tungsten (W), the first insulating layer 51 is made of a silicon oxide film ($SiO_2$), and the second insulating layer 52 is made of a silicon carbide film (a-SiC) having an amorphous crystal structure.

In a case in which the first metal layer 20 and the second metal layer 50 are made of the same material, the first metal layer 20 and the second metal layer 50 are easily joined to each other. Further, in a case in which the first metal layer 20 and the second metal layer 50 are made of the same material, the first metal layer 20 and the second metal layer 50 may be integrally formed. By joining or integrally forming the first metal layer 20 and the second metal layer 50 and integrating them, it is possible to improve a joining strength of the partition wall 2 for the semiconductor substrate 111.

In a case in which the first insulating layer 51 and the first partition wall layer 21 are made of the same material, the first insulating layer 51 and the first partition wall layer 21 are easily joined to each other, and thus it is possible to improve the joining strength of the partition wall 2 for the semiconductor substrate 111.

Similarly, in a case in which the second insulating layer 52 and the second partition wall layer 22 are made of the same material, the second insulating layer 52 and the second partition wall layer 22 are easily joined to each other, and thus it is possible to improve the joining strength of the partition wall 2 for the semiconductor substrate 111.

Figure 20A:
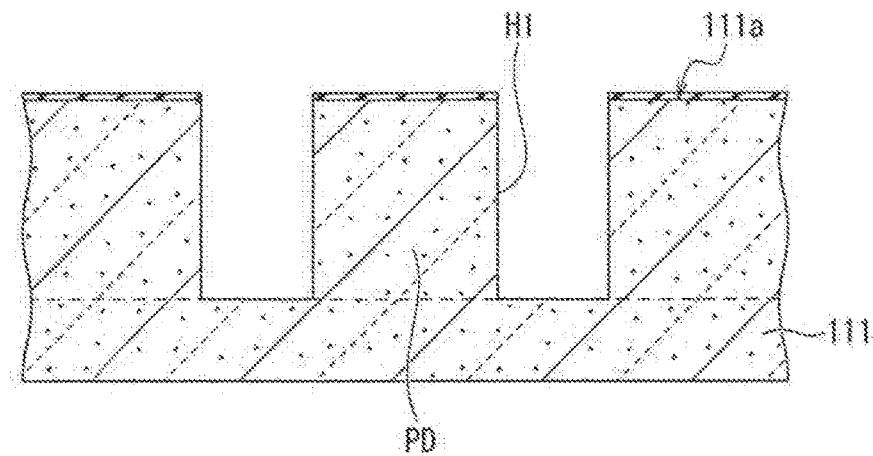
FIG. 20A is a cross-sectional view showing a method for manufacturing the imaging device according to the eighth embodiment of the present disclosure in the order of processes.
Figure 20B:
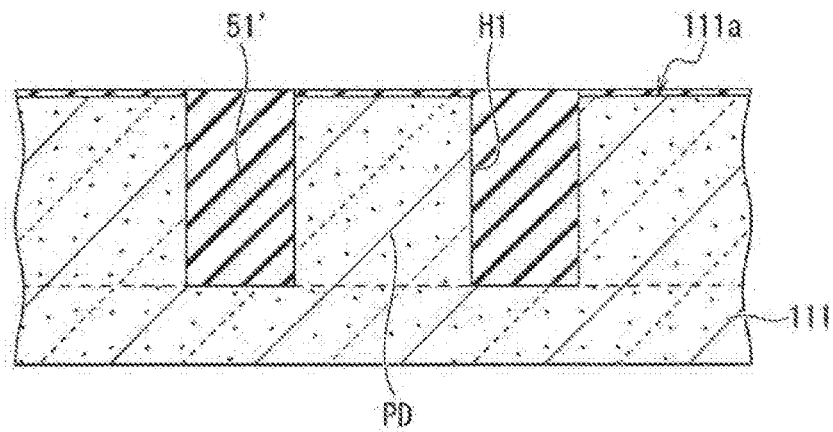
FIG. 20B is a cross-sectional view showing the method for manufacturing the imaging device according to the eighth embodiment of the present disclosure in the order of processes.

Next, a method for manufacturing the imaging device 100G shown in FIG. 19 will be described. FIGS. 20A, 20B, 20C, 20D, 20E, 20F, and 20G are cross-sectional views showing the method for manufacturing the imaging device 100G according to the eighth embodiment of the present disclosure in the order of processes. As shown in FIG. 20A, the manufacturing device forms the insulating film 11 on the light receiving surface 111a of the semiconductor substrate 111 on which the photodiode PD is formed. Next, the manufacturing device etches the insulating film 11 and the semiconductor substrate 111 to form a trench H1. The trench H1 is formed between one photodiode PD1 and another photodiode PD which are adjacent to each other. Next, as shown in FIG. 20B, the manufacturing device forms an insulating layer 51' on the light receiving surface 111a side of the semiconductor substrate 111 to fill the trench H1. For example, the insulating layer 51' is a silicon oxide film (SiO2), and a forming method thereof is a CVD method. Next, the manufacturing device performs a CMP treatment to a surface of the insulating layer 51' to flatten the surface of the insulating layer 51'.

Figure 20C:
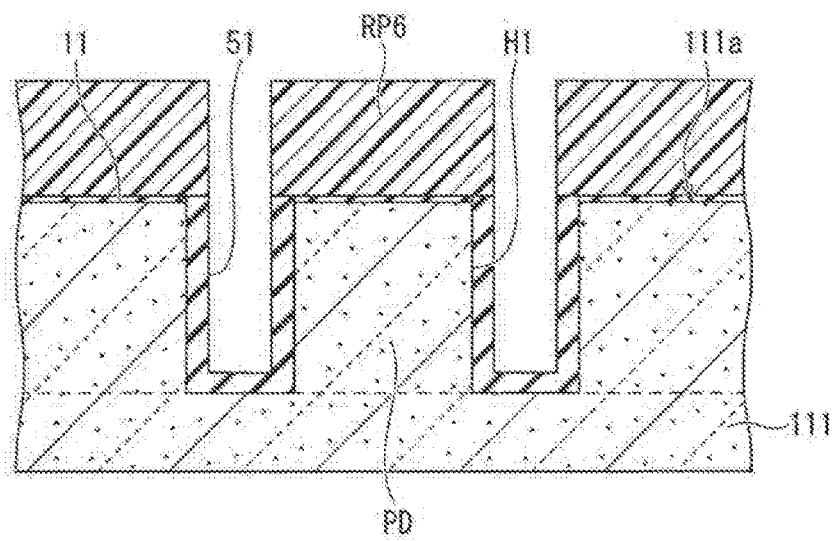
FIG. 20C is a cross-sectional view showing the method for manufacturing the imaging device according to the eighth embodiment of the present disclosure in the order of processes.

Next, as shown in FIG. 20C, the manufacturing device forms a resist pattern RP6 on the insulating layer 51'. The resist pattern RP6 has a shape that opens a region in which the second metal layer 50 (see FIG. 19) is formed and a region in which the second insulating layer 52 (see FIG. 19) is formed in the trench isolation 5 and covers other regions. Next, the manufacturing device dry-etches the insulating layer 51' using the resist pattern RP6 as a mask. Thus, as shown in FIG. 20C, the first insulating layer 51 disposed in the trench H1 is formed. After the first insulating layer 51 has been formed, the manufacturing device removes the resist pattern RP6.

Figure 20D:
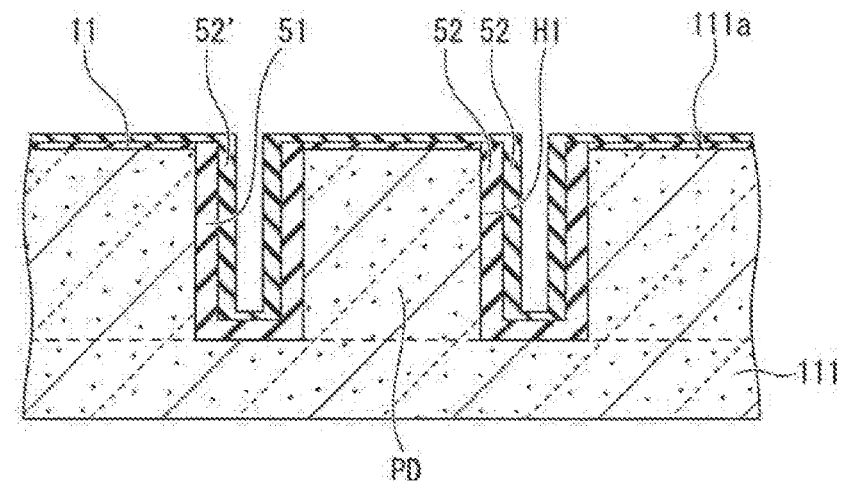
FIG. 20D is a cross-sectional view showing the method for manufacturing the imaging device according to the eighth embodiment of the present disclosure in the order of processes.

Next, as shown in FIG. 20D, the manufacturing device forms an insulating layer 52' above the light receiving surface 111a. For example, the insulating layer 52' is a silicon carbide film (a-SiC) having an amorphous crystal structure, and a forming method thereof is a CVD method. Next, the manufacturing device partially dry-etches the insulating layer 52' and removes the insulating layer 52' from regions other than the trench H1. The insulating layer 52' remaining in the trench H1 becomes the second insulating layer 52. Also, in the present embodiment, dry etching of the insulating layer 52' may be omitted. In this case, the entire semiconductor substrate 111 on the light receiving surface 111a side has a structure in which it is covered with the insulating layer 52' (that is, the second insulating layer 52).

Figure 20E:
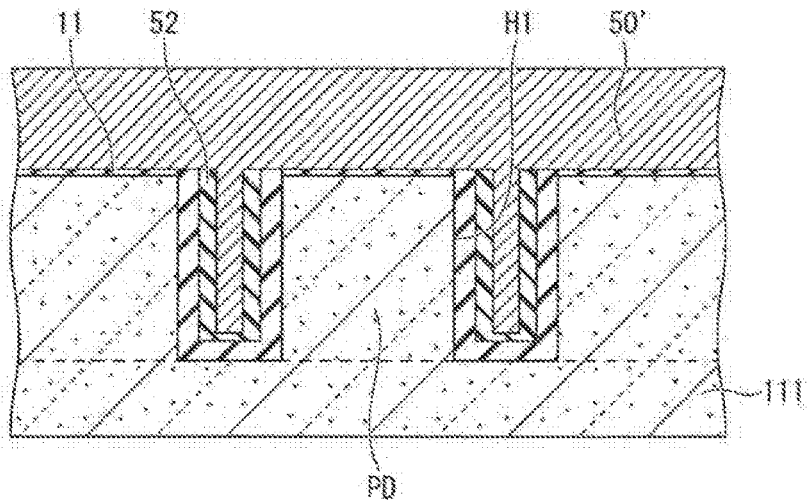
FIG. 20E is a cross-sectional view showing the method for manufacturing the imaging device according to the eighth embodiment of the present disclosure in the order of processes.

Next, as shown in FIG. 20E, the manufacturing device forms a metal layer 50' on the light receiving surface 111a side. For example, the metal layer 50' is a thin film of copper (Cu) or tungsten (W), and a forming method thereof is a vapor deposition or sputtering method. The trench H1 has a structure in which it is filled with the first insulating layer 51, the second insulating layer 52, and the metal layer 50'.

Figure 20F:
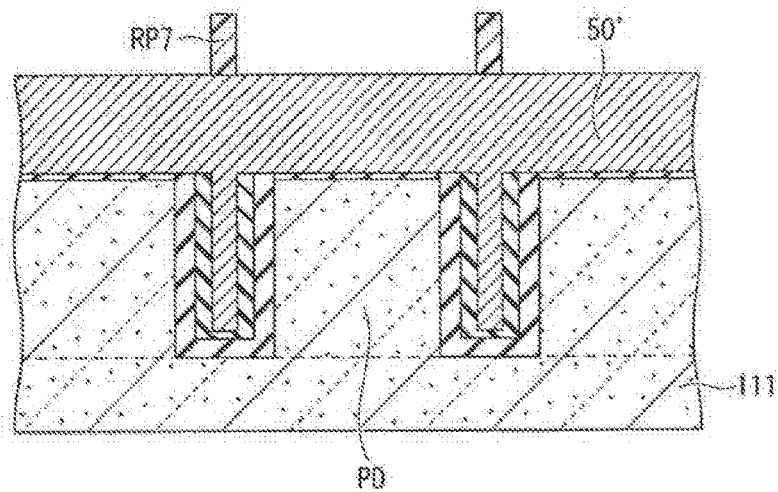
FIG. 20F is a cross-sectional view showing the method for manufacturing the imaging device according to the eighth embodiment of the present disclosure in the order of processes.
Figure 20G:
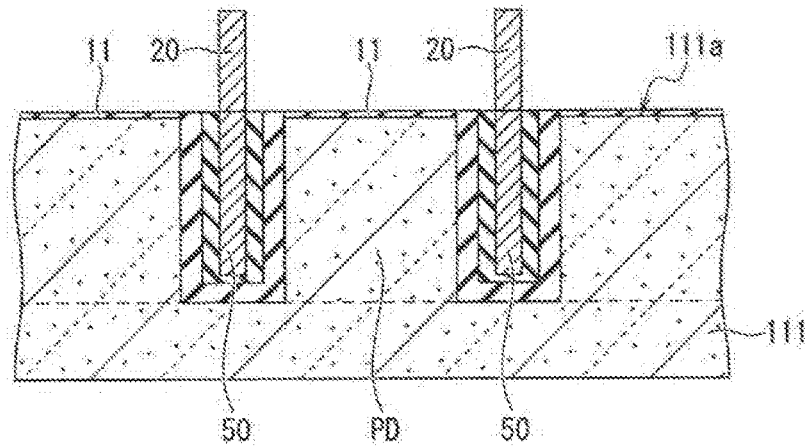
FIG. 20G is a cross-sectional view showing the method for manufacturing the imaging device according to the eighth embodiment of the present disclosure in the order of processes.

Next, as shown in FIG. 20F, the manufacturing device forms a resist pattern RP7 on the metal layer 50'. The resist pattern RP7 has a shape that covers a region serving as the first metal layer 20 (see FIG. 2) and exposes other regions. Next, the manufacturing device dry-etches the metal layer 50' using the resist pattern RP7 as a mask. Thus, as shown in FIG. 20G, the first metal layer 20 and the second metal layer 50 are formed from the metal layer 50'. By forming the second metal layer 50, the trench isolation 5 is finally formed. After that, the manufacturing device removes the resist pattern RP7.

The subsequent processes are, for example, the same as those in the method for manufacturing the imaging device 100 described in the first embodiment. Through the processes shown in FIGS. 4E, 4F, 4G, 4H, 4I, 4J, and 4K, the imaging device 100G shown in FIG. 19 is finally formed.

Ninth Embodiment

In the embodiments of the present disclosure, a light-shielding film may be disposed between the second metal layer 50 of the trench isolation 5 and the first metal layer 20 of the partition wall 2. Also, this light-shielding film may be made of a metal.

Figure 21:
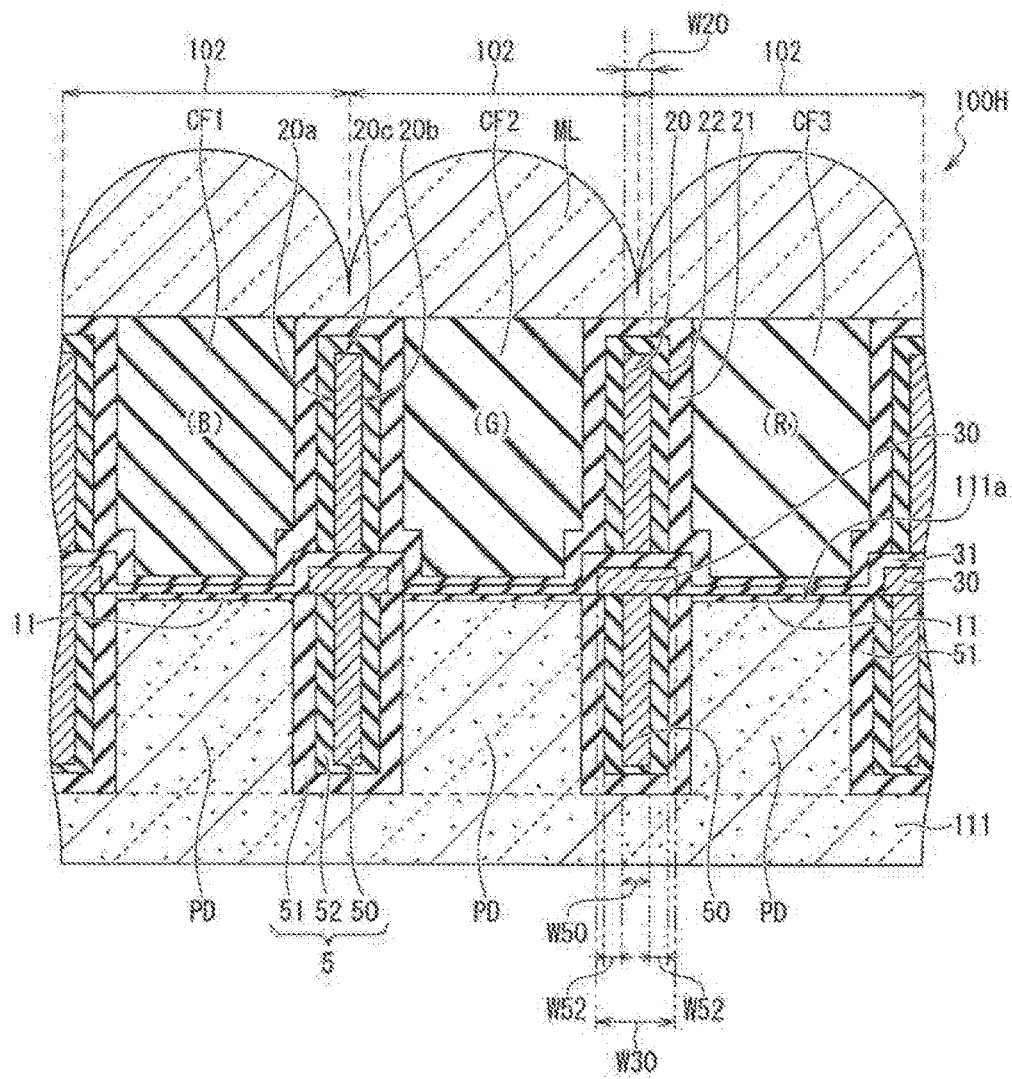
FIG. 21 is a cross-sectional view showing a configuration example of a partition wall and a peripheral portion thereof in an imaging device according to a ninth embodiment of the present disclosure.

FIG. 21 is a cross-sectional view showing a configuration example of a partition wall 2 and a peripheral portion thereof in an imaging device 100H according to a ninth embodiment of the present disclosure. As shown in FIG. 21, in the imaging device 100H, the metal light-shielding film 30 and the insulating film 31 that cover the upper surface and side surfaces of the metal light-shielding film 30 are provided between the second metal layer 50 of the trench isolation 5 and the first metal layer 20 of the partition wall 2. The metal light-shielding film 30 and the insulating film 31 are laminated in order from the trench isolation 5 side to the partition wall 2 side. The metal light-shielding film 30 prevents light trapped in the second partition wall layer 22 of the partition wall 2 from entering the trench isolation 5.

For example, the width W30 of the metal light-shielding film 30 is larger than the width W50 of the second metal layer 50 (W30>W50). Further, the width W30 of the metal light-shielding film 30 preferably has a size equal to or larger than a value obtained by adding the width W50 of the second metal layer 50, a thickness W52 of a portion of the second insulating layer 52 that covers one side surface of the second metal layer 50, and a thickness W52 of a portion of the second insulating layer 52 that covers another side surface of the second metal layer 50 (W30≥W50+W52×2). Thus, the metal light-shielding film 30 can cover the second metal layer 50 and the second insulating layer 52. The metal light-shielding film 30 can prevent light from entering the second metal layer 50 and the second insulating layer 52 from the second partition wall layer 22.

Figure 22A:
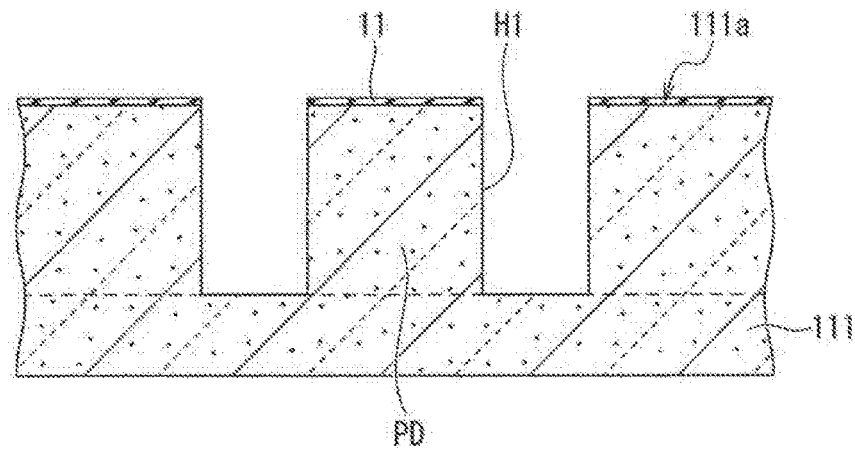
FIG. 22A is a cross-sectional view showing a method for manufacturing the imaging device according to the ninth embodiment of the present disclosure in the order of processes.
Figure 22B:
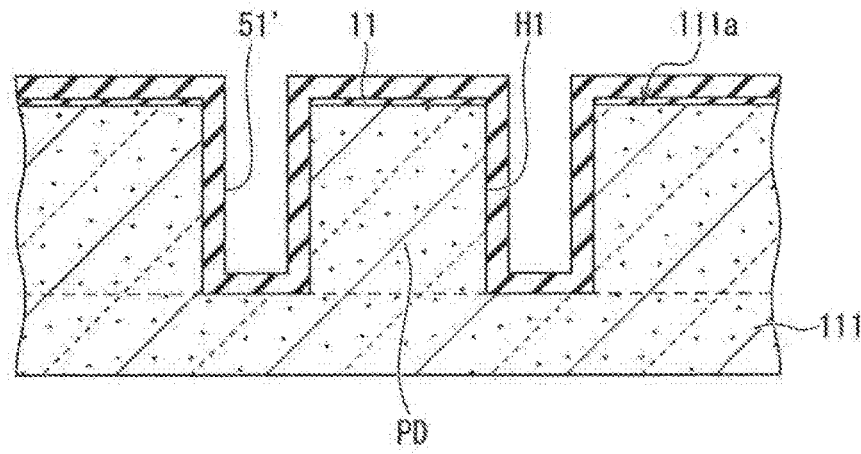
FIG. 22B is a cross-sectional view showing the method for manufacturing the imaging device according to the ninth embodiment of the present disclosure in the order of processes.

Next, a method for manufacturing the imaging device 100H shown in FIG. 21 will be described. FIGS. 22A, 22B, 22C, 22D, 22E, 22F, 22G, 22H, 22I, 22J, 22K, and 22L are cross-sectional views showing the method for manufacturing the imaging device 100H according to the ninth embodiment of the present disclosure in the order of processes. In FIG. 22A, processes up to the process of forming the trench H1 are the same as those in the method for manufacturing the imaging device 100G described in the eighth embodiment. After the trench H1 has been formed, as shown in FIG. 22B, the manufacturing device forms the insulating layer 51' on the insulating film 11. For example, the insulating layer 51' is a silicon oxide film (SiO2), and a forming method thereof is a CVD method.

Figure 22C:
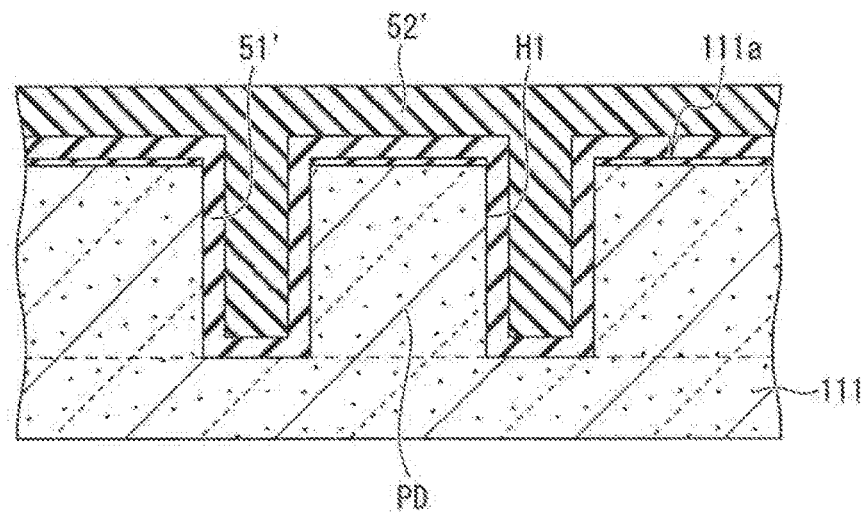
FIG. 22C is a cross-sectional view showing the method for manufacturing the imaging device according to the ninth embodiment of the present disclosure in the order of processes.
Figure 22D:
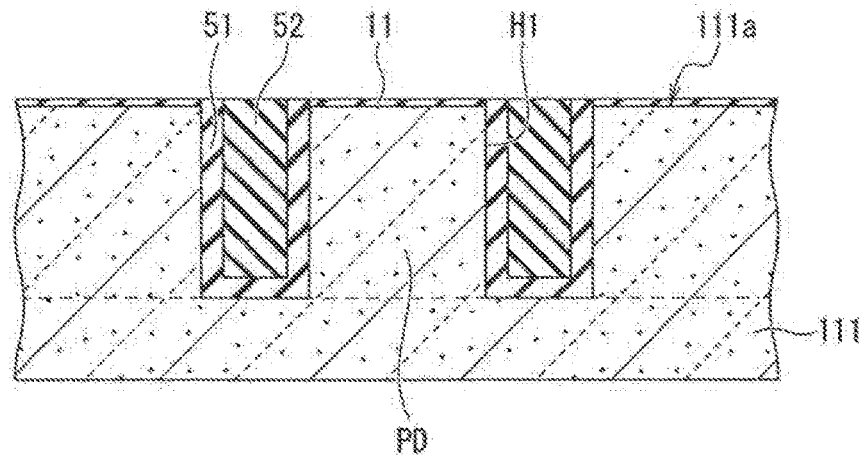
FIG. 22D is a cross-sectional view showing the method for manufacturing the imaging device according to the ninth embodiment of the present disclosure in the order of processes.

Next, as shown in FIG. 22C, the manufacturing device forms the insulating layer 52' on the insulating layer 51' to fill the trench H1. For example, the insulating layer 52' is a silicon carbide film (a-SiC) having an amorphous crystal structure, and a forming method thereof is a CVD method. Next, as shown in FIG. 22D, the manufacturing device performs a CMP treatment to the surface of the insulating layer 52' to remove the insulating layer 52' from the regions other than the trench H1. Further, the manufacturing device also performs a CMP treatment to the surface of the insulating layer 51' exposed from below the insulating layer 52' to remove the insulating layer 51' from the regions other than the trench H1. Thus, the first insulating layer 51 disposed in the trench H1 is formed. Also, in the present embodiment, the CMP treatment for the insulating layer 51' may be omitted. In this case, the entire semiconductor substrate 111 on the light receiving surface 111a side has a structure in which it is covered with the insulating layer 51' (that is, the first insulating layer 51).

Figure 22E:
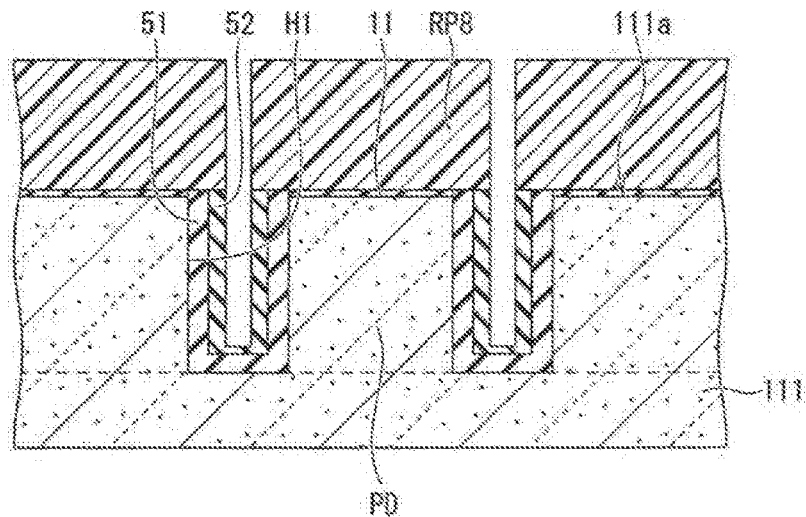
FIG. 22E is a cross-sectional view showing the method for manufacturing the imaging device according to the ninth embodiment of the present disclosure in the order of processes.

Next, as shown in FIG. 22E, the manufacturing device forms a resist pattern RP8 on the light receiving surface 111a side of the semiconductor substrate 111. The resist pattern RP8 has a shape that opens a region of the trench isolation 5 in which the second metal layer 50 (see FIG. 21) is formed and covers other regions. Next, the manufacturing device dry-etches the insulating layer 52' using the resist pattern RP8 as a mask. Thus, the second insulating layer 52 disposed in the trench H1 is formed. After the second insulating layer 52 has been formed, the manufacturing device removes the resist pattern RP8.

Figure 22F:
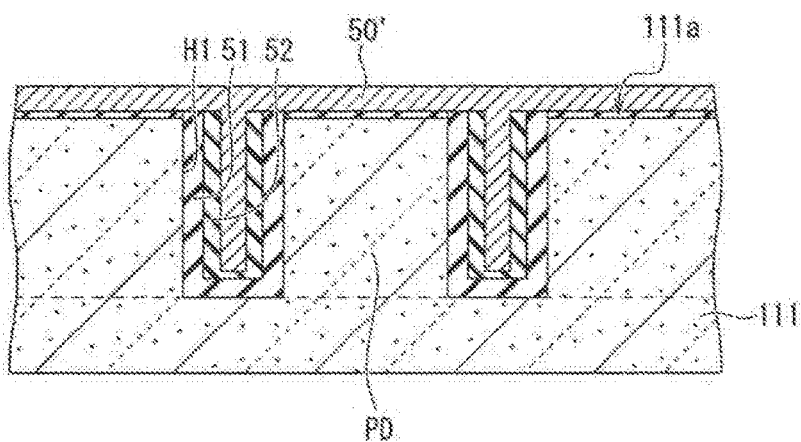
FIG. 22F is a cross-sectional view showing the method for manufacturing the imaging device according to the ninth embodiment of the present disclosure in the order of processes.
Figure 22G:
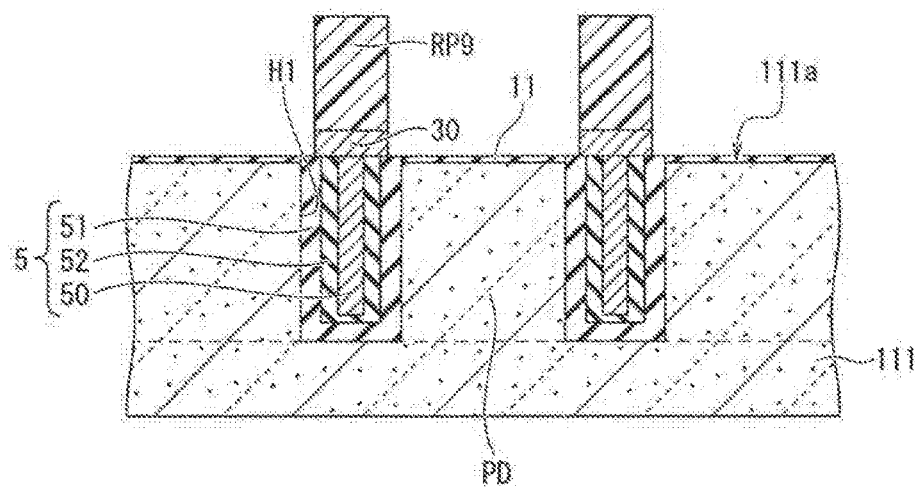
FIG. 22G is a cross-sectional view showing the method for manufacturing the imaging device according to the ninth embodiment of the present disclosure in the order of processes.

Next, as shown in FIG. 22F, the manufacturing device forms the metal layer 50' on the light receiving surface 111a side. For example, the metal layer 50' is a thin film of copper (Cu) or tungsten (W), and a forming method thereof is a vapor deposition or sputtering method. The trench H1 has a structure in which it is filled with the first insulating layer 51, the second insulating layer 52, and the metal layer 50'.

Next, as shown in FIG. 20G, the manufacturing device forms a resist pattern RP9 on the metal layer 50'. The resist pattern RP9 has a shape that covers the region serving as the metal light-shielding film 30 (see FIG. 21) and exposes other regions. Next, the manufacturing device dry-etches the metal layer 50' using the resist pattern RP8 as a mask. Thus, the second metal layer 50 of the trench isolation 5 and the metal light-shielding film 30 are formed from the metal layer 50'. By forming the second metal layer 50, the trench isolation 5 is finally formed. After that, the manufacturing device removes the resist pattern RP9.

Figure 22H:
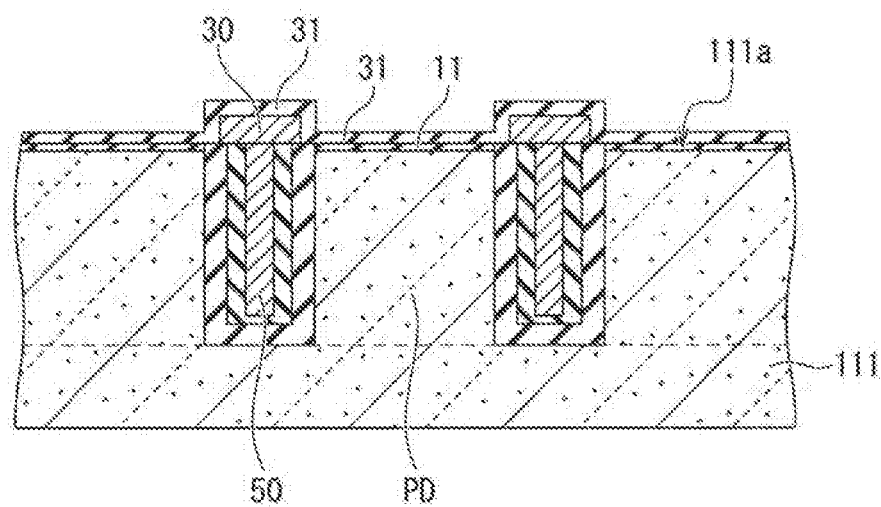
FIG. 22H is a cross-sectional view showing the method for manufacturing the imaging device according to the ninth embodiment of the present disclosure in the order of processes.
Figure 22I:
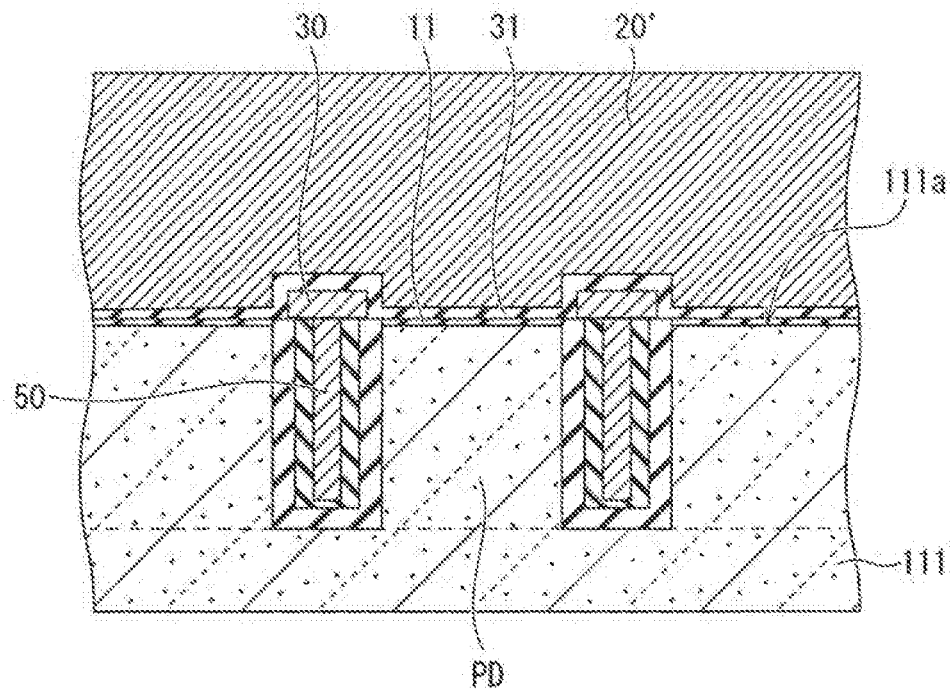
FIG. 22I is a cross-sectional view showing the method for manufacturing the imaging device according to the ninth embodiment of the present disclosure in the order of processes.
Figure 22J:
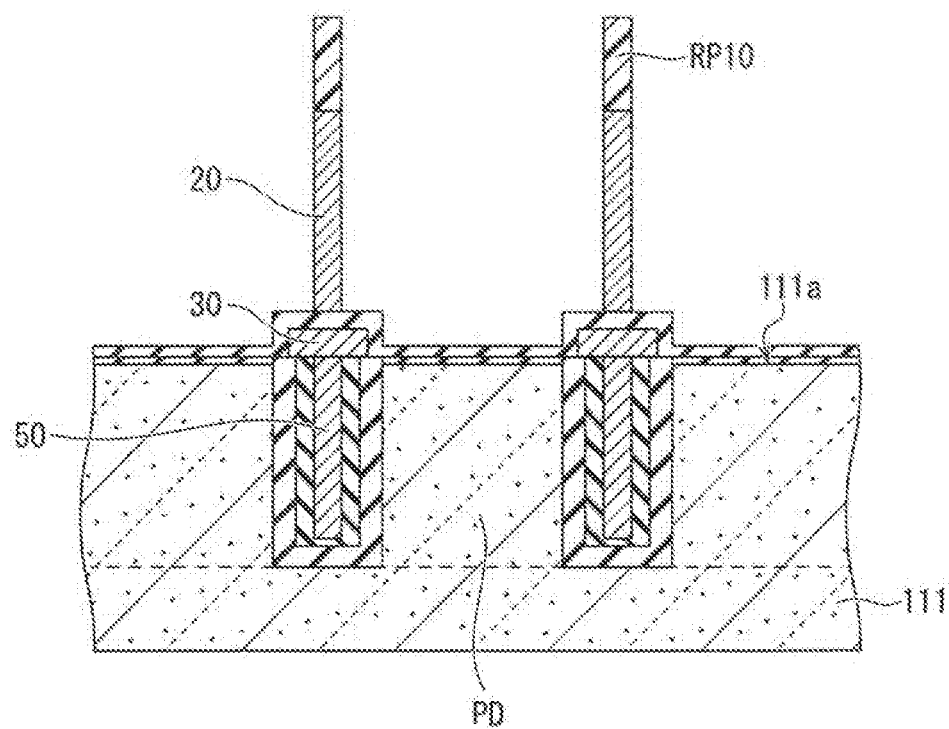
FIG. 22J is a cross-sectional view showing the method for manufacturing the imaging device according to the ninth embodiment of the present disclosure in the order of processes.

Next, as shown in FIG. 22H, the manufacturing device forms the insulating film 31 on the light receiving surface 111a side of the semiconductor substrate 111 to cover the metal light-shielding film 30. The method for forming the insulating film 31 is, for example, a CVD method. Next, as shown in FIG. 22I, the manufacturing device forms the metal layer 20' on the light receiving surface 111a side. The method for forming the metal layer 20' is, for example, a vapor deposition or sputtering method. Next, as shown in FIG. 22J, the manufacturing device forms a resist pattern RP10 on the metal layer 20'. The resist pattern RP10 has a shape that covers the region serving as the first metal layer 20 (see FIG. 21) and exposes other regions. Next, the manufacturing device dry-etches the metal layer 20' using the resist pattern RP10 as a mask. Thus, the first metal layer 20 is formed from the metal layer 20'. After that, the manufacturing device removes the resist pattern RP10.

Figure 22K:
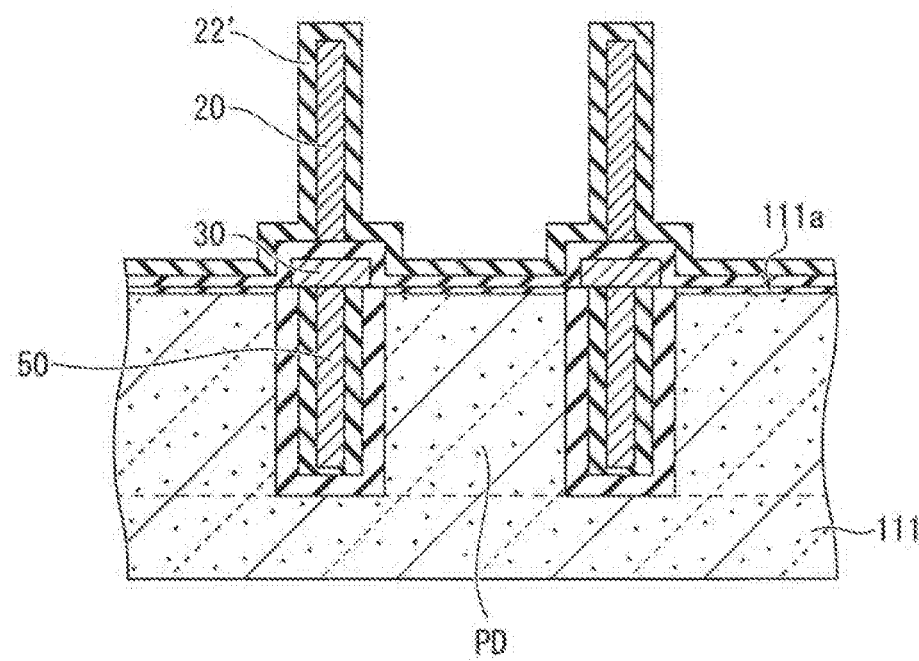
FIG. 22K is a cross-sectional view showing the method for manufacturing the imaging device according to the ninth embodiment of the present disclosure in the order of processes.
Figure 22L:
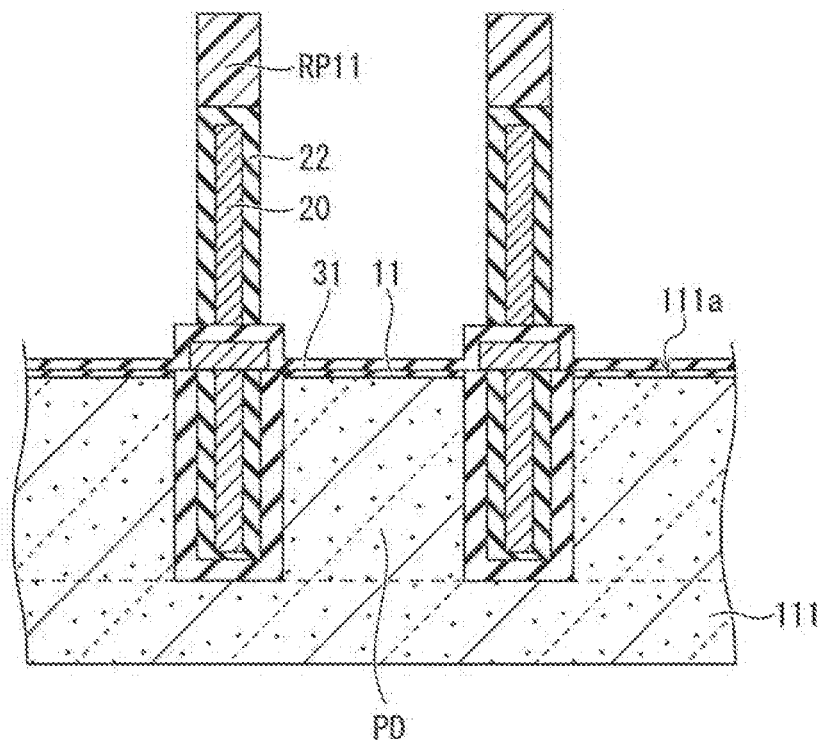
FIG. 22L is a cross-sectional view showing the method for manufacturing the imaging device according to the ninth embodiment of the present disclosure in the order of processes.

Next, as shown in FIG. 22K, the manufacturing device forms the insulating layer 22' above the light receiving surface 111a. For example, the insulating layer 22' is a silicon carbide film (a-SiC) having an amorphous crystal structure, and a forming method thereof is a CVD method. Next, as shown in FIG. 22L, the manufacturing device forms a resist pattern RP11 on the insulating layer 22'. The resist pattern RP11 has a shape that covers the regions serving as the first metal layer 20 and the second partition wall layer 22 (see FIG. 21) and exposes other regions. Next, the manufacturing device dry-etches the insulating layer 22' using the resist pattern RP10 as a mask. Thus, the second partition wall layer 22 is formed from the insulating layer 22'. After that, the manufacturing device removes the resist pattern RP10.

The subsequent processes are, for example, the same as those in the method for manufacturing the imaging device 100 described in the first embodiment. Through the processes shown in FIGS. 4H, 4I, 4J, and 4K, the imaging device 100H shown in FIG. 21 is finally formed.

Other Embodiments

While the present disclosure has been described on the basis of the embodiments and modified examples as described above, the descriptions and figures that constitute parts of the disclosure are not intended to be understood as limiting the present disclosure. Various alternative embodiments, examples, and operable techniques will be apparent to those skilled in the art from this disclosure. It goes without saying that the technique according to the present disclosure (the present technique) includes various embodiments and the like that have not been described herein. At least one of various omissions, substitutions, and modifications of constituent elements may be performed without departing from the gist of the embodiments described above. Further, the effects described in the present specification are merely exemplary and not intended as limiting, and other effects may be provided.

<Example of Application to Electronic Device>

For example, the technique according to the present disclosure (the present technique) can be applied to various electronic devices such as an imaging system such as a digital still camera, a digital video camera, or the like (hereinafter collectively referred to as a camera), a mobile device such as a mobile phone having an imaging function, or other devices having an imaging function.

Figure 23:
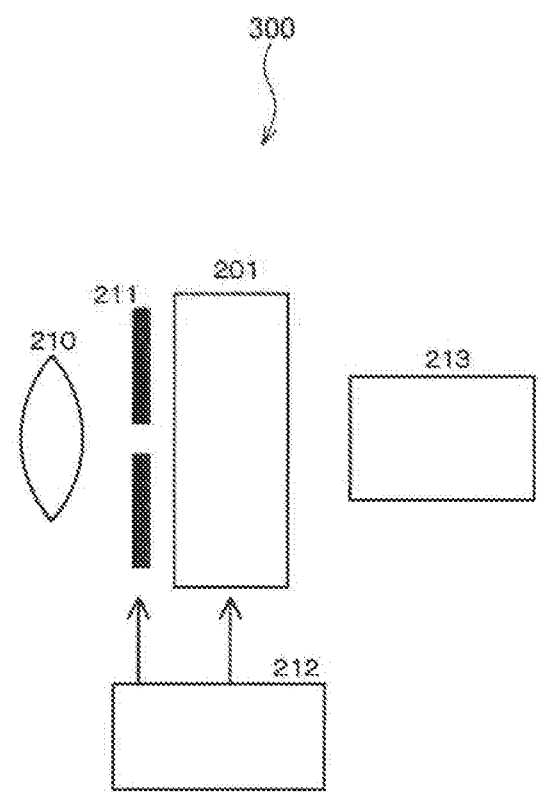
FIG. 23 is a conceptual diagram showing an example in which the technique according to the present disclosure (the present technique) is applied to an electronic device.

FIG. 23 is a conceptual diagram showing an example in which the technique according to the present disclosure (the present technique) is applied to an electronic device 300. As shown in FIG. 23, the electronic device 300 is, for example, a camera and has a solid-state imaging device 201, an optical lens 210, a shutter device 211, a drive circuit 212, and a signal processing circuit 213. The optical lens 210 is an example of the "optical component" of the present disclosure.

Light transmitted through the optical lens 210 is incident on the solid-state imaging device 201. For example, the optical lens 210 forms an image of image light (incident light) from a subject on an imaging surface of the solid-state imaging device 201. Thus, signal charges are accumulated in the solid-state imaging device 201 for a certain period of time. The shutter device 211 controls a light irradiation period and a light blocking period for the solid-state imaging device 201. The drive circuit 212 supplies a drive signal for controlling a transfer operation or the like of the solid-state imaging device 201 and a shutter operation of the shutter device 211. Signal transfer of the solid-state imaging device 201 is performed by the drive signal (timing signal) supplied from the drive circuit 212. The signal processing circuit 213 performs various signal processing. For example, the signal processing circuit 213 processes a signal output from the solid-state imaging device 201. A video signal that has undergone signal processing is stored in a storage medium such as a memory, or is output to a monitor.

Also, the shutter operation in the electronic device 300 may be realized by an electronic shutter (for example, a global shutter) operated by the solid-state imaging device 201 instead of a mechanical shutter. In a case in which the shutter operation in the electronic device 300 is realized by the electronic shutter, the shutter device 211 in FIG. 23 may be omitted.

In the electronic device 300, any one or more of the above-described imaging devices 100, 100A, 100B, 100C, 100D, 100E, 100F, 100G, and 100H is applied to the solid-state imaging device 201. Thus, it is possible to obtain the electronic device 300 with improved performance. Also, the electronic device 300 is not limited to the camera. The electronic device 300 may be a mobile device such as a mobile phone having an imaging function, or other devices having an imaging function.

<Example of Application to Endoscopic Operation System>

The technique according to the present disclosure (the present technique) can be applied to various products. For example, the technique according to the present disclosure may be applied to an endoscopic operation system.

Figure 24:
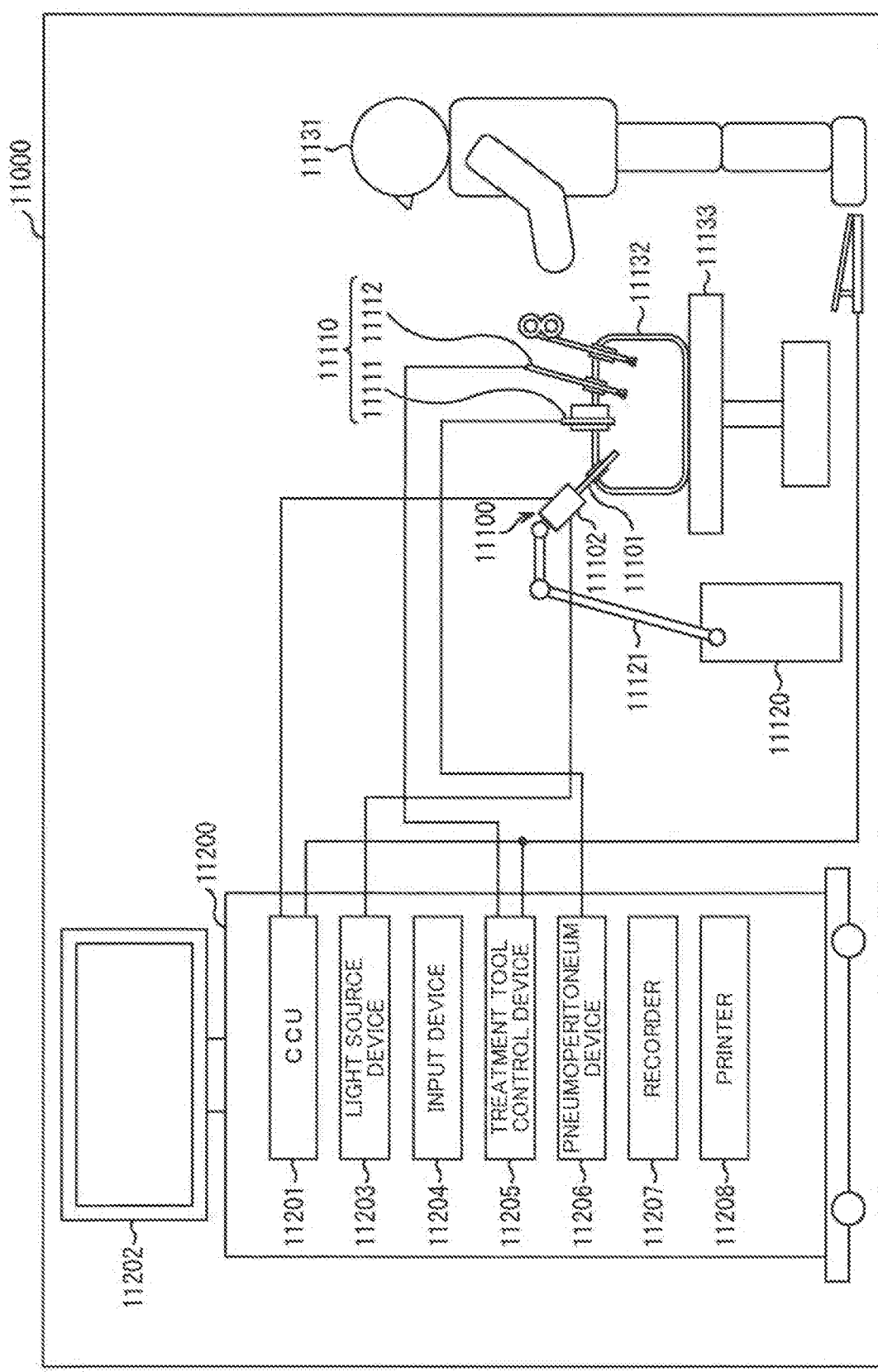
FIG. 24 is a diagram showing an example of a schematic configuration of an endoscopic surgery system to which the technique according to the present disclosure (the present technique) may be applied.

FIG. 24 is a diagram showing an example of a schematic configuration of an endoscopic operation system to which the technique according to the present disclosure (the present technique) may be applied.

FIG. 24 shows a situation in which an operator (doctor) 11131 is performing an operation on a patient 11132 on a patient bed 11133 using the endoscopic operation system 11000. As illustrated, the endoscopic operation system 11000 is configured of an endoscope 11100, other surgical instruments 11110 such as a pneumoperitoneum tube 11111 and an energized treatment tool 11112, a support arm device 11120 that supports the endoscope 11100, and a cart 11200 equipped with various devices for endoscopic operations.

The endoscope 11100 is configured of a lens barrel 11101, a region of which having a predetermined length from a tip is inserted into a body cavity of the patient 11132, and a camera head 11102 connected to a base end of the lens barrel 11101. Although the endoscope 11100 configured as a so-called rigid mirror having the rigid lens barrel 11101 is illustrated in the illustrated example, the endoscope 11100 may be configured as a so-called flexible mirror having a flexible lens barrel.

An opening portion into which an objective lens is fitted is provided at the tip of the lens barrel 11101. A light source device 11203 is connected to the endoscope 11100, and light generated by the light source device 11203 is guided to the tip of the lens barrel by a light guide provided to extend inside the lens barrel 11101 and is radiated toward an observation target in the body cavity of the patient 11132 via the objective lens. Also, the endoscope 11100 may be a forward-viewing endoscope, a perspective-viewing endoscope, or a side-viewing endoscope.

An optical system and an imaging element are provided inside the camera head 11102, and the reflected light (observation light) from the observation target is condensed on the imaging element by the optical system. The observation light is photoelectrically converted by the imaging element, and an electrical signal corresponding to the observation light, that is, an image signal corresponding to an observed image is generated. The image signal is transmitted as RAW data to a camera control unit (CCU) 11201.

The CCU 11201 is configured of a central processing unit (CPU), a graphics processing unit (GPU) or the like, and comprehensively controls operations of the endoscope 11100 and a display device 11202. Further, the CCU 11201 receives the image signal from the camera head 11102 and performs various types of image processing for displaying an image based on the image signal, for example, development processing (demosaic processing) and the like, on the image signal.

The display device 11202 displays the image based on the image signal that has been subjected to image processing by the CCU 11201 under the control of the CCU 11201.

The light source device 11203 is configured of, for example, a light source such as a light emitting diode (LED) and supplies irradiation light, which is used when a surgical part or the like is imaged, to the endoscope 11100.

An input device 11204 is an input interface for the endoscopic operation system 11000. A user can input various types of information or instructions to the endoscopic operation system 11000 via the input device 11204. For example, the user inputs an instruction to change imaging conditions (a type of irradiation light, a magnification, a focal length, or the like) of the endoscope 11100, or the like.

A treatment tool control device 11205 controls driving of the energized treatment tool 11112 for cauterizing or incising tissue, sealing a blood vessel, or the like. A pneumoperitoneum device 11206 sends a gas into the body cavity through a pneumoperitoneum tube 11111 in order to inflate the body cavity of the patient 11132 for the purpose of securing a visual field for the endoscope 11100 and a working space for the operator. A recorder 11207 is a device capable of recording various information regarding the operation. A printer 11208 is a device that can print various types of information regarding the operation in various formats such as text, images, or graphs.

In addition, the light source device 11203 that supplies the endoscope 11100 with the irradiation light used when the surgical part is imaged can be configured of, for example, an LED, a laser light source, or a white light source configured of a combination thereof. In a case in which a white light source is configured by a combination of RGB laser light sources, it is possible to control an output intensity and an output timing of each color (each wavelength) with high accuracy, and thus white balance of captured images can be adjusted in the light source device 11203. Further, in this case, laser light from each of the respective RGB laser light sources is radiated to the observation target in a time-division manner, and driving of the imaging element of the camera head 11102 is controlled in synchronization with a radiation timing, so that it is also possible to capture images corresponding to each of RGB in a time-division manner. According to this method, it is possible to obtain a color image without providing a color filter to the imaging element.

Further, the driving of the light source device 11203 may be controlled to change intensity of the output light at predetermined time intervals. By controlling the driving of the imaging element of the camera head 11102 in synchronization with a timing of changing the intensity of the light to acquire images in a time-division manner and combine the images, it is possible to generate a high dynamic range image without so-called blackout and whiteout.

Further, the light source device 11203 may be configured to be able to supply light having a predetermined wavelength band corresponding to special light observation. In the special light observation, for example, by emitting light in a narrower band than irradiation light (that is, white light) during normal observation using wavelength dependence of light absorption in a body tissue, so-called narrow band light observation (narrow band imaging) in which a predetermined tissue such as a blood vessel in the mucous membrane surface layer is imaged with a high contrast is performed. Alternatively, in the special light observation, fluorescence observation in which an image is obtained by fluorescence generated by emitting excitation light may be performed. The fluorescence observation can be performed by emitting excitation light to a body tissue and observing fluorescence from the body tissue (autofluorescence observation), or locally injecting a reagent such as indocyanine green (ICG) to a body tissue and emitting excitation light corresponding to a fluorescence wavelength of the reagent to the body tissue to obtain a fluorescence image. The light source device 11203 may be configured to be able to supply narrow band light and/or excitation light corresponding to such special light observation.

Figure 25:
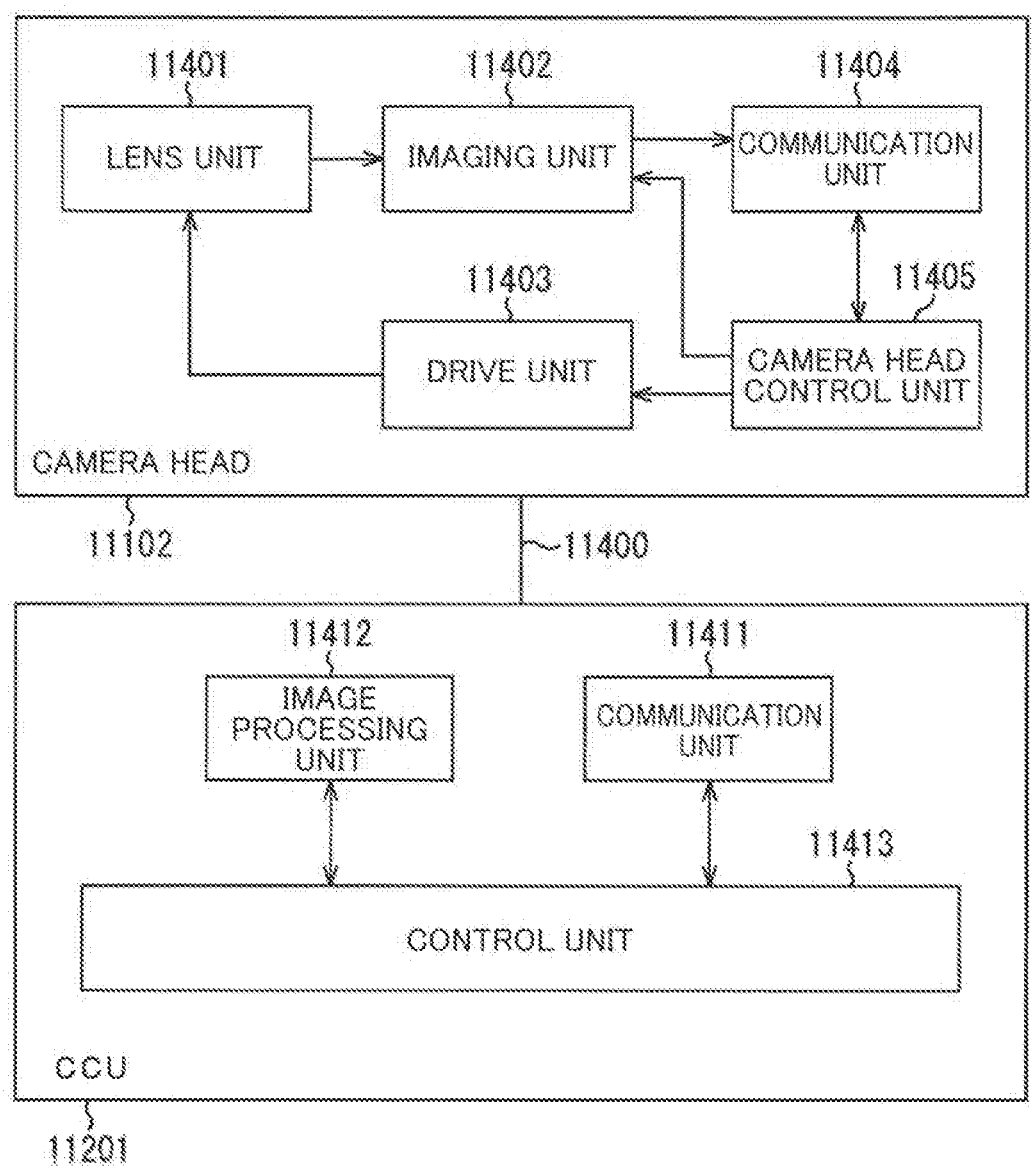
FIG. 25 is a block diagram showing an example of a functional configuration of a camera head and a CCU shown in FIG. 24.

FIG. 25 is a block diagram illustrating an example of a functional configuration of the camera head 11102 and CCU 11201 shown in FIG. 24.

The camera head 11102 has a lens unit 11401, an imaging unit 11402, a driving unit 11403, a communication unit 11404, and a camera head control unit 11405. The CCU 11201 has a communication unit 11411, an image processing unit 11412, and a control unit 11413. The camera head 11102 and the CCU 11201 are connected to each other via a transmission cable 11400 so that they can communicate with each other.

The lens unit 11401 is an optical system provided at a portion for connection to the lens barrel 11101. The observation light taken in from the tip of the lens barrel 11101 is guided to the camera head 11102 and incident on the lens unit 11401. The lens unit 11401 is configured of a combination of a plurality of lenses including a zoom lens and a focus lens.

The imaging unit 11402 is configured of an imaging element. The imaging element constituting the imaging unit 11402 may be one element (so-called single plate type) or a plurality of elements (so-called multi-plate type). In a case in which the imaging unit 11402 is configured of a multi-plate type, for example, image signals corresponding to RGBs may be generated by imaging elements and combined with each other, so that a color image may be obtained. Alternatively, the imaging unit 11402 may be configured to have a pair of imaging elements for acquiring image signals for the right eye and the left eye corresponding to three-dimensional (3D) display. By performing the 3D display, the operator 11131 will be able to determine a depth of biological tissue in the surgical part more accurately. In addition, in a case in which the imaging unit 11402 is configured as a multi-plate type, a plurality of lens units 11401 may be provided to correspond to the imaging elements.

Further, the imaging unit 11402 may not necessarily be provided in the camera head 11102. For example, the imaging unit 11402 may be provided immediately after the objective lens inside the lens barrel 11101.

The driving unit 11403 is configured of an actuator and moves the zoom lens and the focus lens of the lens unit 11401 by a predetermined distance along an optical axis under the control of the camera head control unit 11405. Thus, the magnification and focus of the image captured by the imaging unit 11402 can be adjusted appropriately.

The communication unit 11404 is configured of a communication device for transmitting or receiving various information to or from the CCU 11201. The communication unit 11404 transmits an image signal obtained from the imaging unit 11402 to the CCU 11201 through the transmission cable 11400 as RAW data.

Further, the communication unit 11404 receives a control signal for controlling the driving of the camera head 11102 from the CCU 11201 and supplies the control signal to the camera head control unit 11405. The control signal includes, for example, information on imaging conditions such as information for designating a frame rate of a captured image, information for designating an exposure value at the time of imaging, and/or information for designating a magnification and a focus of the captured image.

Also, the imaging conditions such as the frame rate, the exposure value, the magnification, and the focus described above may be appropriately designated by the user or may be automatically set by the control unit 11413 of the CCU 11201 on the basis of the acquired image signal. In the latter case, a so-called auto exposure (AE) function, auto focus (AF) function and auto white balance (AWB) function are provided in the endoscope 11100.

The camera head control unit 11405 controls the driving of the camera head 11102 on the basis of the control signal from the CCU 11201 received via the communication unit 11404.

The communication unit 11411 is configured of a communication device for transmitting and receiving various types of information to and from the camera head 11102. The communication unit 11411 receives an image signal transmitted from the camera head 11102 via the transmission cable 11400.

In addition, the communication unit 11411 transmits a control signal for controlling the driving of the camera head 11102 to the camera head 11102. The image signal or the control signal can be transmitted through electric communication, optical communication, or the like.

The image processing unit 11412 performs various kinds of image processing on the image signal that is the RAW data transmitted from the camera head 11102.

The control unit 11413 performs various kinds of control regarding imaging of the surgical part or the like using the endoscope 11100 and display of a captured image obtained by imaging the surgical part or the like. For example, the control unit 11413 generates the control signal for controlling the driving of the camera head 11102.

Further, the control unit 11413 causes the display device 11202 to display the captured image obtained by imaging the surgical part or the like on the basis of the image signal that has been subjected to the image processing by the image processing unit 11412. In this case, the control unit 11413 may recognize various objects in the captured image using various image recognition techniques. For example, the control unit 11413 can recognize surgical tools such as forceps, specific biological parts, bleeding, mist when the energized treatment tool 11112 is used, and the like by detecting an edge shape, a color, and the like of an object included in the captured image. When the control unit 11413 causes the display device 11202 to display the captured image, it may cause various types of surgical support information to be superimposed and displayed with the image of the surgical part using the recognition result. The surgical support information is superimposed and displayed, and presented to the operator 11131, so that a burden on the operator 11131 can be reduced and the operator 11131 can surely proceed with the operation.

The transmission cable 11400 that connects the camera head 11102 to the CCU 11201 is an electrical signal cable compatible with communication of an electrical signal, an optical fiber compatible with optical communication, or a composite cable thereof.

Here, in the illustrated example, wired communication is performed using the transmission cable 11400, but the communication between the camera head 11102 and the CCU 11201 may be performed wirelessly.

An example of the endoscopic operation system to which the technique according to the present disclosure can be applied has been described above. The technique according to the present disclosure may be applied to, for example, the endoscope 11100, the imaging unit 11402 of the camera head 11102, the image processing unit 11412 of the CCU 11201, and the like among the configurations described above. Specifically, any one or more of the above-mentioned imaging devices 100, 100A, 100B, 100C, 100D, 100E, 100F, 100G, and 100H can be applied to the imaging unit 10402. By applying the technique according to the present disclosure to the endoscope 11100, the imaging unit 11402 of the camera head 11102, the image processing unit 11412 of the CCU 11201, and the like, a clearer image of the surgical part can be obtained, and thus the operator can surely confirm the surgical part. Further, by applying the technique according to the present disclosure to the endoscope 11100, the imaging unit 11402 of the camera head 11102, the image processing unit 11412 of the CCU 11201, and the like, an image of the surgical part can be obtained with lower latency, and thus it is possible to perform a treatment with the same feeling as when the operator is observing the surgical part by touch.

Also, the endoscopic operation system has been described as an example, but in addition thereto, the technique according to the present disclosure may be applied to, for example, a microscopic operation system.

<Example of Application to Mobile Object>

The technique according to the present disclosure (the present technique) can be applied in various products. For example, the technique according to the present disclosure may be realized as a device mounted in any type of mobile objects such as automobiles, electric vehicles, hybrid electric vehicles, motorbikes, bicycles, personal mobility, airplanes, drones, ships, and robots.

Figure 26:
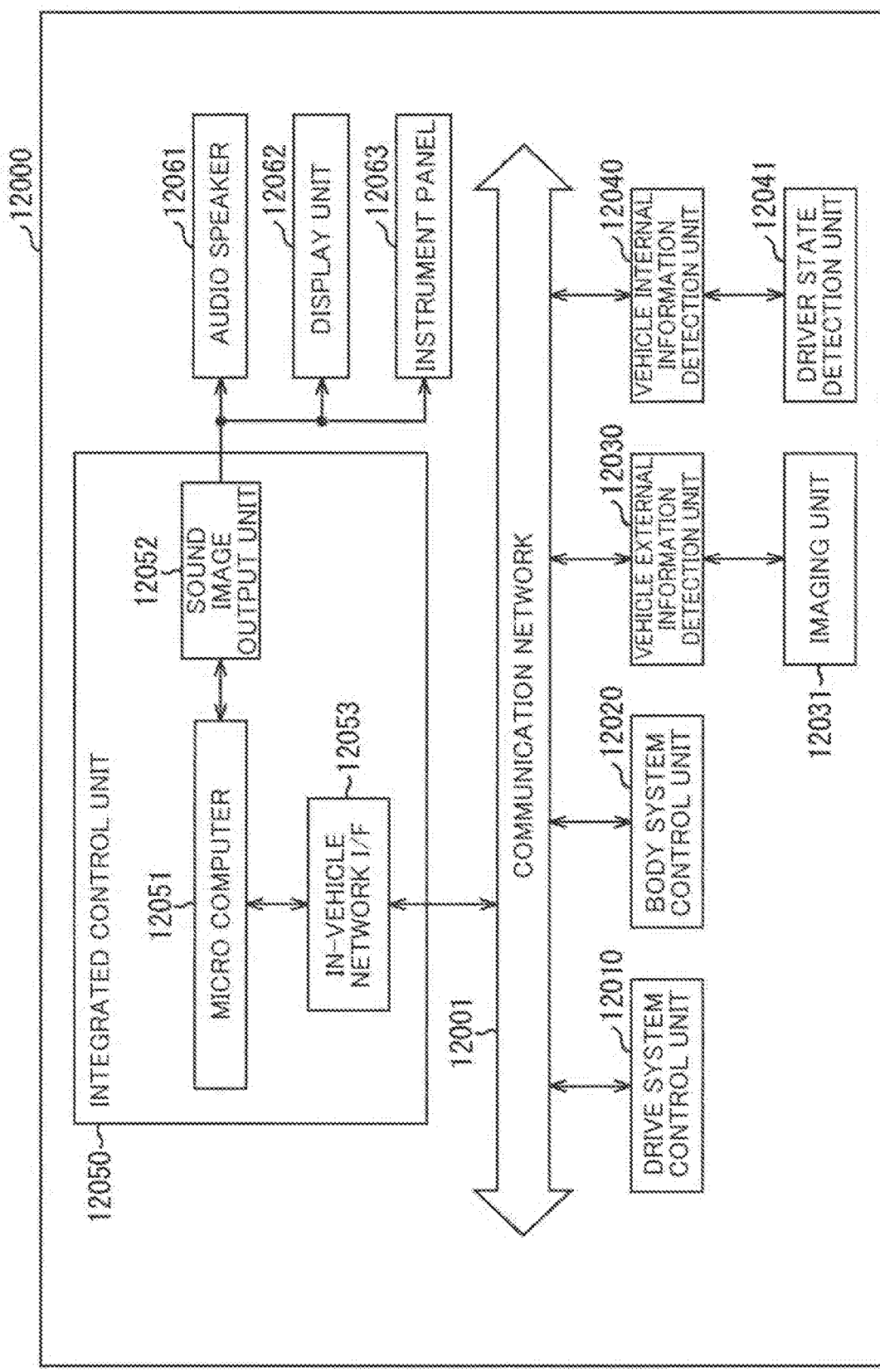
FIG. 26 is a block diagram showing a schematic configuration example of a mobile object control system that is an example of a vehicle control system to which the technique according to the present disclosure may be applied.

FIG. 26 is a block diagram showing a schematic configuration example of a vehicle control system that is an example of a mobile object control system to which the technique according to the present disclosure may be applied.

A vehicle control system 12000 includes a plurality of electronic control units connected to each other via a communication network 12001. In the example shown in FIG. 26, the vehicle control system 12000 includes a drive system control unit 12010, a body system control unit 12020, a vehicle external information detection unit 12030, a vehicle internal information detection unit 12040, and an integrated control unit 12050. In addition, as functional configurations of the integrated control unit 12050, a microcomputer 12051, a sound image output unit 12052, and an in-vehicle network interface (I/F) 12053 are shown.

The drive system control unit 12010 controls operations of devices related to the drive system of the vehicle in accordance with various programs. For example, the drive system control unit 12010 functions as a driving force generation device for generating a driving force of a vehicle such as an internal combustion engine or a driving motor, a driving force transmission mechanism for transmitting a driving force to wheels, a steering mechanism for adjusting a steering angle of a vehicle, and a control device such as a braking device that generates a braking force of a vehicle.

The body system control unit 12020 controls operations of various devices equipped in a vehicle body in accordance with various programs. For example, the body system control unit 12020 functions as a control device of a keyless entry system, a smart key system, a power window device, or various lamps such as a head lamp, a back lamp, a brake lamp, and a turn signal or fog lamp. In this case, radio waves transmitted from a portable device that substitutes for a key or signals of various switches may be input to the body system control unit 12020. The body system control unit 12020 receives inputs of these radio waves or signals and controls a door lock device, a power window device, a lamp, and the like of a vehicle.

The vehicle external information detection unit 12030 detects information outside the vehicle in which the vehicle control system 12000 is mounted. For example, an imaging unit 12031 is connected to the vehicle external information detection unit 12030. The vehicle external information detection unit 12030 causes the imaging unit 12031 to capture an image outside the vehicle and receives the captured image. The vehicle external information detection unit 12030 may perform object detection processing or distance detection processing for people, cars, obstacles, signs, and letters on a road on the basis of the received image.

The imaging unit 12031 is an optical sensor that receives light and outputs an electrical signal corresponding to an amount of the received light. The imaging unit 12031 can output the electrical signal as an image or as ranging information. In addition, the light received by the imaging unit 12031 may be visible light or invisible light such as infrared rays.

The vehicle internal information detection unit 12040 detects information inside the vehicle. For example, a driver state detection unit 12041 that detects a state of a driver is connected to the vehicle internal information detection unit 12040. The driver state detection unit 12041 includes, for example, a camera that captures an image of the driver, and the vehicle internal information detection unit 12040 may calculate a degree of fatigue or concentration of the driver or may determine whether or not the driver is dozing on the basis of detection information input from the driver state detection unit 12041.

The microcomputer 12051 can calculate a control target value of the driving force generation device, the steering mechanism, or the braking device on the basis of information inside and outside the vehicle acquired by the vehicle external information detection unit 12030 or the vehicle internal information detection unit 12040, and output a control command to the drive system control unit 12010. For example, the microcomputer 12051 can perform cooperative control for the purpose of realizing functions of an advanced driver assistance system (ADAS) including vehicle collision avoidance, impact mitigation, following traveling based on an inter-vehicle distance, vehicle speed maintenance driving, vehicle collision warning, vehicle lane deviation warning, and the like.

Further, by controlling the driving force generation device, the steering mechanism, the braking device, and the like on the basis of information regarding the vicinity of the vehicle acquired by the vehicle external information detection unit 12030 or the vehicle internal information detection unit 12040, the microcomputer 12051 can perform cooperative control for the purpose of automated driving or the like in which autonomous travel is performed without depending on an operation of the driver.

In addition, the microcomputer 12051 can output a control command to the body system control unit 12020 on the basis of the information outside the vehicle acquired by the vehicle external information detection unit 12030. For example, the microcomputer 12051 can perform cooperative control for the purpose of controlling headlamps in accordance with a position of a preceding vehicle or an oncoming vehicle detected by the vehicle external information detection unit 12030 and achieving antiglare by switching a high beam to a low beam, or the like.

The sound image output unit 12052 transmits an output signal of at least one of audio and an image to an output device capable of visually or audibly notifying an occupant of a vehicle or the outside of the vehicle of information. In the example of FIG. 26, an audio speaker 12061, a display unit 12062, and an instrument panel 12063 are illustrated as output devices. The display unit 12062 may include, for example, at least one of an onboard display and a head-up display.

Figure 27:
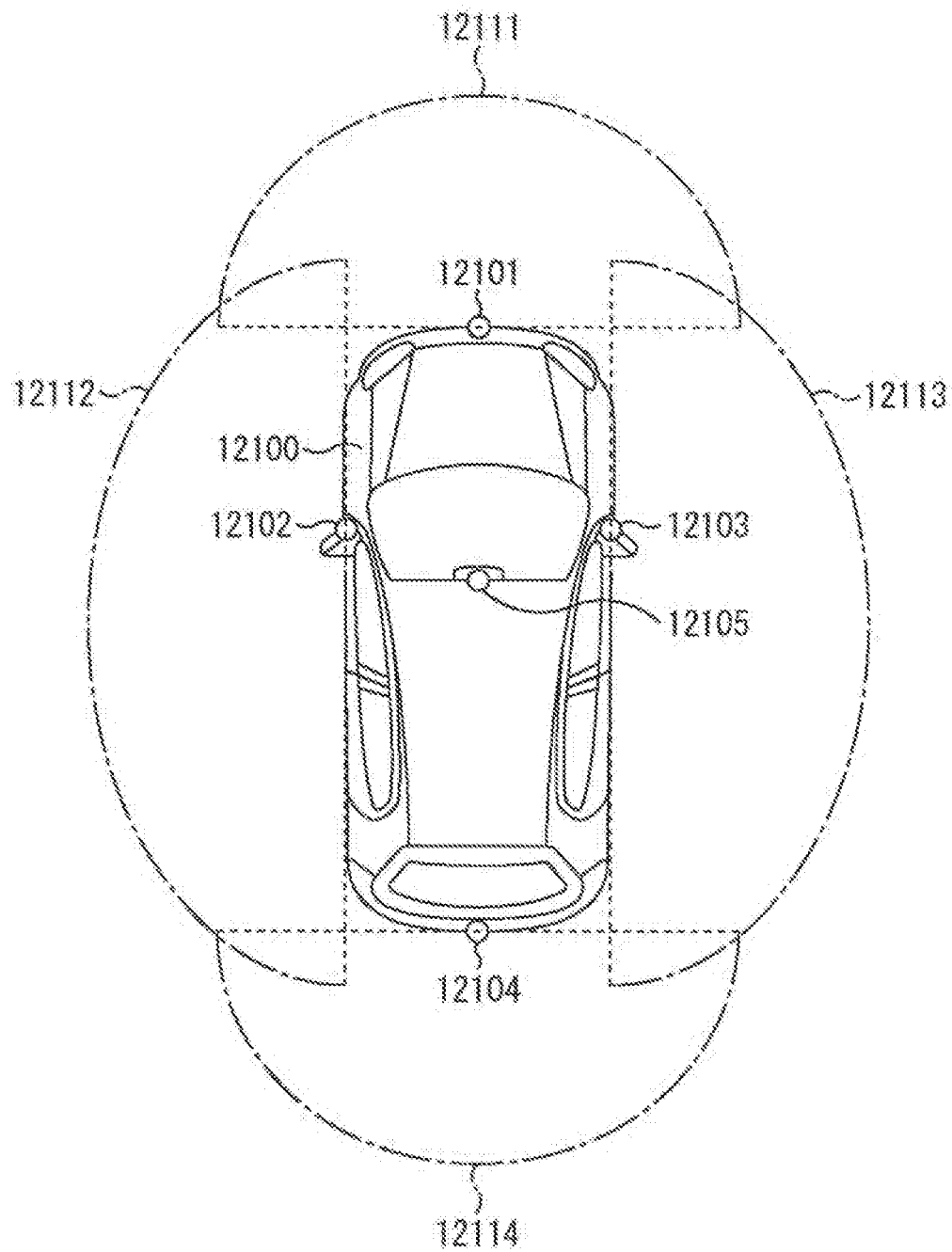
FIG. 27 is a diagram showing an example of an installation position of an imaging unit.

FIG. 27 is a diagram showing an example of an installation position of the imaging unit 12031.

In FIG. 27, a vehicle 12100 includes imaging units 12101, 12102, 12103, 12104, and 12105 as the imaging unit 12031.

The imaging units 12101, 12102, 12103, 12104, and 12105 are provided at positions such as a front nose, side-view mirrors, a rear bumper, a back door, and an upper portion of a windshield in a vehicle interior of the vehicle 12100, for example. The imaging unit 12101 provided on the front nose and the imaging unit 12105 provided in the upper portion of the windshield in the vehicle interior mainly acquire images in front of the vehicle 12100. The imaging units 12102 and 12103 provided on the side mirrors mainly acquire images on a lateral side of the vehicle 12100. The imaging unit 12104 provided on the rear bumper or the back door mainly acquires images behind the vehicle 12100. Front view images acquired by the imaging units 12101 and 12105 are mainly used for detection of preceding vehicles, pedestrians, obstacles, traffic signals, traffic signs, lanes, and the like.

Also, FIG. 27 shows an example of imaging ranges of the imaging units 12101 to 12104. An imaging range 12111 indicates an imaging range of the imaging unit 12101 provided at the front nose, imaging ranges 12112 and 12113 respectively indicate imaging ranges of the imaging units 12102 and 12103 provided at the side mirrors, and an imaging range 12114 indicates an imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function of acquiring distance information. For example, at least one of the imaging units 12101 to 12104 may be a stereo camera configured of a plurality of imaging elements or may be an imaging element having pixels for phase difference detection.

For example, by obtaining distances to each three-dimensional object within the imaging range 12111 to 12114 and changes of the distances over time (relative velocity with respect to the vehicle 12100) on the basis of distance information obtained from the imaging units 12101 to 12104, the microcomputer 12051 can extract, particularly, the closest three-dimensional object on a traveling path of the vehicle 12100, which is a three-dimensional object traveling at a predetermined speed (for example, 0 km/h or higher) in the substantially same direction as the vehicle 12100, as a preceding vehicle. Further, the microcomputer 12051 can set an inter-vehicle distance to be secured in advance from the preceding vehicle and can perform automated braking control (also including following stop control) or automated acceleration control (also including following start control). In this way, it is possible to perform cooperative control for the purpose of automated driving or the like in which autonomous travel is performed without depending on an operation of the driver.

For example, the microcomputer 12051 can classify and extract three-dimensional object data regarding three-dimensional objects into two-wheeled vehicles, ordinary vehicles, large vehicles, pedestrians, and other three-dimensional objects such as utility poles on the basis of the distance information obtained from the imaging units 12101 to 12104 and use the three-dimensional object data for automatic avoidance of obstacles. For example, the microcomputer 12051 identifies obstacles in the vicinity of the vehicle 12100 into obstacles that can be visually recognized by the driver of the vehicle 12100 and obstacles that are difficult to be visually recognized. In addition, the microcomputer 12051 determines a collision risk indicating a degree of risk of collision with each obstacle, and when the collision risk is equal to or greater than a set value and there is a possibility of collision, outputs a warning to the driver via the audio speaker 12061 or the display unit 12062 and performs forced deceleration or avoidance steering via the drive system control unit 12010, so that it can perform driving assistance for collision avoidance.

At least one of the imaging units 12101 to 12104 may be an infrared camera that detects infrared light. For example, the microcomputer 12051 can recognize a pedestrian by determining whether or not a pedestrian is present in captured images of the imaging units 12101 to 12104. Such recognition of a pedestrian is performed through, for example, a procedure of extracting feature points in the captured images of the imaging units 12101 to 12104 serving as infrared cameras, and a procedure of performing pattern matching processing on a series of feature points indicating a contour of an object to determine whether or not the object is a pedestrian. When the microcomputer 12051 determines that a pedestrian is present in the captured images of the imaging units 12101 to 12104 and recognizes the pedestrian, the sound image output unit 12052 controls the display unit 12062 such that a square contour line for emphasis is superimposed on the recognized pedestrian and is displayed. In addition, the sound image output unit 12052 may control the display unit 12062 so that an icon or the like indicating a pedestrian is displayed at a desired position.

An example of the vehicle control system to which the technique according to the present disclosure may be applied has been described above. The technique according to the present disclosure may be applied to the imaging unit 12031 and the like among the above-described configurations. Specifically, any one or more of the above-mentioned imaging devices 100, 100A, 100B, 100C, 100D, 100E, 100F, 100G, and 100H can be applied to the imaging unit 12031. By applying the technique according to the present disclosure to the imaging unit 12031, a clearer captured image can be obtained, and thus it is possible to reduce a driver's fatigue.

In addition, the present disclosure can also adopt the following configurations.

(1) An imaging device including:
 a semiconductor substrate including a plurality of photoelectric conversion elements;
 a plurality of color filters that are provided on the semiconductor substrate and face each of the plurality of photoelectric conversion elements; and
 a partition wall that is provided on the semiconductor substrate and provides separation between one color filter and another color filter adjacent to each other among the plurality of color filters,
 wherein the partition wall includes a first metal layer,
 a first translucent partition wall layer that covers a side surface of the first metal layer, and
 a second translucent partition wall layer located between the first metal layer and the first partition wall layer, and
 a refractive index of the second partition wall layer is larger than a refractive index of the first partition wall layer.

(2) The imaging device according to the above (1), wherein refractive indexes of the color filters are larger than the refractive index of the first partition wall layer.

(3) The imaging device according to the above (1) or (2) further including a lens disposed on a side opposite to the semiconductor substrate with the color filters interposed therebetween,
 wherein the first metal layer includes an end surface located on the lens side, the second partition wall layer covers the end surface of the first metal layer, and the first partition wall layer covers the end surface via the second partition wall layer.

(4) The imaging device according to any one of the above (1) to (3), wherein the second partition wall layer, the first partition wall layer, and the color filters are laminated in order on the photoelectric conversion elements.

(5) The imaging device according to any one of the above (1) to (4) further including a light-shielding film disposed between the partition wall and the semiconductor substrate.

(6) The imaging device according to the above (5), wherein the light-shielding film is made of a metal.

(7) The imaging device according to any one of the above (1) to (6),
 wherein the side surface of the first metal layer includes a first side surface, and
 a second side surface located on a side opposite to the first side surface, and in the second partition wall layer,
 a thickness of a portion that covers the first side surface and a thickness of a portion that covers the second side surface are different from each other.

(8) The imaging device according to any one of the above (1) to (7), wherein a width of the one color filter and a width of another color filter are different from each other.

(9) The imaging device according to any one of the above (1) to (8),
 wherein the semiconductor substrate further includes an element separation layer that separates one photoelectric conversion element from another photoelectric conversion element, which are adjacent to each other among the plurality of photoelectric conversion elements,
 the partition wall is located on the element separation layer, and
 an amount of shift of the partition wall toward a central region of an imaging region including the plurality of photoelectric conversion elements with respect to the element separation layer increases toward a side further separated from the central region.

(10) The imaging device according to any one of the above (1) to (8),
 wherein the semiconductor substrate further includes an element separation layer that separates one photoelectric conversion element from another photoelectric conversion element, which are adjacent to each other among the plurality of photoelectric conversion elements,
 the partition wall is located on the element separation layer, and
 the element separation layer includes
 a second metal layer, and
 an insulating layer that covers a side surface of the second metal layer.

(11) The imaging device according to the above (10), wherein the first metal layer and the second metal layer are integrated with each other.

(12) The imaging device according to the above (10) further including a metal light-shielding film disposed between the first metal layer and the second metal layer,
 wherein the second metal layer and the metal light-shielding film are integrated with each other.

(13) The imaging device according to any one of the above (1) to (12),
 wherein the second partition wall layer is configured of a silicon carbide film having an amorphous crystal structure, and the first partition wall layer is configured of a silicon oxide film.

(14) An electronic device including:
 an optical component;
 an imaging device on which light transmitted through the optical component is incident; and
 a signal processing circuit configured to process a signal output from the imaging device,
 wherein the imaging device includes:
 a semiconductor substrate including a plurality of photoelectric conversion elements;
 a plurality of color filters that are provided on the semiconductor substrate and face each of the plurality of photoelectric conversion elements; and
 a partition wall that is provided on the semiconductor substrate and provides separation between one color filter and another color filter adjacent to each other among the plurality of color filters,
 the partition wall includes
 a first metal layer, a first translucent partition wall layer that covers a side surface of the first metal layer, and
a second translucent partition wall layer located between the first metal layer and
the first partition wall layer, and
a refractive index of the second partition wall layer is larger than a refractive index of the first partition wall layer.

REFERENCE SIGNS LIST

2 Partition wall
11, 31 Insulating film
20 First metal layer
20', 50' Metal layer
20a First side surface
20b Second side surface
20c Upper end surface
21 First partition wall layer
21', 22', 51', 52' Insulating layer
22 Second partition wall layer
30 Metal light-shielding film
30' Metal film
50 Second metal layer
51 First insulating layer
52 Second insulating layer
100, 100A, 100B, 100C, 100D, 100E, 100F, 100G, 100H Imaging device
102 Pixel
103 Pixel region
104 Vertical drive circuit
105 Column signal processing circuit
106 Horizontal drive circuit
107 Output circuit
108 Control circuit
109 Vertical signal line
110 Horizontal signal line
111 Semiconductor substrate
201 Solid-state imaging device
210 Optical lens
211 Shutter device
212 Drive circuit
213 Signal processing circuit
300 Electronic device
10402 Imaging unit
11000 Endoscopic operation system
11100 Endoscope
11101 Lens barrel
11102 Camera head
11110 Surgical instrument
11111 Pneumoperitoneum tube
11112 Energized treatment tool
11120 Support arm device
11131 Operator (doctor)
11131 Operator
11132 Patient
11133 Patient bed
11200 Cart
11201 Camera control unit
11202 Display device
11203 Light source device
11204 Input device
11205 Treatment tool control device
11206 Pneumoperitoneum device
11207 Recorder
11208 Printer
11400 Transmission cable
11401 Lens unit
11402 Imaging unit
11403 Driving unit
11404 Communication unit
11405 Camera head control unit
11411 Communication unit
11412 Image processing unit
11413 Control unit
12000 Vehicle control system
12001 Communication network
12010 Drive system control unit
12020 Body system control unit
12030 Vehicle external information detection unit
12031 Imaging unit
12040 Vehicle internal information detection unit
12041 Driver state detection unit
12050 Integrated control unit
12051 Microcomputer
12052 Sound image output unit
12061 Audio speaker
12062 Display unit
12063 Instrument panel
12100 Vehicle
12101 to 12105 Imaging unit
12111 to 12114 Imaging range
AMP Amplifying transistor
AR1 Central region
AR2 Peripheral region
C20 Central position
CCU11201 Imaging unit
CF, CF1, CF2, CF3, CF4 Color filter
CRP5 Central position
FD Floating diffusion
H Trench
I In-vehicle network
ICG Indocyanine green
L1, L2, L3, L4, L11, L12, L13 Light
L21 Light
ML Micro lens
MLE End portion
n21, n22, ncf Refractive index
PD, PD1, PD2, PD3, PD4 Photodiode
PU Pixel unit
QE Quantum efficiency
RP1, RP2, RP3, RP4, RP5, RP6, RP7, RP8, RP9, RP10, RP11 Resist pattern
RST Reset transistor
SEL Selection transistor
SiO2 Silicon oxide film
TR Transfer transistor
VDD Power line
W20, W30, WCFB, WCFE, WCFG, WCFR, WRP5 Width
Wgap Distance (shift amount)
θ1, θ2, θ3 Incidence angle

The invention claimed is:
1. An imaging device, comprising:
a semiconductor substrate that includes a plurality of photoelectric conversion elements;
a plurality of color filters on the semiconductor substrate, wherein the plurality of color filters face a corresponding photoelectric conversion element of the plurality of photoelectric conversion elements;
a partition wall on the semiconductor substrate, wherein the partition wall separates one color filter from an adjacent color filter among the plurality of color filters; and a lens on a side opposite to the semiconductor substrate,
wherein the plurality of color filters are between the
lens and the semiconductor substrate,
wherein the partition wall includes
a first metal layer having a first side surface, a second side surface, and an upper end surface located on a side of the lens,
a first translucent partition wall layer that covers the first side surface, the second side surface, and the upper end surface of the first metal layer,
a second translucent partition wall layer located between the first metal layer and the first translucent partition wall layer, wherein the second translucent partition wall layer covers the first side surface, the second side surface, and the upper end surface of the first metal layer, and
a refractive index of the second translucent partition wall layer is larger than a refractive index of the first translucent partition wall layer.

2. The imaging device according to claim 1, wherein refractive indexes of the plurality of color filters are larger than the refractive index of the first translucent partition wall layer.

3. The imaging device according to claim 1, wherein the second translucent partition wall layer, the first translucent partition wall layer, and the plurality of color filters are laminated in order on the plurality of photoelectric conversion elements.

4. The imaging device according to claim 1, further comprising a light-shielding film between the partition wall and the semiconductor substrate.

5. The imaging device according to claim 4, wherein the light-shielding film is made of a metal.

6. The imaging device according to claim 1, wherein
a thickness of a portion of the second translucent partition wall layer that covers the first side surface of the first metal layer is different from a thickness of a portion of the second translucent partition wall layer that covers the second side surface of the first metal layer.

7. The imaging device according to claim 1, wherein each of the plurality of color filters has a different width.

8. The imaging device according to claim 1, wherein
the semiconductor substrate further includes an element separation layer that separates a first photoelectric conversion element of the plurality of photoelectric conversion elements from a second photoelectric conversion element of the plurality of photoelectric conversion elements,
the first photoelectric conversion element is adjacent to the second photoelectric conversion element,
the partition wall is located on the element separation layer, and
an amount of shift of the partition wall, towards a central region of an imaging region including the plurality of photoelectric conversion elements with respect to the element separation layer, increases toward a side further separated from the central region.

9. The imaging device according to claim 1, wherein
the semiconductor substrate further includes an element separation layer that separates a first photoelectric conversion element of the plurality of photoelectric conversion elements from a second photoelectric conversion element of the plurality of photoelectric conversion elements,
the first photoelectric conversion element is adjacent to the second photoelectric conversion element,
the partition wall is located on the element separation layer, and
the element separation layer includes
a second metal layer, and
an insulating layer that covers a side surface of the second metal layer.

10. The imaging device according to claim 9, wherein the first metal layer is integrated with the second metal layer.

11. The imaging device according to claim 9, further comprising a metal light-shielding film between the first metal layer and the second metal layer,
wherein the second metal layer is integrated with the metal light-shielding film.

12. The imaging device according to claim 1,
wherein the second translucent partition wall layer is configured of a silicon carbide film having an amorphous crystal structure, and
the first translucent partition wall layer is configured of a silicon oxide film.

13. An electronic device, comprising:
an optical component;
an imaging device on which light transmitted through the optical component is incident; and
a signal processing circuit configured to process a signal output from the imaging device,
wherein the imaging device includes:
a semiconductor substrate that includes a plurality of photoelectric conversion elements;
a plurality of color filters on the semiconductor substrate and face each of the plurality of photoelectric conversion elements; and
a partition wall on the semiconductor substrate, wherein the partition wall separates one color filter from an adjacent color filter among the plurality of color filters; and
a lens on a side opposite to the semiconductor substrate, wherein the plurality of color filters are between the lens and the semiconductor substrate,
the partition wall includes
a first metal layer having a first side surface, a second side surface, and an upper end surface located on a side of the lens,
a first translucent partition wall layer that covers the first side surface, the second side surface, and the upper end surface of the first metal layer,
a second translucent partition wall layer located between the first metal layer and the first translucent partition wall layer, wherein the second translucent partition wall layer covers the first side surface, the second side surface, and the upper end surface of the first metal layer, and
a refractive index of the second translucent partition wall layer is larger than a refractive index of the first translucent partition wall layer.

* * * * *